(12) United States Patent
Kim et al.

(10) Patent No.: US 12,489,096 B2
(45) Date of Patent: Dec. 2, 2025

(54) DISPLAY DEVICE

(71) Applicant: Samsung Display Co., Ltd., Yongin-si (KR)

(72) Inventors: Kyung Bae Kim, Seongnam-si (KR); Min Kyu Woo, Seoul (KR); Do Yeong Park, Hwaseong-si (KR); Mee Hye Jung, Suwon-si (KR); Chong Chul Chai, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 467 days.

(21) Appl. No.: 17/243,125

(22) Filed: Apr. 28, 2021

(65) Prior Publication Data

US 2021/0366888 A1 Nov. 25, 2021

(30) Foreign Application Priority Data

May 19, 2020 (KR) .................. 10-2020-0059490

(51) Int. Cl.
*H01L 25/16* (2023.01)
*H10D 86/40* (2025.01)
(Continued)

(52) U.S. Cl.
CPC ......... *H01L 25/167* (2013.01); *H10D 86/441* (2025.01); *H10D 86/60* (2025.01); *H10H 20/831* (2025.01); *H10H 20/857* (2025.01)

(58) Field of Classification Search
CPC . H01L 25/167; H01L 25/0753; H10D 86/441; H10D 86/60; H10D 86/451;
(Continued)

(56) References Cited

U.S. PATENT DOCUMENTS 9,443,904 B1  9/2016  Chen et al.
2012/0113328 A1*  5/2012  Takeshima ........ G02F 1/133603
                                                257/88
(Continued)

FOREIGN PATENT DOCUMENTS

KR  10-2017-0074410 A  6/2017
KR  10-2017-0084139 A  7/2017
(Continued)

OTHER PUBLICATIONS

International Search Report with Transmittal dated Jul. 23, 2021 for corresponding PCT Application No. PCT/KR2021/004352 (5 pages).
(Continued)

*Primary Examiner* — Su C Kim
(74) *Attorney, Agent, or Firm* — Womble Bond Dickinson (US) LLP

(57) ABSTRACT

A display device includes a conductive layer including a first voltage line and a second voltage line extending in a first direction; an interlayer insulating layer on the conductive layer and including a plurality of contact holes that expose parts of the conductive layer; a plurality of first-type electrodes on the interlayer insulating layer and electrically connected to the conductive layer through the plurality of contact holes, a plurality of second-type electrodes on the interlayer insulating layer and extending in the first direction, a plurality of light-emitting elements on pairs of the first-type and the second-type electrodes that are spaced from each other in the second direction; first-type contact electrodes on the first-type electrodes and in contact with the light-emitting elements; and second-type contact electrodes on the second-type electrodes and in contact with the light-emitting elements, each of the second-type contact electrodes includes contact electrode extensions on the second-type electrodes.

21 Claims, 32 Drawing Sheets

(51) Int. Cl.
*H10D 86/60* (2025.01)
*H10H 20/831* (2025.01)
*H10H 20/857* (2025.01)

(58) Field of Classification Search
CPC .. H10H 20/831; H10H 20/857; H10H 20/819; H10H 29/142
See application file for complete search history.

(56) References Cited

U.S. PATENT DOCUMENTS

| | | | | |
|---|---|---|---|---|
| 2017/0294424 | A1* | 10/2017 | Jeong | H01L 33/62 |
| 2018/0012876 | A1* | 1/2018 | Kim | H01L 33/387 |
| 2018/0019369 | A1* | 1/2018 | Cho | H05K 1/181 |
| 2021/0288217 | A1 | 9/2021 | Li et al. | |
| 2021/0327954 | A1 | 10/2021 | Cho et al. | |
| 2021/0391380 | A1 | 12/2021 | Li et al. | |

FOREIGN PATENT DOCUMENTS

| | | |
|---|---|---|
| KR | 10-2017-0094930 A | 8/2017 |
| KR | 10-2018-0009015 A | 1/2018 |
| KR | 10-2020-0004936 A | 1/2020 |
| KR | 10-2020-0041429 A | 4/2020 |
| KR | 10-2020-0145966 A | 12/2020 |
| KR | 10-2509929 B1 | 3/2023 |
| KR | 10-2602621 B1 | 11/2023 |
| KR | 10-2652769 B1 | 4/2024 |
| KR | 10-2701627 B1 | 9/2024 |
| WO | WO 2020/017718 A1 | 1/2020 |

OTHER PUBLICATIONS

Written Opinion dated Jul. 23, 2021 for corresponding PCT Application No. PCT/KR2021/004352 (3 pages).
Korean Notice of Allowance dated Dec. 31, 2024, issued in Korean Patent Application No. 10-2020-0059490 (2 pages).

* cited by examiner

DISPLAY DEVICE

CROSS-REFERENCE TO RELATED APPLICATION

This application claims priority to and the benefit of Korean Patent Application No. 10-2020-0059490 filed on May 19, 2020 in the Korean Intellectual Property Office, the content of which in its entirety is herein incorporated by reference.

BACKGROUND

1. Field

The present disclosure relates to a display device.

2. Description of the Related Art

Display devices have increasingly been gaining importance with the development of multimedia, and various types of display devices, such as an organic light-emitting diode (OLED) display device, a liquid crystal display (LCD) device, or the like, have been used.

Typically, a display device, which is a device for displaying an image, includes a display panel such as an OLED display panel or an LCD panel. The display panel may include light-emitting elements such as light-emitting diodes (LEDs), and the LEDs may be classified into OLEDs using an organic material as a fluorescent material and inorganic LEDs (ILEDs) using an inorganic material as a fluorescent material.

SUMMARY

Embodiments of the present disclosure provide an inorganic light-emitting element display device including a new electrode structure.

Embodiments of the present disclosure also provide a display device capable of preventing short circuits between wires and reduce or minimizing emission area loss in each pixel.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to the aforementioned and other embodiments of the present disclosure, a display device includes a new electrode configuration and can thus connect light-emitting elements in series. The display device can secure sufficient space for the light-emitting elements in an emission area by applying alignment signals via a lower conductive layer to align the light-emitting elements. Accordingly, the luminance, per unit area, of the display device can be improved, and any emission defect can be prevented even if some of the light-emitting elements are disconnected.

Other features and embodiments may be apparent from the following detailed description, the drawings, and the claims.

According to one or more example embodiments of the present disclosure, a display device includes a conductive layer including a first voltage line and a second voltage line extending in a first direction, an interlayer insulating layer on the conductive layer and including a plurality of contact holes that expose parts of the conductive layer, a plurality of first-type electrodes on the interlayer insulating layer and electrically connected to the conductive layer through the plurality of contact holes, the plurality of first-type electrodes extending in the first direction, a plurality of second-type electrodes on the interlayer insulating layer and extending in the first direction, the plurality of second-type electrodes being spaced from the plurality of first-type electrodes in the first direction or in a second direction, a plurality of light-emitting elements on pairs of the first-type and the second-type electrodes that are spaced from each other in the second direction, first-type contact electrodes on the first-type electrodes and in contact with the light-emitting elements, and second-type contact electrodes on the second-type electrodes and in contact with the light-emitting elements, wherein each of the second-type contact electrodes includes a plurality of contact electrode extensions that are on the second-type electrodes, and a contact electrode connector connecting the contact electrode extensions, and wherein the contact electrode connector is between a pair of the first-type and the second-type electrodes that are spaced from each other in the first direction.

The first-type electrodes and the second-type electrodes may include electrode extensions extending in the first direction, and electrode bent portions bent from sides of the electrode extensions in the first direction, the first-type contact electrodes may be on the electrode extensions of the first-type electrodes, and the contact electrode extensions of each of the second-type contact electrodes may be on the electrode extensions of the second-type electrodes.

A distance between the electrode extensions of the first-type electrodes and the electrode extensions of the second-type electrodes may be smaller than a maximum distance between the electrode bent portions of the first-type electrodes and the electrode bent portions of the second-type electrodes.

The second-type electrodes may be not in contact with the conductive layer.

The first-type electrodes may include a first electrode electrically connected to the first voltage line, and a second electrode electrically connected to the second voltage line, the light-emitting elements may include first light-emitting elements electrically connected to the first electrode, and second light-emitting elements electrically connected to the second electrode, and the first-type contact electrodes may include a first contact electrode in contact with the first electrode and with the first light-emitting elements, and a second contact electrode in contact with the second electrode and with the second light-emitting elements.

The second-type electrode may include a third electrode spaced from the first electrode in the second direction and from the second electrode in the first direction, and a fourth electrode spaced from the first electrode in the first direction and from the second electrode in the second direction, second end portions of the first light-emitting elements may be on the third electrode, second end portions of the second light-emitting elements may be on the fourth electrode, and the second-type contact electrodes may include a third contact electrode including contact electrode extensions on the third and fourth electrodes and a contact electrode connector between the first and fourth electrodes.

The first and second electrodes may be spaced from each other in the second direction, and the second-type electrodes may include a third electrode between the first and second electrodes, a fourth electrode spaced from the first electrode in the first direction, a fifth electrode spaced from the third electrode in the first direction, a sixth electrode spaced from the fifth electrode in the second direction, a seventh electrode between the fifth and sixth electrodes and spaced from the second electrode in the first direction, and an eighth electrode spaced from the sixth electrode in the first direction and from the second electrode in the second direction.

The first light-emitting elements may be on the first and third electrodes, the second light-emitting elements may be on the second and eighth electrodes, and the light-emitting elements may further include third light-emitting elements on the fourth and fifth electrodes, and fourth light-emitting elements on the sixth and seventh electrodes.

The second-type contact electrodes may further include a fourth contact electrode including contact electrode extensions on the fifth and sixth electrodes and a contact electrode connector on a first side of the seventh electrode in the first direction, and a fifth contact electrode including contact electrode extensions on the seventh and eighth electrodes and a contact electrode connector on a second side of the seventh electrode in the first direction.

The conductive layer may further include a first conductive pattern, the display device may further include a first transistor located below the conductive layer and including a first end connected to the first voltage line and a second end connected to the first conductive pattern, the first electrode may be in contact with the first conductive pattern through a first contact hole, and the second electrode may be in contact with the second voltage line through a second contact hole. The first and second voltage lines may include wire contacts protruding from the first and second voltage lines, the display device may further comprise a first electrode pattern in contact with the wire contact of the first voltage line through a third contact hole that penetrates the interlayer insulating layer, and a second electrode pattern in contact with the wire contact of the second voltage line through a fourth contact hole that penetrates the interlayer insulating layer.

The display device may further comprise electrode separators spaced from the second-type electrodes in the first direction and including none of the light-emitting elements located therein.

According to an exemplary embodiment of the present disclosure, a display device comprises first and second electrodes extending in a first direction, a third electrode spaced from the first electrode in a second direction, a fourth electrode spaced from the second electrode in the second direction and from the first electrode in the first direction, a plurality of light-emitting elements on pairs of the electrodes that are spaced from each other in the second direction, a first contact electrode on the first electrode to be in contact with the light-emitting elements, a second contact electrode on the second electrode to be in contact with the light-emitting elements and a third contact electrode on the third and fourth electrodes to be in contact with the light-emitting elements, wherein the third contact electrode includes a first contact electrode extension located on the third electrode, a second contact electrode extension located on the fourth electrode, and a first contact electrode connector connected to the first and second contact electrode extensions and located between the first and fourth electrodes.

The third electrode may be spaced from the second electrode in the first direction, and the first contact electrode connector may be also located between the second and third electrodes.

The light-emitting elements may include first light-emitting elements including first end portions on the first electrode and second end portions on the third electrode, and second light-emitting elements including first end portions on the fourth electrode and second end portions on the second electrode.

The first contact electrode may be in contact with the first end portions of the first light-emitting elements, the second contact electrode may be in contact with the second end portions of the second light-emitting elements, the first contact electrode extension may be in contact with the second end portions of the first light-emitting elements, and the second contact electrode extension may be in contact with the first end portions of the second light-emitting elements.

The electrodes may include electrode extensions extending in the first direction, and electrode bent portions bent from the electrode extensions in the first direction, and the light-emitting elements may be on the electrode extensions of the electrodes.

The electrode bent portion of the first electrode may be spaced from the electrode bent portion of the third electrode in the second direction and from the electrode bent portion of the fourth electrode in the first direction, and a distance between the electrode extension of the first electrode and the electrode extension of the third electrode may be smaller than a maximum distance between the electrode bent portion of the first electrode and the electrode bent portion of the third electrode.

The display device may further comprise a plurality of first banks spaced from one another in the first and second directions, wherein the first, second, third, and fourth electrodes may be on different first banks from among the plurality of first banks.

The first banks may be not located between the first and fourth electrodes.

The display device may further comprise a second bank surrounding an area in which the light-emitting elements are located, and the second bank extending in the first and second directions.

The second electrode may be spaced from the third electrode in the second direction, the display device may further comprise a fifth electrode spaced from the fourth electrode in the second direction and from the third electrode in the first direction, a sixth electrode spaced from the fifth electrode in the second direction, a seventh electrode located between the fifth and sixth electrodes and spaced from the second electrode in the first direction, and an eighth electrode spaced from the sixth electrode in the first direction and from the second electrode in the second direction, and the light-emitting elements may further include first light-emitting elements on the first and third electrodes, second light-emitting elements on the second and eighth electrodes, third light-emitting elements on the fourth and fifth electrodes, and fourth light-emitting elements on the sixth and seventh electrodes.

The display device may further include a fourth contact electrode including a third contact electrode extension on the fifth electrode, a fourth contact electrode extension on the sixth electrode, and a second contact electrode connector connected to the third and fourth contact electrode extensions, and a fifth contact electrode including a fifth contact electrode extension on the seventh electrode, a sixth contact electrode extension on the eighth electrode, and a third contact electrode connector connected to the fifth and sixth contact electrode extensions, wherein the second contact electrode connector is at a first side of the seventh electrode in the first direction, and the third contact electrode connector is at a second side of the seventh electrode in the first direction.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

The present disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will filly convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Figure 1:
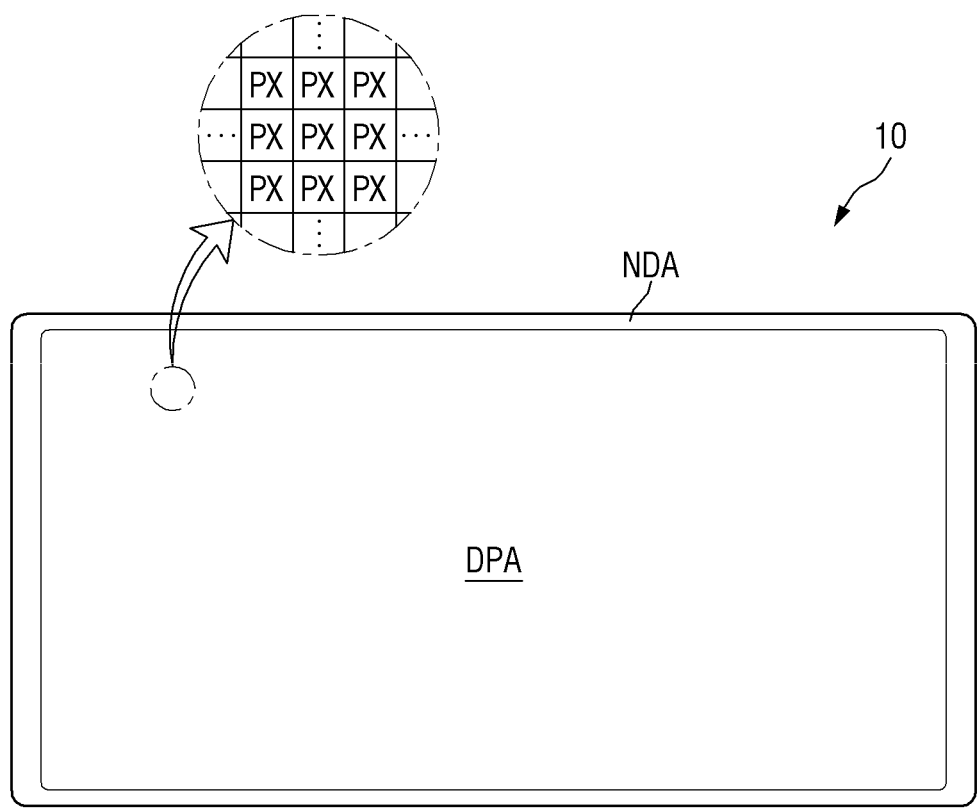
FIG. 1 is a schematic plan view of a display device according to one or more example embodiments of the present disclosure.
Figure 1:
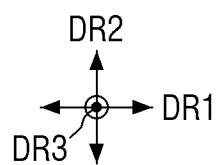

Hereinafter, embodiments of the present disclosure will be described with reference to the attached drawings. FIG. 1 is a schematic plan view of a display device according to one or more example embodiments of the present disclosure.

Referring to FIG. 1, a display device 10 displays a moving or still image. The display device 10 may refer to nearly all types of electronic devices that provide a display screen. Examples of the display device 10 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display, a mobile communication terminal, an electronic notepad, an electronic book, a portable multimedia player (PMP), a navigation device, a gaming console, a digital camera, a camcorder, or the like.

The display device 10 may include a display panel that provides a display screen. Examples of the display panel include an inorganic light-emitting diode (ILED) display panel, an organic LED (OLED) display panel, a quantum-dot light-emitting diode (QLED) display panel, a plasma display panel (PDP), and a field emission display (FED) panel. The display panel of the display device 10 will hereinafter be described as being an ILED display panel, but the present disclosure is not limited thereto.

The shape of the display device 10 may vary. For example, the display device 10 may have, but is not limited to, a rectangular shape that extends longer in a horizontal direction than in a vertical direction, a rectangular shape that extends longer in the vertical direction than in the horizontal direction, a square shape, a rectangular shape with rounded corners, another polygonal shape, or a circular shape. A display area DPA of the display device 10 may have a similar shape to the display device 10. FIG. 1 illustrates that the display device 10 and the display area DPA have a rectangular shape that extends longer in the horizontal direction than in the vertical direction.

The display device 10 may include the display area DPA and a non-display area NDA. The display area DPA is an area in which a screen is displayed, and the non-display area NDA is an area in which a screen is not displayed. The display area DPA may also be referred to as an active area, and the non-display area NDA may also be referred to as an inactive area. The display area DPA may generally account for a middle part of the display device 10.

The display area DPA may include a plurality of pixels PX. The pixels PX may be arranged along row and column directions. The pixels PX may have a rectangular or square shape in a plan view, but the present disclosure is not limited thereto. In some embodiments, the pixels PX may have a rhombus shape that is inclined with respect to the first or second direction. The pixels PX may be alternately arranged in a stripe fashion or a PENTILE® fashion. This pixel arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. Each of the pixels PX may include one or more light-emitting elements ED that emit light of a wavelength range (e.g., a predetermined wavelength range) to emit light of a color (e.g., a predetermined color).

The non-display area NDA may be disposed on the periphery of the display area DPA. The non-display area NDA may surround the entire display area DPA or part of the display area DPA along the periphery of the display area DPA. The display area DPA may have a rectangular shape, and the non-display area NDA may be disposed adjacent to four sides of the display area DPA along the periphery of the display area DPA. The non-display area NDA may form the bezel of the display device 10. Wires or circuit drivers included in the display device 10 may be disposed in the non-display area NDA, or external devices may be mounted in the non-display area NDA.

Figure 2:
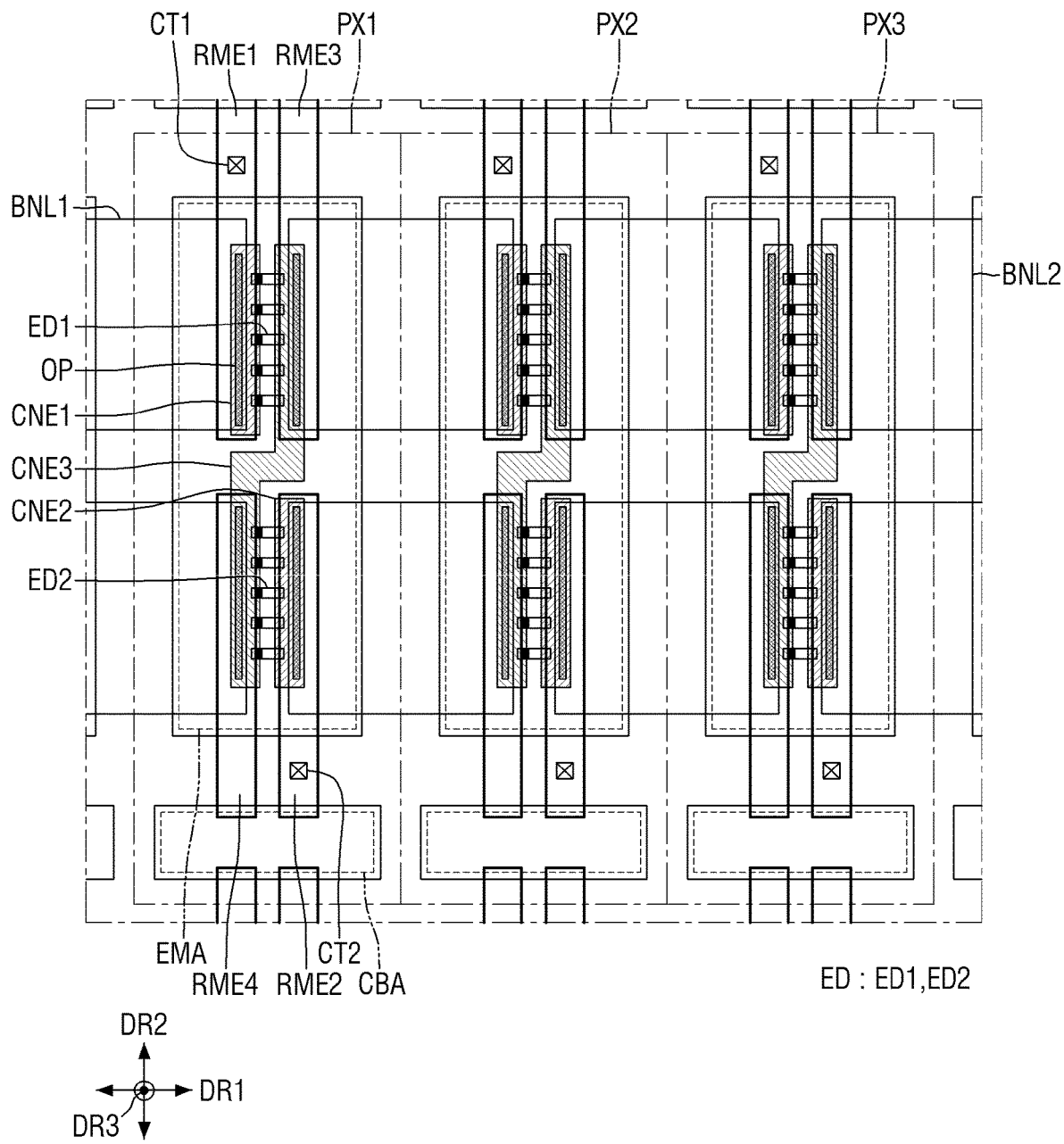
FIG. 2 is a plan view of a pixel of the display device of FIG. 1.

FIG. 2 is a plan view of a pixel of the display device of FIG. 1.

Referring to FIG. 2, a pixel PX may include a plurality of subpixels PXn (where n is an integer in a range of 1 to 3). For example, the pixel PX may include first, second, and third subpixels PX1, PX2, and PX3. The first subpixel PX1 may emit light of a first color, the second subpixel PX2 may emit light of a second color, and the third subpixel PX3 may emit light of a third color. The first, second, and third colors may be blue, green, and red, respectively, but the present disclosure is not limited thereto. In some embodiments, the subpixels PXn may emit light of a same color. FIG. 2 illustrates that the pixel PX includes three subpixels PXn, but the present disclosure is not limited thereto. In some embodiments, the pixel PX may include more than three subpixels PXn.

Each of the subpixels PXn may include an emission area EMA and a non-emission area (not illustrated). The emission area EMA may be an area in which one or more light-emitting elements ED are disposed to emit light of a particular wavelength range, and the non-emission area may be an area that light emitted from the light-emitting elements ED does not arrive at and no light is thus emitted from. The emission area EMA may include an area in which the light-emitting elements ED are disposed, and an area that outputs light emitted from the light-emitting elements ED.

However, the present disclosure is not limited to this. The emission area EMA may further include an area in which light emitted from the light-emitting elements ED is reflected or refracted by another element. A plurality of light-emitting elements ED may be disposed in the subpixels PXn, and a plurality of emission areas EMA, including areas where the plurality of light-emitting elements ED are disposed and areas adjacent to the areas where the plurality of light-emitting elements ED are disposed, may be formed.

Each of the subpixels PXn may include a cut area CBA, which is disposed in the non-emission area. The cut area CBA may be disposed at one side, in the second direction DR2, of the emission area EMA. The cut area CBA may be disposed between two adjacent emission areas EMA of a pair of adjacent subpixels PXn along the second direction DR2. For example, in the display area DPA of the display device 10, a plurality of emission areas EMA and a plurality of cut areas CBA may be arranged. For example, the plurality of emission areas EMA or the plurality of cut areas CBA may be arranged one after another along the first direction DR1, and the plurality of emission areas EMA or the plurality of cut areas CBA may be alternately arranged along the second direction DR2. A second bank BNL2 may be disposed between the plurality of cut areas CBA and the plurality of emission areas EMA, and the distance between the plurality of cut areas CBA and the plurality of emission areas EMA may vary depending on the width of the second bank BNL2. No light-emitting elements ED are disposed in the cut area CBA of each of the subpixels PXn so that no light is emitted from the cut area CBA of each of the subpixels PXn, but parts of electrodes RME may be disposed in the cut area CBA of each of the subpixels PXn to be separate from one another. The electrodes RME may be disposed to be separate from one another in the cut area CBA of each of the subpixels PXn. However, the present disclosure is limited to this. Alternatively, the electrodes RME may be disposed as being unseparated in the cut area CBA of each of the subpixels PXn.

Figure 3:
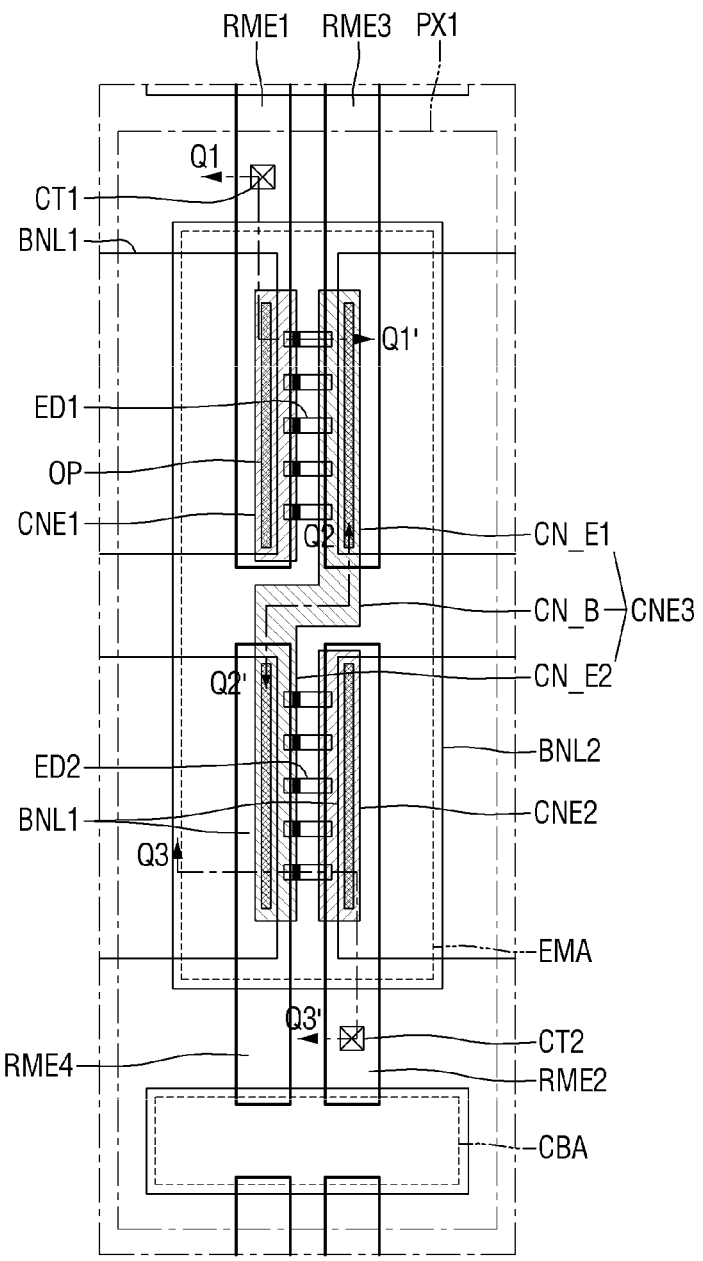
FIG. 3 is a plan view of a first subpixel of FIG. 2.
Figure 4:
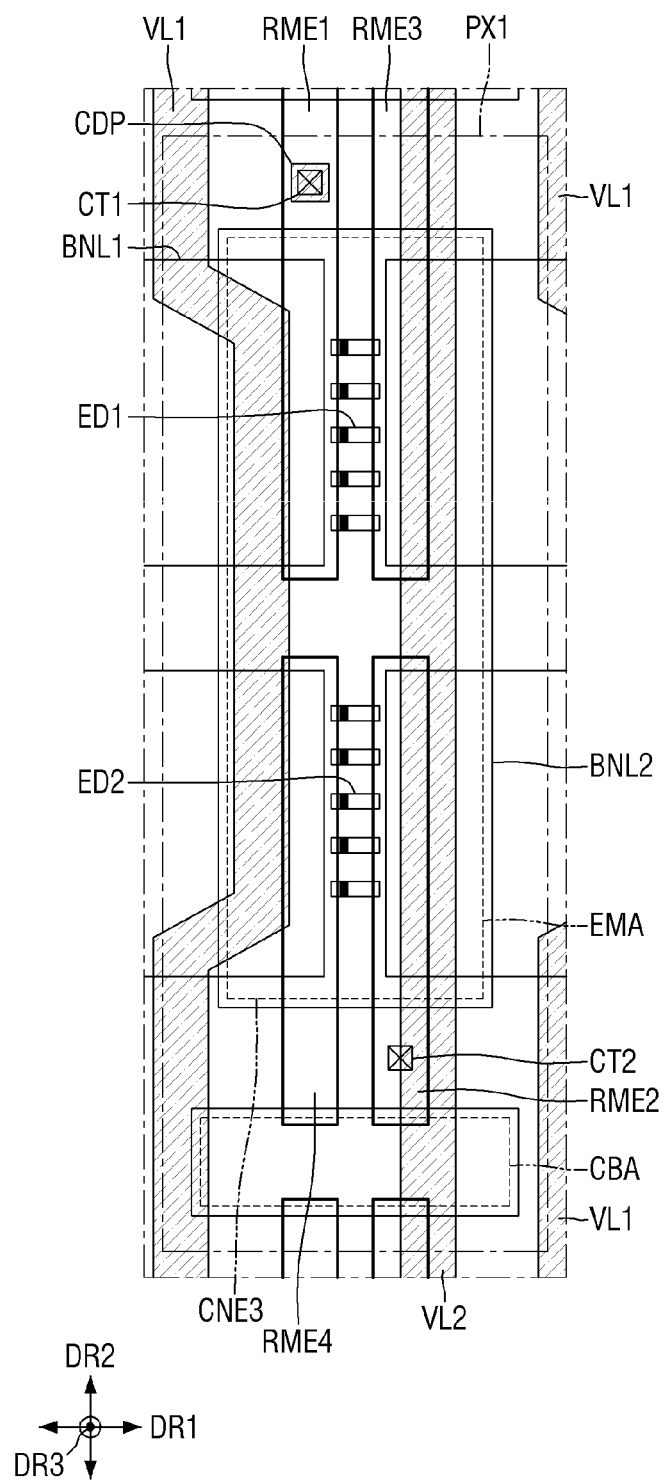
FIG. 4 is a plan view illustrating schematic arrangement of electrodes and a second conductive layer in the first subpixel of FIG. 2.
Figure 5:
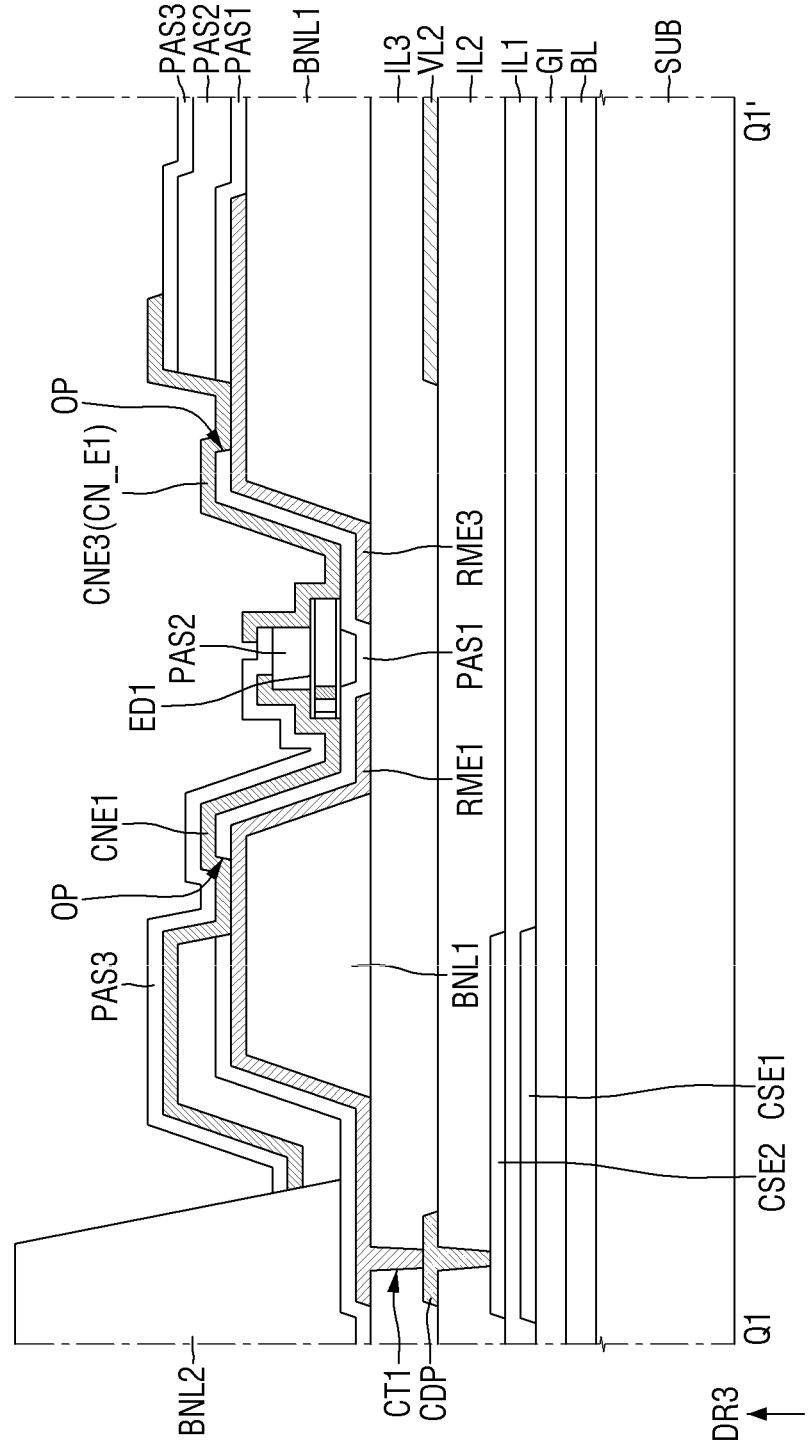
FIG. 5 is a cross-sectional view taken along the line Q1-Q1' of FIG. 3.
Figure 6:
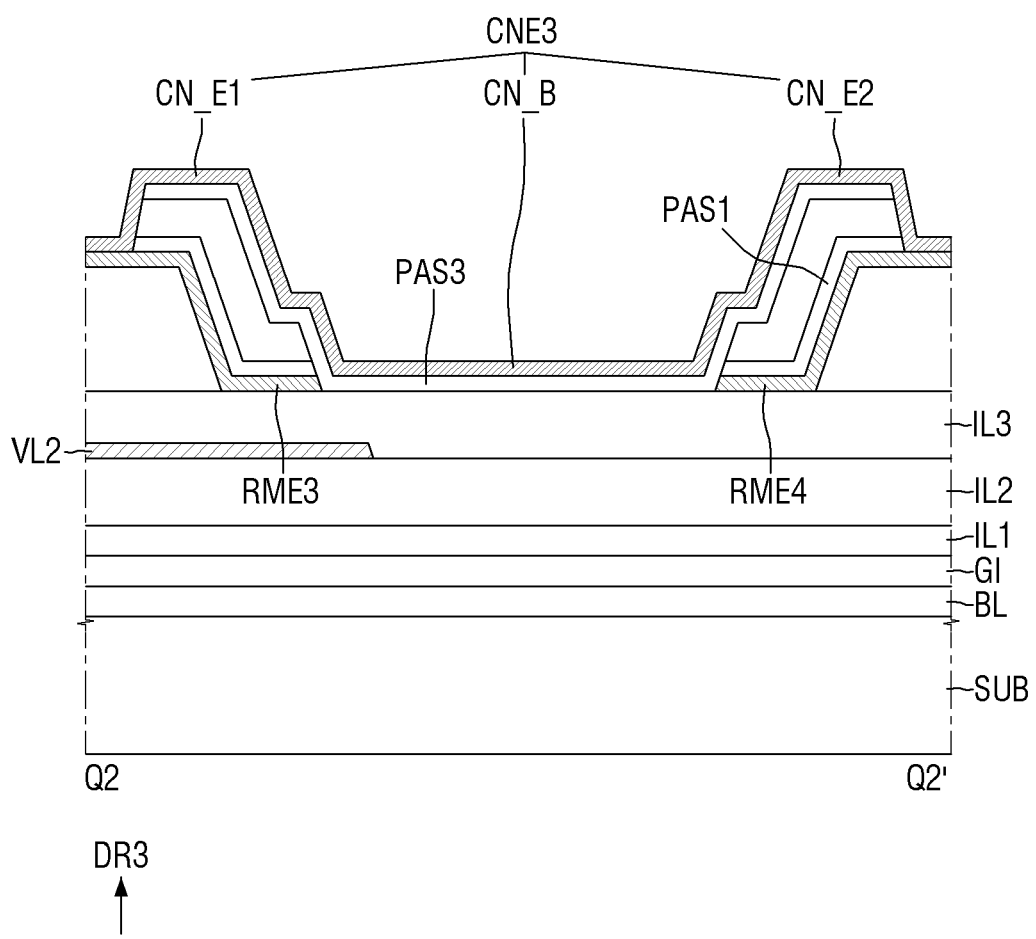
FIG. 6 is a cross-sectional view taken along the line Q2-Q2' of FIG. 3.
Figure 7:
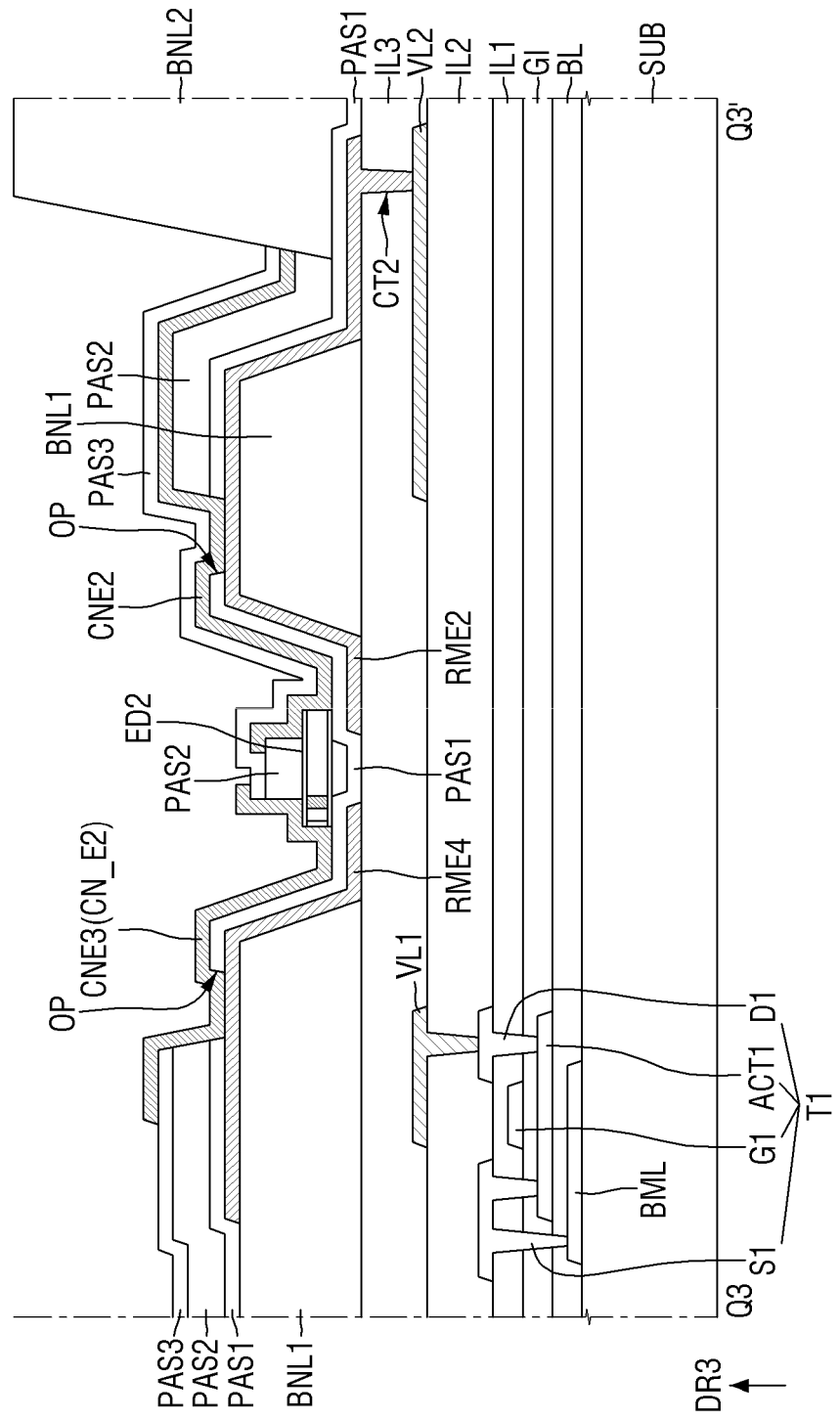
FIG. 7 is a cross-sectional view taken along the line Q3-Q3' of FIG. 3.

FIG. 3 is a plan view of the first subpixel of FIG. 2. FIG. 4 is a plan view illustrating a schematic arrangement of electrodes and a second conductive layer in the first subpixel of FIG. 2. FIG. 5 is a cross-sectional view taken along the line Q1-Q1' of FIG. 3. FIG. 6 is a cross-sectional view taken along the line Q2-Q2' of FIG. 3. FIG. 7 is a cross-sectional view taken along the line Q3-Q3' of FIG. 3. Specifically, FIG. 4 illustrates the arrangement of a second conductive layer where voltage lines (VL1 and VL2) and a first conductive pattern CDP are disposed and the electrodes RME on the second conductive layer. FIGS. 5 and 7 illustrate cross-sectional views taken from one end to the other end of a first light-emitting element ED1 and from one end to the other end of a second light-emitting element ED2, respectively, and FIG. 6 illustrates a cross-sectional view taken along the connecting portion of a third contact electrode CNE3.

Referring to FIG. 2 and FIGS. 3-7, the display device 10 may include a first substrate SUB, a semiconductor layer, a plurality of conductive layers, and a plurality of insulating layers, which are disposed on the first substrate SUB. The semiconductor layer, the conductive layers, and the insulating layers may form a circuit layer and a light-emitting element layer of the display device 10.

In one or more example embodiments, the first substrate SUB may be an insulating substrate. The first substrate SUB may be formed of an insulating material such as glass, quartz, or a polymer resin. Also, the first substrate SUB may be a rigid substrate, but may be a flexible substrate that is bendable, foldable, or rollable.

A light-blocking layer BML may be disposed on the first substrate SUB. The light-blocking layer BML is disposed to overlap with an active layer ACT1 of a first transistor T1. The light-blocking layer BML may include a material capable of blocking light and may thus prevent light from being incident upon the active layer ACT1 of the first transistor T1. For example, the light-blocking layer BML may be formed of an opaque metal capable of blocking the transmission of light, but the present disclosure is not limited thereto. In some embodiments, the light-blocking layer BML may not be provided.

A buffer layer BL may be disposed on the entire surface of the first substrate SUB including the light-blocking layer BML. The buffer layer BL may be formed on the first substrate SUB to protect the first transistor T1 from moisture that may penetrate the first substrate SUB, which is susceptible to moisture, and may perform a surface planarization function. In other words, the buffer layer BL may planarize the surface of the first substrate SUB. The buffer layer BL may include a plurality of inorganic layers that are alternately stacked. For example, the buffer layer BL may be formed as a multilayer film in which inorganic layers including at least one of silicon oxide (SiOx), silicon nitride (SiNx), and silicon oxynitride (SiOxNy) are alternately stacked.

The semiconductor layer is disposed on the buffer layer BL. The semiconductor layer may include the active layer ACT1 of the first transistor T1. The semiconductor layer may be disposed to partially overlap with a gate electrode G1 in a first gate conductive layer.

FIG. 7 illustrates only the first transistor T1 of the first subpixel PX1, but the number of transistors included in the first subpixel PX1 is not particularly limited. The first subpixel PX1 may include more than one transistor. For example, the first subpixel PX1 may include more than one transistor including the first transistor T1, for example, two or three transistors.

The semiconductor layer may include polycrystalline silicon, monocrystalline silicon, or an oxide semiconductor. In a case where the semiconductor layer includes an oxide semiconductor, the active layer ACT1 may include a plurality of conductor and a channel region between the conductor regions. The oxide semiconductor may be an oxide semiconductor including indium (In). For example, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO), but the present disclosure is not limited thereto.

In some embodiments, the semiconductor layer may include polycrystalline, which is formed by crystallizing amorphous silicon. In this case, the conductor regions of the active layer ACT1 may be regions doped with impurities.

A first gate insulating layer GI is disposed on the semiconductor layer and the buffer layer BL. The first gate insulating layer GI may include a semiconductor layer and may be disposed on the buffer layer BL. The first gate insulating layer GI may function as the gate insulating film of each of the first through third transistors T1 through T3. The first gate insulating layer GI may be formed as an inorganic layer including an inorganic material such as, for example, SiOx, SiNx, or SiOxNy or as a stack of SiOx, SiNx, and/or SiOxNy.

The first gate conductive layer is disposed on the first gate insulating layer GI. The first gate conductive layer may include the gate electrode G1 of the first transistor T1 and a first capacitor electrode CSE1 of a storage capacitor. The gate electrode G1 may be disposed to overlap with the channel region of the active layer ACT1 in a thickness direction. The first capacitor electrode CSE1 may be disposed to overlap with a second capacitor electrode CSE2 in the thickness direction (e.g., see FIG. 5). The first capacitor electrode CSE1 may be connected to, and integrally formed with, the gate electrode G1. The first capacitor electrode CSE1 may be disposed to overlap with the second capacitor electrode CSE2 in the thickness direction so that the storage capacitor may be formed between the first capacitor electrode CSE1 and the second capacitor electrode CSE2.

The first gate conductive layer may be formed as a single- or multilayer film including molybdenum (Mo), aluminum (Al), chromium (Cr), gold (Au), titanium (Ti), nickel (Ni), neodymium (Nd), copper (Cu), or an alloy thereof, but the present disclosure is not limited thereto.

A first interlayer insulating layer IL1 is disposed on the first gate conductive layer. The first interlayer insulating layer IL1 may perform the functions of an insulating film between the first gate conductive layer and other layers disposed thereon. The first interlayer insulating layer IL2 may be disposed to cover the first gate conductive layer and protect the first gate conductive layer. The first interlayer insulating layer IL1 may be formed as an inorganic layer including an inorganic material such as, for example, SiOx, SiNx, or SiOxNy or as a stack of SiOx, SiNx, and/or SiOxNy.

A first conductive layer is disposed on the first interlayer insulating layer IL1. The first conductive layer may include a first source electrode S1 and a first drain electrode D1 of the first transistor T1, and the second capacitor electrode CSE2 of the storage capacitor.

The first source electrode S1 and the first drain electrode D1 of the first transistor T1 may be in contact with the conductor regions of the active layer ACT1 via contact holes that penetrate the first interlayer insulating layer IL1 and the first gate insulating layer GI. The first source electrode S1 of the first transistor T1 may be in contact with the light-blocking layer BML via another contact hole.

The second capacitor electrode CSE2 may be disposed to overlap with the first capacitor electrode CSE1 in the thickness direction. For example, the second capacitor electrode CSE2 may be integrally formed with, and connected to, the first source electrode S1.

Although not specifically illustrated, the first conductive layer may further include a data line, which applies a data signal to the other transistors. The data line may be connected to source/drain electrodes of the other transistors and may thus transmit a signal applied thereto to the source/drain electrodes of the other transistors.

The first conductive layer may be formed as a single- or multilayer film including Mo, Al, Cr, Au, Ti, Ni, Nd, Cu, or an alloy thereof, but the present disclosure is not limited thereto.

A second interlayer insulating layer IL2 is disposed on the first conductive layer. The second interlayer insulating layer IL2 may function as an insulating film between the first conductive layer and layers disposed on the first conductive layer (e.g., the first source electrode S1, the first drain electrode D1, and the second capacitor electrode CSE2). Also, the second interlayer insulating layer IL2 may cover the first conductive layer to protect the first conductive layer. The second interlayer insulating layer IL2 may be formed as an inorganic layer including an inorganic material such as, for example, SiOx, SiNx, or SiOxNy or as a stack of SiOx, SiNx, and/or SiOxNy.

A second conductive layer is disposed on the second interlayer insulating layer IL2. The second conductive layer may include a first voltage line VL1, a second voltage line VL2, and a first conductive pattern CDP. A high-potential voltage (or the first power supply voltage) provided to the first transistor T1 may be applied to the first voltage line VL1, and a low-potential voltage (or the second power supply voltage) provided to a second electrode RME2 may be applied to the second voltage line VL2.

The first and second voltage lines VL1 and VL2 of the second conductive layer may be disposed to extend in the second direction DR2. The first voltage line VL1 may include portions that extend in the second direction DR2 and are then bent in a direction between the first and second directions DR1 and DR2. On the contrary, the second voltage line VL2 may extend in the second direction DR2 without being bent. The first and second voltage lines VL1 and VL2 may be disposed to overlap with a plurality of electrodes (RME1, RME2, RME3, and RME4) in the thickness direction. The portions of the first voltage line VL1 that extend in the second direction DR2 and are then bent in a direction between the first and second directions DR1 and DR2 may be disposed within the emission area EMA. The second voltage line VL2 may be disposed to extend across the emission area EMA.

The first conductive pattern CDP may be connected to the second capacitor electrode CSE2 through a contact hole that is formed in the second interlayer insulating layer IL2. The second capacitor electrode CSE2 may be integrally formed with the first source electrode S1, and the first conductive pattern CDP may be electrically connected to the first source electrode S1. The first conductive pattern CDP may be in contact with a first electrode RME1 (e.g., contact hole CT1), and the first transistor T1 may transmit the first power supply voltage applied thereto from the first voltage line VL1 to the first electrode RME1 via the first conductive pattern CDP. The second conductive layer is illustrated as including one first voltage line VL1 and one second voltage line VL2, but the present disclosure is not limited thereto. The second conductive layer may include more than one first voltage line VL1 and more than one second voltage line VL2.

The second conductive layer may be formed as a single- or multilayer film including Mo, Al, Cr, Au, Ti, Ni, Nd, Cu, or an alloy thereof, but the present disclosure is not limited thereto.

A third interlayer insulating layer IL3 is disposed on the second conductive layer. The third interlayer insulating layer IL3 may include an organic insulating material such as PI and may perform a surface planarization function. In other words, the third interlayer insulating layer IL3 may planarize the surface of the second conductive layer.

A plurality of first banks BNL1, a plurality of electrodes RME, the light-emitting elements ED, a plurality of contact electrodes (CNE1, CNE2, and CNE3), and the second bank BNL2 are disposed on the third interlayer insulating layer IL3. A plurality of insulating layers (PAS1, PAS2, and PAS3) may be disposed on the third interlayer insulating layer IL3.

The first banks BNL1 may be disposed directly on the third interlayer insulating layer IL3. One first bank BNL1 may extend in the first direction DR1 and may be disposed in and across a pair of adjacent subpixels PXn. One first bank BNL1 may also extend in the second direction DR2 and may be spaced from another first bank BNL1 in the same subpixel PXn. As such, the first banks BNL1 may extend to have a width (e.g., a predetermined width) in the first and second directions DR1 and DR2 and may be disposed, in part, in the emission area EMA and, in part, between a pair of adjacent subpixels PXn in the first direction DR1.

A plurality of first banks BNL1 may be disposed in the first subpixel PX1. For example, parts of four first banks BNL1 may be disposed in the emission area EMA of the first subpixel PX1. The four first banks BNL1 may be spaced from one another in the first and second directions DR1 and DR2. The light-emitting elements ED may be disposed between pairs of first banks BNL1 spaced from each other in the first direction DR1, but not between pairs of first banks BNL1 spaced from each other in the second direction DR2. Because the first banks BNL1 are disposed in the emission area EMA to be spaced from one another in the second direction DR2, space in which to perform the cutting of electrode lines RM_A and RM_B (of FIG. 9) can be secured.

FIGS. 2 through 4 illustrate that four first banks BNL1 are disposed in the emission area EMA to form island patterns, but the present disclosure is not limited thereto. The number of first banks BNL1 disposed in the emission area EMA may vary depending on the number of electrodes RME or the arrangement of the light-emitting elements ED.

The first banks BNL1 may protrude, at least in part, from the top surface of the third interlayer insulating layer IL3. Parts of the first banks BNL1 that protrude may have inclined sides surfaces, and light emitted from the light-emitting elements ED may be reflected by the electrodes RME on the first banks BNL1 to be emitted in an upward direction from the third interlayer insulating layer IL3. The first banks BNL1 may not only provide an area in which to arrange the light-emitting elements ED, but also function as a reflecting barrier capable of reflecting light emitted from the light-emitting elements ED in the upward direction from the third interlayer insulating layer IL3. The sides of the first banks BNL1 may be linearly inclined, but the present disclosure is not limited thereto. In some embodiments, the first banks BNL1 may have a semi-circular or elliptical shape with a curved outer surface. The first banks BNL1 may include an organic insulating material such as PI, but the present disclosure is not limited thereto.

The electrodes RME or a plurality of electrodes (RME1, RME2, RME3, and RME4) may extend in one direction and may be disposed in the first subpixel PX1. The electrodes (RME1, RME2, RME3, and RME4) may extend in the second direction DR2 and may be disposed in the first subpixel PX1 to be spaced from one another in the first or second direction DR1 or DR2.

For example, the electrodes RME may include a first electrode RME1, a third electrode RME3, which is spaced from the first electrode RME1 in the first direction DR1, a fourth electrode RME4, which is spaced from the first electrode RME1 in the second direction DR2, and a second electrode RME2, which is spaced from the fourth electrode RME4 in the first direction DR1. A plurality of light-emitting elements ED may be disposed on pairs of electrodes (RME1, RME2, RME3, and RME4) spaced from each other in the first direction DR1.

The first and third electrodes RME1 and RME3 may be disposed on one side, in the second direction DR2, of the emission area EMA, i.e., on the upper side of the emission area EMA, and the second and fourth electrodes RME2 and RME4 may be disposed on the other side, in the second direction DR2, of the emission area EMA, i.e., on the lower side of the emission area EMA. The first and fourth electrodes RME1 and RME4 may be disposed on one side, in the first direction DR1, of the emission area EMA, i.e., on the left side of the emission area EMA, and the second and third electrodes RME2 and RME3 may be disposed on the other side, in the first direction DR1, of the emission area EMA, i.e., on the right side of the emission area EMA. However, the present disclosure is not limited to this. The locations of the electrodes (RME1, RME2, RME3, and RME4) may vary depending on the number of electrodes (RME1, RME2, RME3, and RME4) or light-emitting elements ED disposed in the first subpixel PX1.

The electrodes (RME1, RME2, RME3, and RME4) may be disposed in the emission area EMA and may extend beyond the emission area EMA to overlap with the second bank BNL2 in the thickness direction. The electrodes (RME1, RME2, RME3, and RME4) may extend in the second direction DR2 in the first subpixel PX1 but may be spaced from electrodes (RME1, RME2, RME3, and RME4) of a neighboring subpixel PXn that is adjacent to the first subpixel PX1 in the second direction DR2, in the emission area EMA or the cut area CBA. For example, the first electrode RME1 may be spaced, in the second direction DR2, from the fourth electrode RME4 in the emission area EMA and may be spaced, in the second direction DR2, from a fourth electrode RME4 of the neighboring subpixel PXn, in the cut area CBA. Similarly, the second electrode RME2 may be spaced, in the second direction DR2, from the third electrode RME3 and a third electrode RME3 from the neighboring subpixel PXn.

The electrodes (RME1, RME2, RME3, and RME4) may be obtained by separating electrode lines that extend in the second direction DR2, after the arrangement of the light-emitting elements ED. The electrode lines may be used to generate an electric field in the first subpixel PX1 to align the light-emitting elements ED during the fabrication of the display device 10. The light-emitting elements ED is sprayed onto the electrode lines via inkjet printing, and once ink including the light-emitting elements ED is sprayed onto the electrode lines, an electric field is generated by applying an alignment signal to the electrode lines. The light-emitting elements ED may be placed on the electrodes (RME1, RME2, RME3, and RME4) by the electric field generated between the electrode lines. The light-emitting elements ED scattered in the ink may receive an electrophoretic force from the electric field and may thus be aligned on the electrodes (RME1, RME2, RME3, and RME4). Thereafter, the electrodes (RME1, RME2, RME3, and RME4) may be formed by disconnecting some of the electrode lines. Signals for causing the light-emitting elements ED to emit light may be applied to some of the electrodes (RME1, RME2, RME3, and RME4).

The first, second, third, and fourth electrodes RME1, RME2, RME3, and RME4 may be disposed on the first banks BNL1 that are spaced from one another. The electrodes (RME1, RME2, RME3, and RME4) may be disposed on first sides, in the first direction DR1, of the first banks BNL1 to be placed on the inclined side surfaces of the first banks BNL1. The width, in the first direction DR1, of the electrodes (RME1, RME2, RME3, and RME4) may be smaller than the width, in the first direction DR1, of the first banks BNL1, and the length, in the second direction DR2, of the electrodes (RME1, RME2, RME3, and RME4) may be smaller than the length, in the second direction DR2, of the first banks BNL1. The electrodes (RME1, RME2, RME3, and RME4) may be disposed to cover at least one side surface of each of the first banks BNL1 to reflect light emitted from the light-emitting elements ED.

The distance, in the first or second direction DR1 or DR2, between the electrodes (RME1, RME2, RME3, and RME4) may be smaller than the distance between the first banks BNL1. At least parts of the electrodes (RME1, RME2, RME3, and RME4) may be disposed directly on the third interlayer insulating layer IL3 to be placed at the same plane.

The electrodes (RME1, RME2, RME3, and RME4) may be electrically connected to the light-emitting elements ED. Also, some of the electrodes (RME1, RME2, RME3, and RME4) may be connected to the second conductive layer so that the signals for causing the light-emitting elements ED to emit light may be applied thereto. On the contrary, some of the electrodes (RME1, RME2, RME3, and RME4) may not be connected to the second conductive layer, but may be connected only to the light-emitting elements ED. The electrode RME of the display device 10 may include first-type electrodes RME #1 that are electrically connected to the second conductive layer, and second-type electrodes RME #2 that are not electrically connected to the second conductive layer. Contact holes (CT1 and CT2) may be formed in the third interlayer insulating layer IL3 to expose parts of the second conductive layer through the third interlayer insulating layer IL3, and the first-type electrodes RME #1 may be electrically connected to the second conductive layer through the contact holes (CT1 and CT2).

For example, the first and second electrodes RME1 and RME2 may be the first-type electrodes RME #1, and the first electrode RME1 may be in contact with the first conductive pattern CDP through a first contact hole CT1, which is formed in an area that overlaps with the first electrode RME1 and the second bank BNL2. The second electrode RME2 may be in contact with the second voltage line VL2 through a second contact hole CT2, which is formed in an area that overlaps with the second electrode RME2 and the second bank BNL2. The first electrode RME1 may be electrically connected do the first transistor T1 via the first conductive pattern CDP and may thus receive the first power supply voltage, and the second electrode RME2 may receive the second power supply voltage via the second voltage line VL2. The first and second power supply voltages may be transmitted to the light-emitting elements ED via the first and second electrodes RME1 and RME2, respectively. Because the first-type electrodes RME #1 are separate between the subpixels PXn, the light-emitting elements ED in one subpixel PXn can emit light separately from (or independently of) the light-emitting elements ED in another subpixel PXn.

The first and second contact holes CT1 and CT2 are illustrated as being formed in the areas that overlap with the second bank BNL2, but the present disclosure is not limited thereto. The locations of the first and second contact holes CT1 and CT2 may vary. For example, the first and second contact holes CT1 and CT2 may be located in the emission area EMA surrounded by the second bank BNL2, or more than two contact holes may be formed.

The second-type electrodes RME #2 may be disposed not to be connected to the second conductive layer through contact holes. The third and fourth electrodes RME3 and RME4 may be the second-type electrodes RME #2 and may not be directly connected to the second conductive layer. As will be described later, the second-type electrodes RME #2 may be placed in contact with, and electrically connected to, a second-type contact electrode CNE #2. The display device 10 includes the first-type electrodes RME #1, which receive signals via the second conductive layer, and the second-type electrodes RME #2, which do not receive signals via the second conductive layer, and some of the light-emitting elements ED may be connected in series. The second-type electrodes RME #2 and the second-type contact electrode CNE #2 may form paths for the light-emitting elements ED to be electrically connected in series. This will be described later in detail when describing the contact electrodes (CNE1 and CNE2, and CNE3).

The electrodes (RME1, RME2, RME3, and RME4) may include a conductive material with high reflectance. For example, the electrodes (RME1, RME2, RME3, and RME4) may include a metal with high reflectance such as silver (Ag), Cu, or Al or may include an alloy of Al, Ni, or lanthanum (La). The electrodes (RME1, RME2, RME3, and RME4) may reflect light, emitted from the light-emitting elements ED to travel toward the sides of the first banks BNL1, in an upward direction from the first subpixel PX1.

However, the present disclosure is not limited to this, and the electrodes (RME1, RME2, RME3, and RME4) may further include a transparent conductive material. For example, the electrodes (RME1, RME2, RME3, and RME4)

may include a material such as ITO, IZO, or ITZO. In some embodiments, each of the electrodes (RME1, RME2, RME3, and RME4) may form a structure in which a transparent conductive material and a metal with high reflectance are stacked into more than one layer, or may be formed as a single layer including a transparent conductive material and a metal with high reflectance. For example, each of the electrodes (RME1, RME2, RME3, and RME4) may have a stack of ITO/Ag/ITO, ITO, ITO/Ag/IZO, or ITO/Ag/ITZO/IZO.

A first insulating layer PAS1 is disposed on the third interlayer insulating layer IL3. The first insulating layer PAS1 may be disposed to cover the first banks BNL1 and the electrodes (RME1, RME2, RME3, and RME4). The first insulating layer PAS1 may protect the electrodes (RME1, RME2, RME3, and RME4) and may insulate the electrodes (RME1, RME2, RME3, and RME4) from one another. Also, the first insulating layer PAS1 may prevent the light-emitting elements ED from being in direct contact with, and damaged by, other elements.

The first insulating layer PAS1 may include openings OP that partially expose the electrodes (RME1, RME2, RME3, and RME4). For example, the openings OP may expose parts of the electrodes (RME1, RME2, RME3, and RME4) on the top surfaces of the first banks BNL1. The contact electrodes (CNE1, CNE2, and CNE3) may be in contact with the parts of the respective electrodes (RME1, RME2, RME3, and RME4) exposed by the openings OP. The openings OP may penetrate not only the first insulating layer PAS1, but also a second or third insulating layer PAS2 or PAS3.

The first insulating layer PAS1 may be formed to be recessed between the electrodes (RME1, RME2, RME3, and RME4) and have height differences at the top thereof. For example, the first insulating layer PAS1 may have height differences at the top thereof depending on the shapes of the electrodes (RME1, RME2, RME3, and RME4) disposed therebelow.

The second bank BNL2 may be disposed on the first insulating layer PAS1. In a plan view, the second bank BNL2 may include portions that extend in the first direction DR1 and portions that extend in the second direction DR2 and may thus be arranged in a lattice pattern on the entire surface of the display area DPA. The second bank BNL2 may be disposed along the boundaries of each of the subpixels PXn to define each of the subpixels PXn. Also, the second bank BNL2 may be disposed to surround the emission area EMA and the cut area CBA of each of the subpixels PXn to separate the emission area EMA and the cut area CBA of each of the subpixels PXn. The first, second, third, and fourth electrodes RME1, RME2, RME3, and RME4 may extend in the second direction DR2 across the portions of the second bank BNL2 that extend in the first direction DR1.

The second bank BNL2 may be formed to have a greater height than the first banks BNL1. The second bank BNL2 may prevent ink from spilling over between different subpixels PXn (e.g., adjacent subpixels PXn) during an inkjet printing process during the fabrication of the display device 10 and may separate ink having the light-emitting elements 30 scattered therein between different subpixels PXn (e.g., adjacent subpixels PXn) to prevent mixture of the ink. Because each of the first banks BNL1 is disposed in and across a pair of adjacent subpixels PXn in the first direction DR1, parts of the second bank BNL2 that extend in the second direction DR2 may be disposed on the first banks BNL1. The second bank BNL2, like the first banks BNL1, may include polyimide PI, but the present disclosure is not limited thereto.

The light-emitting elements ED may be disposed on the first insulating layer PAS1. A plurality of light-emitting elements ED may be disposed to be spaced from one another in the direction in which the electrodes (RME1, RME2, RME3, and RME4) extend, i.e., in the second direction DR2, and may be aligned substantially in parallel to one another. The light-emitting elements ED may extend in one direction, and the direction in which the electrodes (RME1, RME2, RME3, and RME4) extend may form a substantially right angle with the direction in which the light-emitting elements ED extend. However, the present disclosure is not limited to this. In some embodiments, the light-emitting elements ED may be arranged diagonally with respect to the direction in which the electrodes (RME1, RME2, RME3, and RME4) extend.

Each of the light-emitting elements ED may include semiconductor layers doped to have different conductivity types. Each of the light-emitting elements ED may include a plurality of semiconductor layers and may be aligned to face a particular direction at one end thereof in accordance with the direction of an electric field formed on the electrodes (RME1, RME2, RME3, and RME4). Each of the light-emitting elements ED may further include a light-emitting layer 36 (of FIG. 8), and the light-emitting layers 36 of light-emitting elements ED in one subpixel PXn may include a different material from the light-emitting layers 36 of light-emitting elements ED in another subpixel PXn so that different subpixels PXn may emit light of different wavelength ranges. Accordingly, the first, second, and third subpixels PX1, PX2, and PX3 can emit light of the first, second, and third colors, respectively, but the present disclosure is not limited thereto. In some embodiments, the subpixels PXn may include light-emitting elements ED of the same type and may thus emit light of substantially the same color.

The light-emitting elements ED may be disposed on pairs of different electrodes (RME1, RME2, RME3, and RME4) (or disposed between two adjacent electrodes from among first to fourth electrodes RME1, RME2, RME3, and RME4) that are spaced from each other in the first direction DR1, between the first banks BNL1. The light-emitting elements ED may be disposed so that both end portions thereof may be placed on the first and third electrodes RME1 and RME3 or on the second and fourth electrodes RME2 and RME4. The length of the light-emitting elements ED may be greater than the distance, in the first direction DR1, between two adjacent electrodes from among first to fourth electrodes RME1, RME2, RME3, and RME4, one end portion of each of the light-emitting elements ED may be placed on one of the electrodes (RME1, RME2, RME3, and RME4), and the other end portion of each of the light-emitting elements ED may be placed on another one of the electrodes (RME1, RME2, RME3, and RME4) adjacent thereto.

In each of the light-emitting elements ED, a plurality of layers may be disposed (or stacked) in a direction perpendicular to the first substrate SUB or the third interlayer insulating layer IL3. The direction in which the light-emitting elements ED extend may be parallel to the top surface of the third interlayer insulating layer IL3, and the semiconductor layers included in each of the light-emitting elements ED may be sequentially arranged along a direction parallel to the top surface of the third interlayer insulating layer IL3. However, the structure of the light-emitting elements ED is not particularly limited. In some embodiments, the semiconductor layers included in each of the light-emitting elements ED may be arranged along the direction perpendicular to the top surface of the third interlayer insulating layer IL3.

Both end portions of each of the light-emitting elements ED may be in contact with the contact electrodes (CNE1, CNE2, and CNE3). For example, an insulating film 38 (of FIG. 8) may not be formed at one end of each of the light-emitting elements ED so that some of the semiconductor layers of each of the light-emitting elements ED may be exposed and may be in contact with the contact electrodes (CNE1, CNE2, and CNE3), but the present disclosure is not limited thereto. In some embodiments, the insulating film 38 may be partially removed so that the sides of the semiconductor layers of each of the light-emitting elements ED may be partially exposed. The exposed sides of the semiconductor layers of each of the light-emitting elements ED may be in direct contact with the contact electrodes (CNE1, CNE2, and CNE3).

As will be described later, each of the light-emitting elements ED may include a first semiconductor layer 31 (of FIG. 8), a second semiconductor layer 32 (of FIG. 8), and the light-emitting layer 36 (of FIG. 8). The first semiconductor layer 31 may be longer than the second semiconductor layer 32, and an end portion of each of the light-emitting elements ED where the first semiconductor layer 31 is disposed and an end portion of each of the light-emitting elements ED where the second semiconductor layer 32 is disposed may be referred to as a first end portion and a second end portion (or as a second end portion and a first end portion), respectively. The light-emitting layer 36 may be disposed closer to the second end portion than to the first end portion of each of the light-emitting elements ED with respect to the center, in the lengthwise direction, of each of the light-emitting elements ED. The first end portions of the light-emitting elements ED may be disposed on the first-type electrodes RME #1 (e.g., RME1, RME2), and the second end portions of the light-emitting elements ED may be disposed on the second-type electrodes RME #2 (RME3, RME4). For example, the light-emitting elements ED may include first light-emitting elements ED1, which have both end portions disposed on the first and third electrodes RME1 and RME3 that are first- and second-type electrodes RME #1 and RME #2, respectively, and second light-emitting elements ED2, which have both end portions disposed on the second and fourth electrodes RME2 and RME4 that are first- and second-type electrodes RME #1 and RME #2, respectively. The first light-emitting elements ED1 and the second light-emitting elements ED2 may be disposed on the first-type electrodes RME #1 and the second-type electrodes RME #2 but may have different end portions disposed on different types of electrodes. The first end portions of the first light-emitting elements ED1 may be disposed on the first electrode RME1, and the second end portions of the first light-emitting elements ED1 may be disposed on the third electrode RME3. On the contrary, the first end portions of the second light-emitting elements ED2 may be disposed on the fourth electrode RME4, and the second end portions of the second light-emitting elements ED2 may be disposed on the second electrode RME2. Referring to FIG. 3, the first end portions of the light-emitting elements ED may be the end portions of the light-emitting elements ED that are disposed on the first or fourth electrode RME1 or RME4, and the second end portions of the light-emitting elements ED may be the end portions of the light-emitting elements ED that are disposed on the second or third electrode RME2 or RME3.

The light-emitting elements ED may have both end portions in contact with the at least one of the contact electrodes (CNE1, CNE2, and CNE3) and may thus be electrically connected to the respective electrodes (RME1, RME2, RME3, and RME4). Each of the light-emitting elements ED may include the first and second semiconductor layers 31 and 32 and may thus have a particular alignment direction faced by a particular end thereof, and signals applied from the electrodes (RME1, RME2, RME3, and RME4) may flow through the light-emitting elements ED in a particular direction. For example, an electrical signal applied via the first transistor T1 may flow from the first end portions to the second end portions of the light-emitting elements ED, and an electrical signal applied via the second voltage line VL2 may flow from the second end portions to the first end portions of the light-emitting elements ED. The light-emitting elements ED may be classified into the first light-emitting elements ED1, which have both end portions connected to the electrodes (RME1, RME2, RME3, and RME4), and the second light-emitting elements ED2, which also have both end portions connected to the electrodes (RME1, RME2, RME3, and RME4), but in reverse from the first light-emitting elements ED1, and signals applied from the electrodes (RME1, RME2, RME3, and RME4) may flow through different types of light-emitting elements, i.e., the first light-emitting elements ED1 and the second light-emitting elements ED2. As a result, the first light-emitting elements ED1 and the second light-emitting elements ED2 can be connected in series.

The second insulating layer PAS2 may be disposed on the first insulating layer PAS1 and the light-emitting elements ED to expose both end portions of each of the light-emitting elements ED. For example, the second insulating layer PAS2 may be disposed not only on the light-emitting elements ED, but also on the entire surface (or a partial surface) of the first insulating layer PAS1, but may be disposed only on parts of the light-emitting elements ED to expose both end portions of the light-emitting elements ED. During the fabrication of the display device 10, the second insulating layer PAS2 may be initially disposed to cover the light-emitting elements ED, the electrodes (RME1, RME2, RME3, and RME4), and the first insulating layer PAS1 and may then be partially removed to expose both end portions of each of the light-emitting elements ED. The second insulating layer PAS2 may be disposed on the first insulating layer PAS1 and may extend in the second direction DR2 in a plan view, thereby forming a linear or island pattern in each of the subpixels PXn. The second insulating layer PAS2 may protect the light-emitting elements ED and may fix the light-emitting elements ED during the fabrication of the display device 10.

As illustrated in FIG. 4, the second insulating layer PAS2 may not be disposed in the gap, in the second direction DR2, between the first and fourth electrodes RME1 and RME4 and the gap, in the second direction DR2, between the second and third electrodes RME2 and RME3. These gaps may be regions where electrode lines for aligning the light-emitting elements are previously arranged during the fabrication of the display device 10 and are then removed later by a line cutting process. The line cutting process may be performed after the formation of the second insulating layer PAS2, and not only the second insulating layer PAS2, but also the first insulating layer PAS1 and the electrodes (RME1, RME2, RME3, and RME4), may not be disposed in the gaps between the first and fourth electrodes RME1 and RME4 and between the second and third electrodes RME2 and RME3 (e.g., see, for example, FIG. 6).

A plurality of contact electrodes (CNE1, CNE2, and CNE3) and the third insulating layer PAS3 may be disposed on the second insulating layer PAS2. The contact electrodes (CNE1, CNE2, and CNE3) may include portions that extend in one direction and may be disposed on the electrodes (RME1, RME2, RME3, and RME4). The portions of the contact electrodes (CNE1, CNE2, and CNE3) that extend in one direction may be disposed to be spaced from one another.

The contact electrodes (CNE1, CNE2, and CNE3) may be disposed on the electrodes (RME1, RME2, RME3, and RME4) to be in contact with the exposed parts of the electrodes (RME1, RME2, RME3, and RME4) through the openings OP of the first insulating layer PAS1. The light-emitting elements ED may be electrically connected to the electrodes (RME1, RME2, RME3, and RME4) via the contact electrodes (CNE1, CNE2, and CNE3). The width, in the first direction DR1, of the contact electrodes (CNE1, CNE2, and CNE3) may be smaller than the width, in the first direction DR1, of the electrodes (RME1, RME2, RME3, and RME4). The contact electrodes (CNE1, CNE2, and CNE3) may be disposed to be in contact with the light-emitting elements ED and cover parts of the top surfaces of the electrodes (RME1, RME2, RME3, and RME4). However, the present disclosure is not limited to this. In some embodiments, the contact electrodes (CNE1, CNE2, and CNE3) may be formed to have a greater width than the electrodes (RME1, RME2, RME3, and RME4) and thus to cover both side surfaces of each of the electrodes (RME1, RME2, RME3, and RME4).

The contact electrodes (CNE1, CNE2, and CNE3) may be in contact with end portions of the light-emitting elements ED and the electrodes (RME1, RME2, RME3, and RME4). Each of the light-emitting elements ED may have the semiconductor layers exposed on both end portions, and the contact electrodes (CNE1, CNE2, and CNE3) may be in contact with, and electrically connected to, the semiconductor layers of each of the light-emitting elements ED. Sides of the contact electrodes (CNE1, CNE2, and CNE3) that are in contact with the end portions of the light-emitting elements ED may be disposed on the second or third insulating layer PAS2 or PAS3. In some embodiments, as shown in FIGS. 5 and 7, the sides of the contact electrodes (CNE1, CNE2, and CNE3) that are in contact with the end portions of the light-emitting elements ED may be disposed on the first insulating layer PAS1.

The contact electrodes (CNE1, CNE2, and CNE3) may include the first-type contact electrodes CNE #1, which are disposed on the first-type electrodes RME #1 (e.g., RME1, RME2), and the second-type contact electrode CNE #2, which is disposed on the second-type electrodes RME #2 (e.g., RME3, RME4). For example, the first-type contact electrodes CNE #1 may include first and second contact electrodes CNE1 and CNE2, which are disposed on the first and second electrodes RME1 and RME2, respectively, and the second-type contact electrode CNE #2 may include a third contact electrode CNE3, which is disposed on the third and fourth electrodes RME3 and RME4.

The first and second contact electrodes CNE1 and CNE2, which are first-type contact electrode CNE #1, may extend in one direction. The first and second contact electrodes CNE1 and CNE2 may be disposed on, and in direct contact with, the first and second electrodes RME1 and RME2, respectively. The first contact electrode CNE1 may be in contact with the first end portions of the first light-emitting elements ED1, and the second contact electrode CNE2 may be in contact with the second end portions of the second light-emitting elements ED2. The first-type electrodes RME #1 may be directly connected to the second conductive layer so that the signals for causing the light-emitting elements ED to emit light may be applied to the light-emitting elements ED. The first contact electrode CNE1 may transmit the first power supply voltage, applied thereto via the first transistor T1, to the first end portions of the first light-emitting elements ED1, and the second contact electrode CNE2 may transmit the second power supply voltage, applied thereto via the second voltage line VL2, to the second end portions of the second light-emitting elements ED2. The first-type contact electrodes CNE #1 may be connected to the first-type electrodes RME #1 and may thus transmit a power supply voltage, applied thereto via the second conductive layer, directly to the light-emitting elements ED.

The third contact electrode CNE3, which is a second-type contact electrode CNE #2, may include two portions that extend in one direction and a portion that connect the two portions. The second-type contact electrode CNE #2 may include a plurality of contact electrode extensions (CN_E1 and CN_E2) and a contact electrode connector CN_B, which connects the contact electrode extensions (CN_E1 and CN_E2), and may have a bent shape, at least in part. The third contact electrode CNE3 may include a first contact electrode extension CN_E1, which is disposed on the third electrode RME3 and is spaced from the first contact electrode CNE1 in the first direction DR1, a second contact electrode extension CN_E2, which is disposed on the fourth electrode RME4 and is spaced from the second contact electrode CNE2 in the first direction DR1, and the contact electrode connector CN_B, which connects the first and second contact electrode extensions CN_E1 and CN_E2. The first contact electrode extension CN_E1 may be in contact with the second end portions of the first light-emitting elements ED1 and the third electrode RME3, and the second contact electrode extension CN_E2 may be in contact with the first end portions of the second light-emitting elements ED2 and the fourth electrode RME4. The contact electrode connector CN_B may be disposed between the electrodes (RME1, RME2, RME3, and RME4), that are disposed between pairs of electrodes (RME1, RME2, RME3, and RME4) spaced from each other in the second direction DR2 (e.g., see FIG. 6). The contact electrode connector CN_B may be disposed (e.g., to avoid the first-type contact electrodes CNE #1) to prevent any short circuit among the first-type contact electrodes CNE #1 and may be disposed between the pairs of electrodes (RME1, RME2, RME3, and RME4) spaced from each other in the second direction DR2 to reduce or minimize the area of occupancy of the contact electrode connector CN_B.

The third insulating layer PAS3 may be disposed between the first-type contact electrodes CNE #1 and the second-type contact electrode CNE #2. The third insulating layer PAS3 may be disposed to cover the first-type contact electrodes CNE #1 and to expose end portions of the light-emitting elements ED that are not in contact with the first-type contact electrodes CNE #1. As the third insulating layer PAS3 is disposed, the first-type contact electrodes CNE #1 and the second-type contact electrode CNE #2 can be prevented from being directly connected and short-circuited. For example, the third insulating layer PAS3 may be disposed directly on the third interlayer insulating layer IL3, in the gaps between the first and fourth electrodes RME1 and RME4 and between the second and third electrodes RME2 and RME3, and may prevent the third contact electrode CNE3, which is a second-type contact electrode CNE #2, from being in contact with the first-type electrodes RME #1 in an undesignated area.

The second-type contact electrode CNE #2 may be disposed on the second-type electrodes RME #2, and thus, no power supply voltage may be directly applied to the second-type contact electrode CNE #2. However, because the first power supply voltage and the second power supply voltage are applied to the first light-emitting elements ED1 and the second light-emitting elements ED2, respectively, the first power supply voltage and the second power supply voltage may flow along the light-emitting elements ED and along the third contact electrode CNE3, which is a second-type contact electrode CNE #2. The third contact electrode CNE3 may electrically connect the second end portions of the first light-emitting elements ED1 and the first end portions of the second light-emitting elements ED2 in series. As the second-type contact electrode CNE #2 is in contact with the second-type electrodes RME #2, the second-type electrodes RME #2 may be prevented from remaining in a floated state.

The first-type contact electrodes CNE #1 may be in contact with the first end portions of the first light-emitting elements ED1 or the second end portions of the second light-emitting elements ED2, but the second-type contact electrode CNE #2 may be in contact with the second end portions of the first light-emitting elements ED1 and the first end portions of the second light-emitting elements ED2. Each of the light-emitting elements ED may include the first and second semiconductor layers 31 and 32 and may thus have a particular alignment direction faced by a particular end thereof. Also, each of the light-emitting elements ED may have a direction along which a power supply voltage flows. The second-type contact electrode CNE #2, which is in contact with both the second end portions of the first light-emitting elements ED1 and the first end portions of the second light-emitting elements ED2, may form a path via which the first light-emitting elements ED1 and the second light-emitting elements ED2 are connected in series and may transmit the power supply voltage, applied to the first-type electrodes RME #1, directly to the light-emitting elements ED.

During the fabrication of the display device 10, the light-emitting elements ED may be aligned in a particular direction with the use of a pair of electrode lines, and the pair of electrode lines may be separated, thereby forming different types of electrodes, i.e., the first-type electrodes RME #1 and the second-type electrodes RME #2. Both end portions of each of the light-emitting elements ED may be disposed on different types of electrodes, but the light-emitting elements ED may be aligned in the same direction because they are aligned by a pair of electrode lines. The light-emitting elements ED may be classified into the first light-emitting elements ED1 and the second light-emitting elements ED2 depending on whether the first end portions thereof are disposed on the first-type electrodes RME #1 or on the second-type electrodes RME #2, and the first light-emitting elements ED1 and the second light-emitting elements ED2 may be connected in series via the contact electrodes (CNE1, CNE2, and CNE3), particularly, the second-type contact electrode CNE #2. Because the first-type electrodes RME #1 and the second-type electrodes RME #2 are formed by aligning the light-emitting elements ED with a pair of electrode lines and separating the pair of electrode lines, the light-emitting elements ED can be connected in series with a limited number of electrodes. Because some of the electrodes (RME1, RME2, RME3, and RME4) are spaced from one another in the second direction DR2 in the emission area EMA, a current path can be formed via the second-type contact electrode CNE #2. For example, even if the first subpixel PX1 is configured to occupy a minimal area, the light-emitting elements ED can be properly connected in series due to the design of different types of electrodes, i.e., the first-type electrodes RME #1 and the second-type electrodes RME #2, and the contact electrodes (CNE1, CNE2, and CNE3). Because the luminance and the emission efficiency, per unit area, of the display device 10 can be improved (e.g., based on the above described embodiments), the size of the subpixels PXn can be reduced or minimized, and as a result, an ultrahigh-resolution display device can be realized.

FIGS. 2 through 4 illustrate that the first, second, third, and fourth electrodes RME1, RME2, RME3, and RME4, i.e., a pair of first-type electrodes RME #1 and a pair of second-type electrodes RME #2, are provided, but the present disclosure is not limited thereto. More than two second-type electrodes RME #2 may be provided in each of the subpixels PXn, and more light-emitting elements ED than there are in the display device 10 of FIGS. 2 through 4 may also be provided in each of the subpixels PXn. This will be described later in detail when describing other embodiments of the present disclosure.

The contact electrodes (CNE1, CNE2, and CNE3) may include a transparent conductive material. For example, the contact electrodes (CNE1, CNE2, and CNE3) may include ITO, IZO, ITZO, or Al. Light emitted from the light-emitting elements ED may travel toward the electrodes (RME1, RME2, RME3, and RME4) through the contact electrodes (CNE1, CNE2, and CNE3), but the present disclosure is not limited thereto.

FIGS. 2 through 4 illustrate that two first-type contact electrodes CNE #1 (e.g., CNE1, CNE2) and one second-type contact electrode CNE #2 (e.g., CNE3) are disposed in each of the subpixels PXn, but the present disclosure is not limited thereto. The number of contact electrodes (CNE1, CNE2, and CNE3) may vary depending on the number of electrodes (RME1, RME2, RME3, and RME4) disposed in each of the subpixels PXn.

The first, second, and third insulating layers PAS1, PAS2, and PAS3 may include an inorganic insulating material or an organic insulating material. For example, the first, second, and third insulating layers PAS1, PAS2, and PAS3 may include an inorganic insulating material such as SiOx, SiNx, SiOxNy, aluminum oxide ($Al_2O_3$), or aluminum nitride (AlN), but the present disclosure is not limited thereto. In another example, the first, second, and third insulating layers PAS1, PAS2, and PAS3 may include an organic insulating material such as an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin, but the present disclosure is not limited thereto.

Although not specifically illustrated, an insulating layer may be further disposed on the contact electrodes (CNE1, CNE2, and CNE3), the third insulating layer PAS3, and the second bank BNL2 to cover the contact electrodes (CNE1, CNE2, and CNE3), the third insulating layer PAS3, and the second bank BNL2. The insulating layer may be disposed on the entire surface of the display area DPA of the first substrate SUB to protect the elements disposed in the display area DPA of the first substrate SUB from an external environment.

The display device 10 may include different types of electrodes, i.e., the first-type electrodes RME #1 and the second-type electrodes RME #2 that are obtained by aligning the light-emitting elements ED in the first subpixel PX1 with the use of electrode lines and separating the electrode lines. The first light-emitting elements ED1, which have both end portions disposed on the first-type electrodes RME #1 and the second-type electrodes RME #2, and the second light-emitting elements ED2, which also have both end portions disposed on the first-type electrodes RME #1 and the second-type electrodes RME #2, but in reverse from the first light-emitting elements ED1, may be electrically connected to the first-type electrodes RME #1 and the second-type electrodes RME #2 via the contact electrodes (CNE1, CNE2, and CNE3) and may be connected in series via the second-type contact electrode CNE #2. Because the first-type electrodes RME #1 and the second-type electrodes RME #2 and the first-type contact electrodes CNE #1 and the second-type contact electrode CNE #2 are provided, the first light-emitting elements ED1 and the second light-emitting elements ED2 can be connected in series within a limited space, and the luminance, per unit area, of the display device 10 can be improved.

Figure 8:
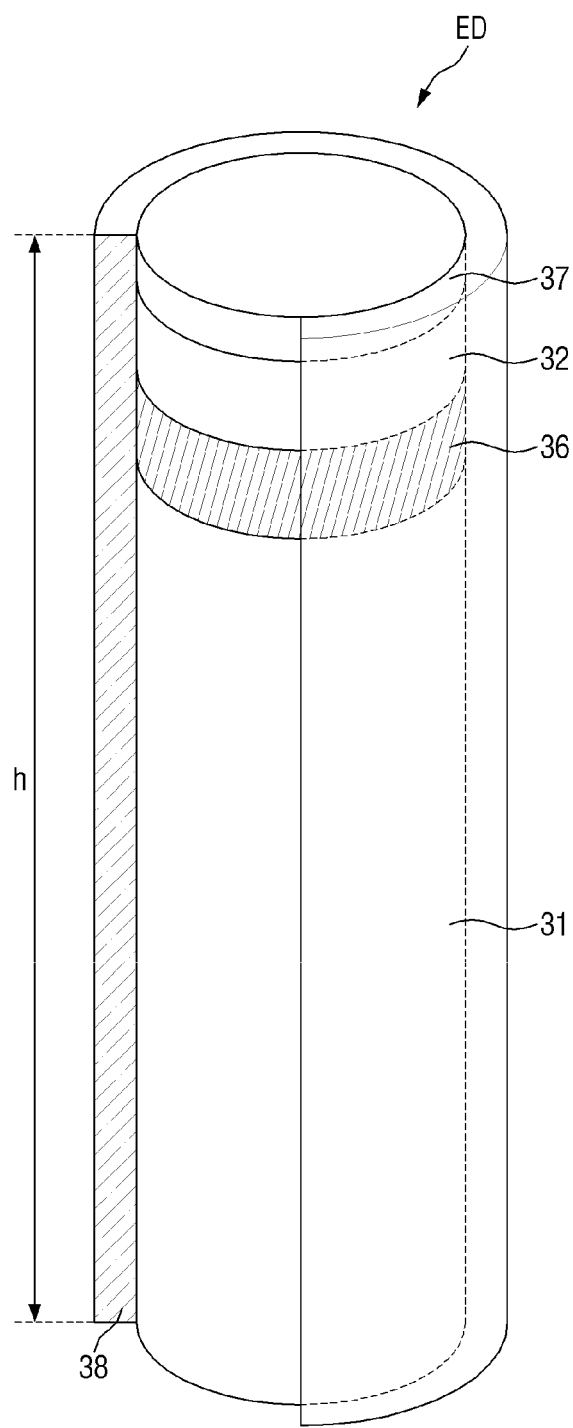
FIG. 8 is a perspective view of a light-emitting element according to one or more example embodiments of the present disclosure.

FIG. 8 is a perspective view of a light-emitting element according to one or more example embodiments of the present disclosure.

Referring to FIG. 8, a light-emitting element ED may be a light-emitting diode (LED), particularly, an ILED having a size of from several micrometers to nanometers and formed of an inorganic material. If an electric field is formed in a particular direction between two opposite electrodes, the ILED may be aligned between the two electrodes where polarities are formed. The light-emitting element ED may be aligned by the electric field formed between the two electrodes.

The light-emitting element ED may have a shape that extends in one direction. The light-emitting element ED may have the shape of a cylinder, a rod, a wire, or a tube, but the shape of the light-emitting element ED is not particularly limited. In some embodiments, the light-emitting element ED may have the shape of a polygonal column such as a regular cube, a rectangular parallelepiped, or a hexagonal column or may have a shape that extends in one direction but with a partially inclined outer surface. A plurality of semiconductors included in the light-emitting element ED may be sequentially disposed or stacked in the direction in which the light-emitting element ED extends.

The light-emitting element ED may include semiconductor layers doped with impurities of an arbitrary conductivity type (e.g., a p-type or an n-type). The semiconductor layers may receive electrical signals from an external power source to emit light of a particular wavelength range.

Referring to FIG. 8, the light-emitting element ED may include a first semiconductor layer 31, a second semiconductor layer 32, a light-emitting layer 36, an electrode layer 37, and an insulating film 38.

The first semiconductor layer 31 may include an n-type semiconductor. In a case where the light-emitting element ED emits light of a blue wavelength range, the first semiconductor layer 31 may include a semiconductor material $Al_xGa_yIn_{1-x-y}N$ (where $0 \leq x \leq 1$, $0 \leq y \leq 1$, and $0 \leq x+y \leq 1$). The semiconductor material $Al_xGa_yIn_{1-x-y}N$ may be at least one of AlGaInN, GaN, AlGaN, InGaN, AlN, and InN that are doped with an n-type dopant. The first semiconductor layer 31 may be doped with an n-type dopant, and the n-type dopant may be Si, Ge, or Sn. For example, the first semiconductor layer 31 may be n-GaN doped with n-type Si. The first semiconductor layer 31 may have a length of 1.5 µm to 5 µm, but the present disclosure is not limited thereto. A first end portion of the light-emitting element ED may be part of the light-emitting element ED where the first semiconductor layer 31 is disposed with respect to the light-emitting layer 36.

The second semiconductor layer 32 is disposed on the light-emitting layer 36. The second semiconductor layer 32 may include a p-type semiconductor In a case where the light-emitting element ED emits light of a blue or green wavelength range, the second semiconductor layer 32 may include a semiconductor material $Al_xGa_yIn_{1-x-y}N$ (where $0 \leq x \leq 1$, $0 \leq y \leq 1$, and $0 \leq x+y \leq 1$). For example, the semiconductor material $Al_xGa_yIn_{1-x-y}N$ may be at least one of AlGaInN, GaN, AlGaN, InGaN, AlN, and InN that are doped with a p-type dopant. The second semiconductor layer 32 may be doped with a p-type dopant, and the p-type dopant may be Mg, Zn, Ca, Se, or Ba. For example, the second semiconductor layer 32 may be p-GaN doped with p-type Mg. The second semiconductor layer 32 may have a length of 0.05 µm to 0.10 µm, but the present disclosure is not limited thereto. A second end portion of the light-emitting element ED may be a part of the light-emitting element ED where the second semiconductor layer 32 is disposed with respect to the light-emitting layer 36.

The first and second semiconductor layers 31 and 32 are illustrated as being formed as single-layer films, but the present disclosure is not limited thereto. In some embodiments, each of the first and second semiconductor layers 31 and 32 may include more than one layer such as, for example, a clad layer or a tensile strain barrier reducing (TSBR) layer, depending on the material of the light-emitting layer 36.

The light-emitting layer 36 is disposed between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple quantum layers and multiple well layers are alternately stacked. The light-emitting layer 36 may emit light by combining electron-hole pairs in accordance with electrical signals applied thereto via the first and second semiconductor layers 31 and 32. In a case where the light-emitting layer 36 emits light of a blue wavelength range, the quantum layers may include a material such as AlGaN or AlGaInN. In a case where the light-emitting layer 36 has a multi-quantum well structure in which multiple quantum layers and multiple well layers are alternately stacked, the quantum layers may include a material such as AlGaN or AlGaInN, and the well layers may include a material such as GaN or AlInN. For example, in a case where the light-emitting layer 36 includes AlGaInN as its quantum layer(s) and AlInN as its well layer(s), the light-emitting layer 36 can emit blue light having a central wavelength range of 450 nm to 495 nm.

However, the present disclosure is not limited thereto. In some embodiments, the light-emitting layer 36 may have a structure in which a semiconductor material having a large band gap energy and a semiconductor material having a small band gap energy are alternately stacked or may include group III or group V semiconductor materials depending on the wavelength of light to be emitted. The type of light emitted by the light-emitting layer 36 is not particularly limited. The light-emitting layer 36 may emit light of a red or green wavelength range as necessary, instead of blue light. The light-emitting layer 36 may have a length of 0.05 µm to 0.10 µm, but the present disclosure is not limited thereto.

Light may be emitted not only from the peripheral surface (or a circumferential surface), in a length direction, of the light-emitting element ED, but also from both sides of the light-emitting element ED. The directionality of the light emitted from the light-emitting layer 36 is not particularly limited.

The electrode layer 37 may be an ohmic contact electrode, but the present disclosure is not limited thereto. In some embodiments, the electrode layer 37 may be a Schottky contact electrode. The light-emitting element ED may include at least one electrode layer 37. FIG. 8 illustrates that the light-emitting element ED includes one electrode layer 37, but the present disclosure is not limited thereto. In some embodiments, the light-emitting element ED may include more than one electrode layer 37, or the electrode layer 37 may not be provided. However, the following description of the light-emitting element ED may be directly applicable to a light-emitting element ED having more than one electrode layer 37 or having a different structure from the light-emitting element ED of FIG. 8.

The electrode layer 37 may reduce the resistance between the light-emitting element ED and electrodes (or contact electrodes) when the light-emitting element ED is electrically connected to the electrodes (or the contact electrodes). The electrode layer 37 may include a conductive metal. For example, the electrode layer 37 may include at least one of Al, Ti, In, Au, Ag, ITO, IZO, and ITZO. Also, the electrode layer 37 may include a semiconductor material doped with an n-type or p-type dopant. The electrode layer 37 may include the same material or different materials, but the present disclosure is not limited thereto.

The insulating film 38 is disposed to surround the first and second semiconductor layers 31 and 32 and the electrode layer 37. For example, the insulating film 38 may be disposed to surround at least the light-emitting layer 36 and may extend in the direction in which the light-emitting element ED extends. The insulating film 38 may protect the first semiconductor layer 31, the light-emitting layer 36, the second semiconductor layer 32, and the electrode layer 37. For example, the insulating film 38 may be formed to surround the sides (e.g., a side surface) of the first semiconductor layer 31, the light-emitting layer 36, the second semiconductor layer 32, and the electrode layer 37, but to expose both end portions, in the length direction, of the light-emitting element ED.

The insulating film 38 is illustrated as being formed to extend in the length direction of the light-emitting element ED and to cover the sides of the first semiconductor layer 31, the light-emitting layer 36, the second semiconductor layer 32, and the electrode layer 37, but the present disclosure is not limited thereto. The insulating film 38 may cover the sides of only the light-emitting layer 36 and some of the first and second semiconductor layers 31 and 32 or may cover only part of the side of the electrode layer 37 so that the side of the electrode layer 37 may be partially exposed. The insulating film 38 may be formed to be rounded in a cross-sectional view, in a region adjacent to at least one end of the light-emitting element ED.

The insulating film 38 may have a thickness of 10 nm to 1.0 µm, but the present disclosure is not limited thereto. The insulating film 38 may have a thickness of about 40 nm.

The insulating film 38 may include a material with insulating properties such as, for example, SiOx, SiNx, SiOxNy, AlN, or Al2O3. Accordingly, the insulating film 38 can prevent any short circuit that may occur when the light-emitting layer 36 is placed in direct contact with electrodes that transmit electrical signals directly to the light-emitting element ED. Also, because the insulating film 38 surrounds the light-emitting layer 36 to protect the outer surface of the light-emitting element ED, any degradation in the emission efficiency of the light-emitting element ED can be prevented or reduced.

The outer surface of the insulating film 38 may be subjected to surface treatment. The light-emitting element ED may be sprayed on electrodes while being scattered in an ink (e.g., a predetermined ink). Here, the surface of the insulating film 38 may be hydrophobically or hydrophilically treated to keep the light-emitting element ED scattered in ink without agglomerating with other neighboring light-emitting elements ED. For example, the insulating film 38 may be surface-treated with a material such as stearic acid or 2,3-naphthalene dicarboxylic acid.

A length h of the light-emitting element ED may be in the range of 1 µm to 10 µm or 2 µm to 6 µm, or, 3 µm to 5 µm. The light-emitting element ED may have a diameter of 30 nm to 700 nm and may have an aspect ratio of 1.2 to 100, but the present disclosure is not limited thereto. Different light-emitting elements ED included in the display device 10 may have different diameters depending on the composition of their respective light-emitting layers 36. In some embodiments, the light-emitting element ED may have a diameter of about 500 nm.

A method of fabricating the display device 10 will hereinafter be described.

FIGS. 9 through 14 are plan views illustrating processes of a method of fabricating a display device according to one or more example embodiments of the present disclosure. Processes of the fabrication of the display device 10 will hereinafter be described, reducing or minimizing descriptions of how the elements of the display device 10 are stacked and the structures of the elements of the display device 10.

Figure 9:
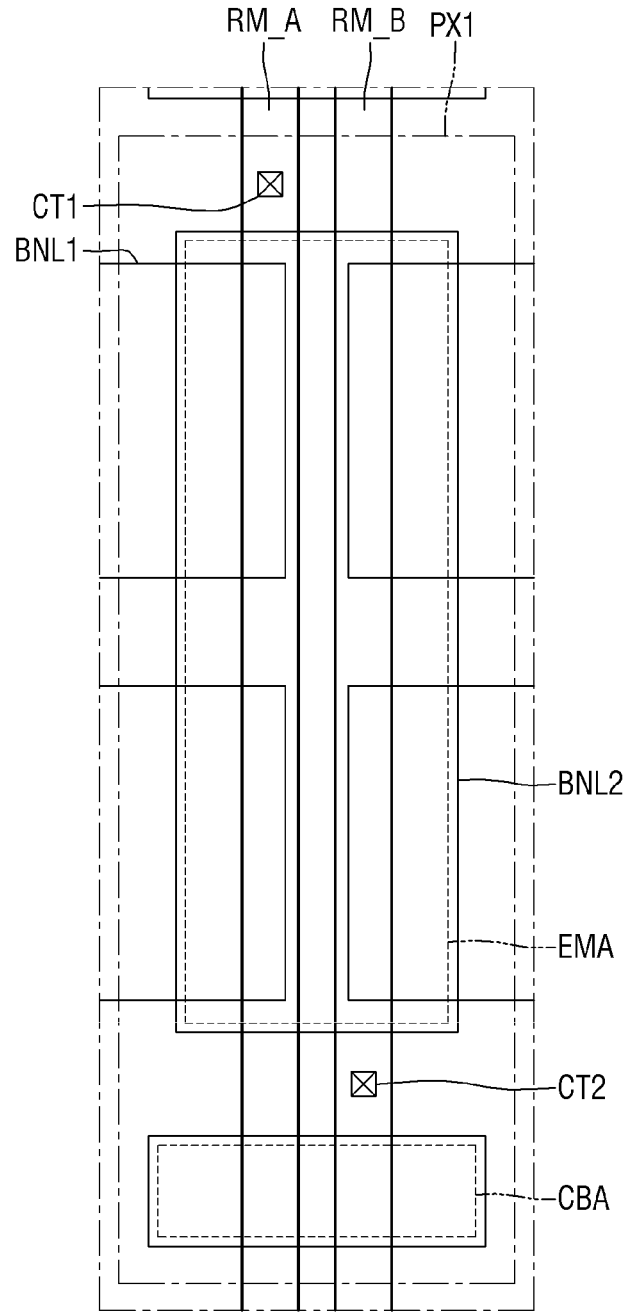
FIGS. 9 through 14 are plan views illustrating processes of a method of fabricating a display device according to one or more example embodiments of the present disclosure.

Referring to FIG. 9, the first substrate SUB where the first banks BNL1, electrode lines (RM_A and RM_B), the first insulating layer PAS1, and the second bank BNL2 are formed is prepared. Layers ranging from the light-blocking layer BML to the third interlayer insulating layer IL3 may be disposed between the substrate SUB and the first banks BNL1.

The electrode lines (RM_A and RM_B) may include first and second electrode lines RM_A and RM_B, which extend in the second direction DR2 and are spaced from each other in the first direction DR1. The first and second electrode lines RM_A and RM_B may be disposed in and across a pair of adjacent subpixels PXn in the second direction DR2. The first and second electrode lines RM_A and RM_B may extend beyond the display area DPA to the non-display area NDA and may be connected to pads (not illustrated) disposed in the non-display area NDA or on a base substrate where the display device 10 is to be fabricated. The first and second electrode lines RM_A and RM_B may be used to generate an electric field for aligning the light-emitting elements ED in the display area DPA. Because the first and second electrode lines RM_A and RM_B are separated into the electrodes (RME1, RME2, RME3, and RME4) in a subsequent process, the arrangement of the first and second electrode lines RM_A and RM_B may be substantially the same as the arrangement of the electrodes (RME1, RME2, RME3, and RME4). For example, the electrode lines (RM_A and RM_B) may be disposed on the pairs of first banks BNL1 spaced from each other in the first direction DR1. The first electrode line RM_A may be in contact with the first conductive pattern CDP through the first contact hole CT1, and the second electrode line RM_B may be in contact with the second voltage line VL2 through the second contact hole CT2.

Figure 10:
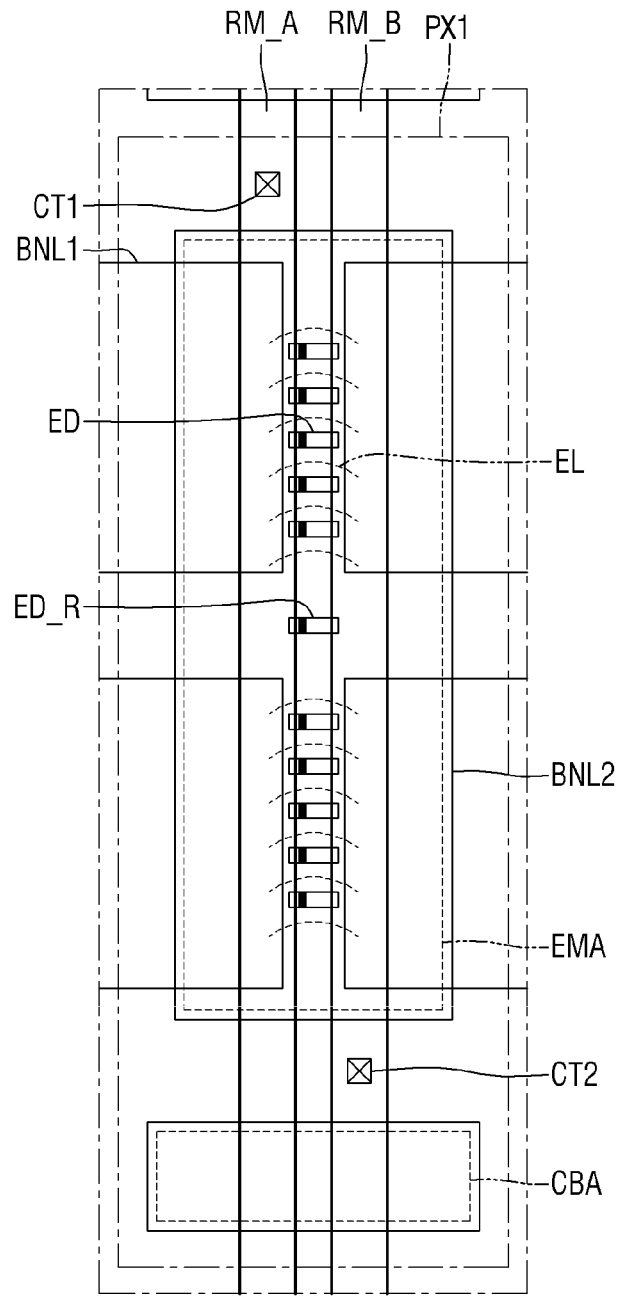

Thereafter, referring to FIG. 10, a plurality of light-emitting elements ED may be disposed on the electrode lines (RM_A and RM_B) of the first subpixel PX1. Ink having the light-emitting elements ED scattered therein may be prepared and may be sprayed into the emission area EMA via inkjet printing. The second bank BNL2 may prevent the ink from spilling over to the emission areas EMA of other neighboring subpixels PXn.

Once the ink is sprayed into the emission area EMA, alignment signals may be applied to each of the electrode lines (RM_A and RM_B) to generate an electric field EL on the electrode lines (RM_A and RM_B). The light-emitting elements ED scattered in the ink may receive an electrophoretic force from the electric field EL so that the locations and the alignment directions of the light-emitting elements ED may change, and as a result, both ends of each of the light-emitting elements ED may be disposed on different electrode lines (RM_A and RM_B). The alignment signals applied to the first and second electrode lines RM_A and RM_B may have different signs (or polarities), and the electric field EL may be formed such that the first end portions of the light-emitting elements ED may face a particular direction. The light-emitting elements ED may be arranged such that the alignment direction of the first end portions thereof may be uniform.

The light-emitting elements ED may be disposed on the electrode lines (RM_A and RM_B), and most of the light-emitting elements ED may be located between adjacent first banks BNL1. The first banks BNL1 may protrude from the top surface of the third interlayer insulating layer IL3, and the region between the adjacent first banks BNL1 may be a region suitable for accommodating the light-emitting elements ED due to the difference in height with respect to the adjacent first banks BNL1. However, some of the light-emitting elements ED (e.g., a light-emitting element ED_R of FIG. 10) may be placed in a region where the first banks BNL1 are not disposed, and may be removed during the separation of the electrode lines (RM_A and RM_B).

Figure 11:
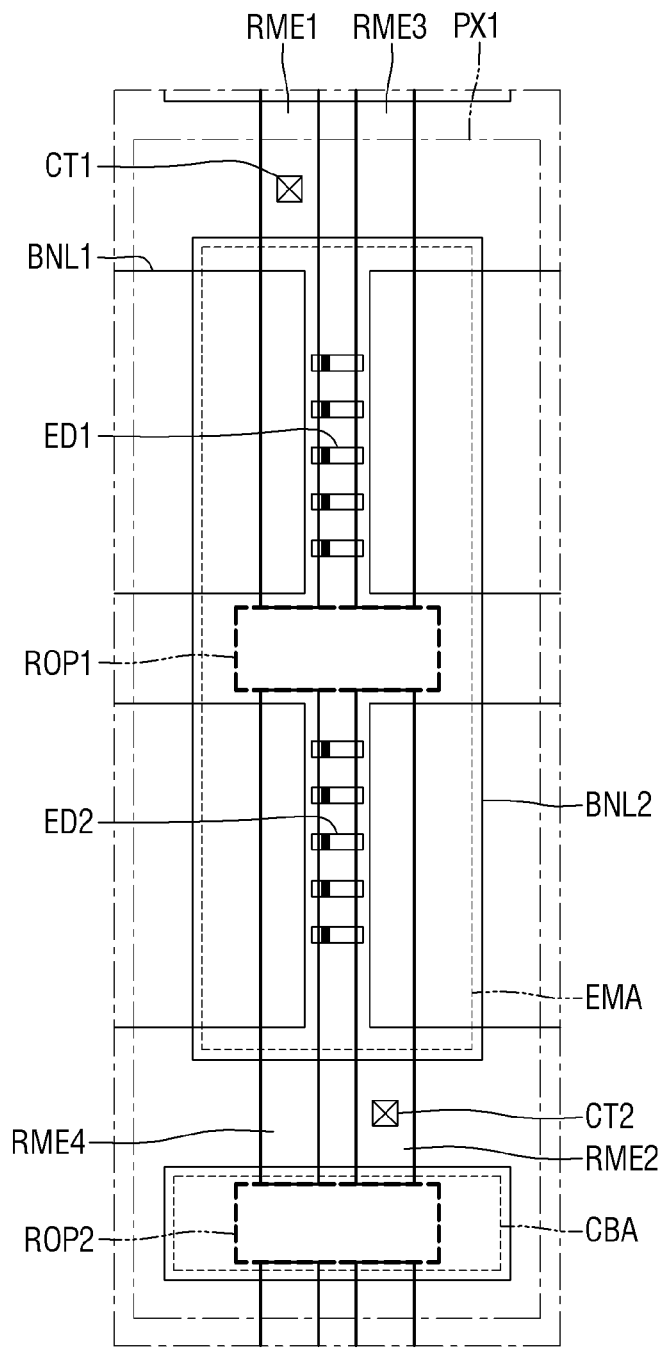
Figure 11:
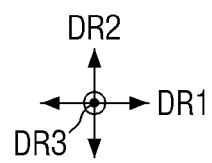

Thereafter, referring to FIG. 11, after the arrangement of the light-emitting elements ED, the electrode lines (RM_A and RM_B) may be separated, thereby forming the electrodes (RME1, RME2, RME3, and RME4). Although not specifically illustrated, the second insulating layer PAS2 may be formed to cover the light-emitting elements ED and the electrode lines (RM_A and RM_B). The second insulating layer PAS2 may not be disposed in the cut area CBA but may be disposed only within the emission area EMA surrounded by the second bank BNL2.

The electrode lines (RM_A and RM_B) may be separated in the emission area EMA and the cut area CBA, thereby forming different types of electrodes, i.e., the first-type electrode RME #1 and the second-type electrodes RME #2. The electrode lines (RM_A and RM_B) may be separated in first and second electrode cut portions ROP1 and ROP2 of the emission area EMA. The first electrode line RM_A may be separated in the first and second electrode cut portions ROP1 and ROP2, thereby forming the first and fourth electrodes RME1 and RME4, and the second electrode line RM_B may be separated in the first and second electrode cut portions ROP1 and ROP2, thereby forming the second and third electrodes RME2 and RME3. The first banks BNL1 may not be disposed in the first electrode cut portion ROP1 but may be spaced from one another in the second direction DR2, so that the electrode lines (RM_A and RM_B) can be separated.

As the electrode lines (RM_A and RM_B) are separated in the first electrode cut portion ROP1, the light-emitting elements ED may be divided into the first light-emitting elements ED1 that are disposed above the first electrode cut portion ROP1, and the second light-emitting elements ED2 that are disposed below the first electrode cut portion ROP1 (e.g., along the second direction DR2). The first light-emitting elements ED1 and the second light-emitting elements ED2 may be connected in series via the second-type contact electrode CNE #2 (e.g., CNE3). The light-emitting element ED_R of FIG. 10, which is disposed in the gap, in the second direction DR2, between the first banks BNL1, may be removed when the electrode lines (RM_A and RM_B) are separated.

As the electrode lines (RM_A and RM_B) are separated in the second electrode cut portion ROP2, signals may be transmitted to the electrodes (RME1, RME2, RME3, and RME4) separately from electrodes (RME1, RME2, RME3, and RME4) of the neighboring subpixels PXn in the second direction DR2. The electrodes (RME1, RME2, RME3, and RME4) may be divided into the first-type electrodes RME #1 that are electrodes where the contact holes (CT1 and CT2) are formed, and the second-type electrodes RME #2 that are electrodes where the contact holes (CT1 and CT2) are not formed. During the fabrication of the display device 10, different types of electrodes, i.e., the first-type electrodes RME #1 and the second-type electrodes RME #2, may be formed by aligning the light-emitting elements ED to be spaced in the second direction DR2 and separating the electrode lines (RM_A and RM_B). Because the electrode lines (RM_A and RM_B) are separated in the first electrode cut portion ROP1 in the emission area EMA, the light-emitting elements ED may be divided and may be connected in series depending on the arrangement of the contact electrodes (CNE1, CNE2, and CNE3).

FIGS. 9 and 10 illustrate that only a pair of electrode lines (RM_A and RM_B) are provided, but the present disclosure is not limited thereto. As the area of each of the subpixels PXn increases, more than two electrode lines (RM_A and RM_B) may be provided in each of the subpixels PXn, and more light-emitting elements ED than there are in the display device 10 of FIGS. 9 and 10 may also be provided in each of the subpixels PXn.

Figure 12:
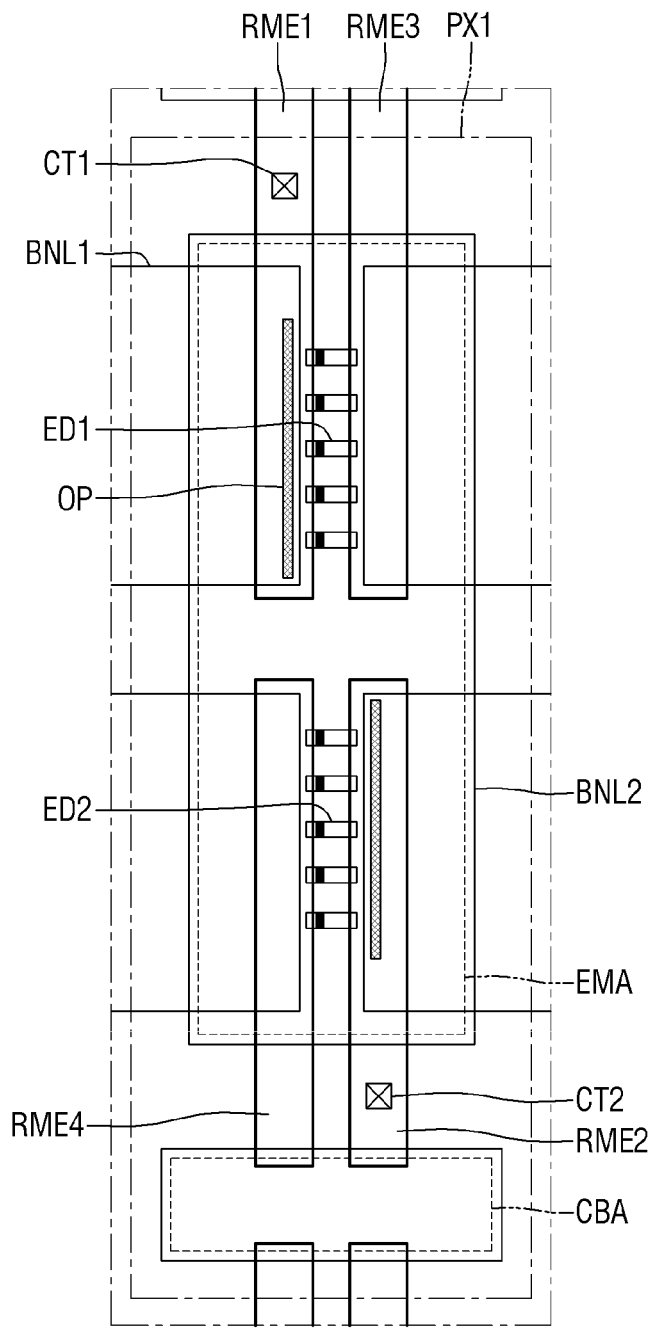
Figure 13:
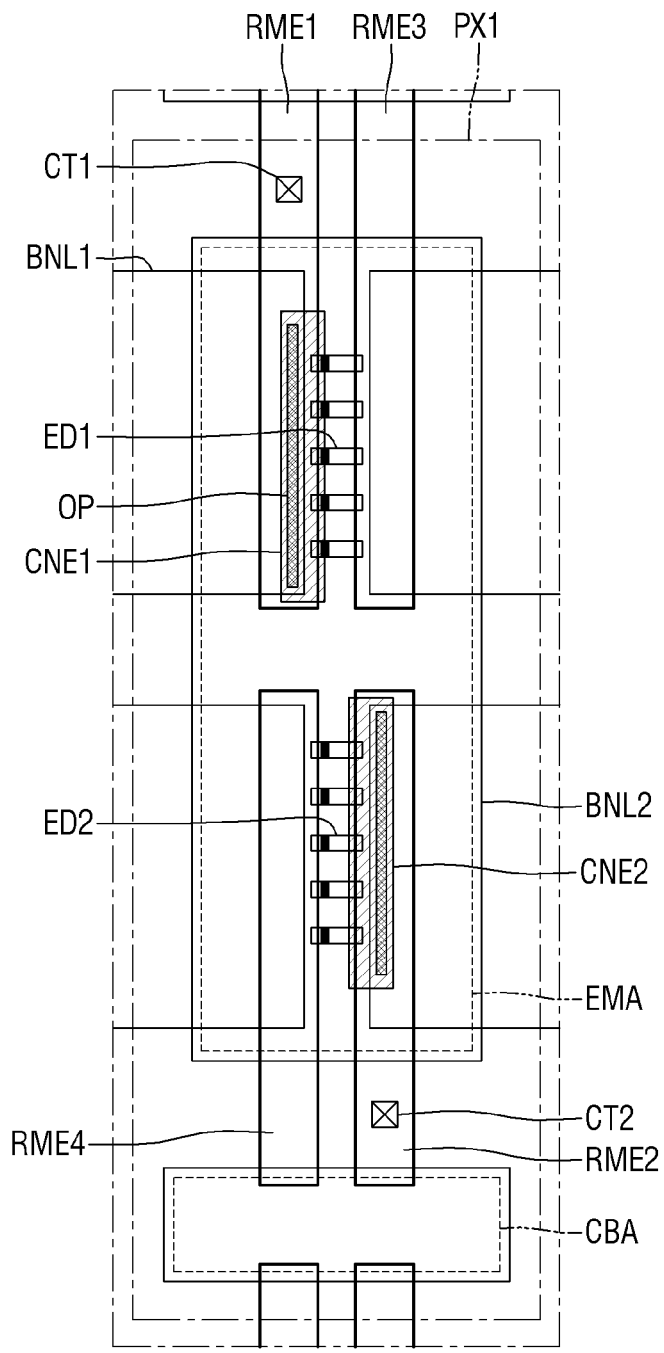
Figure 14:
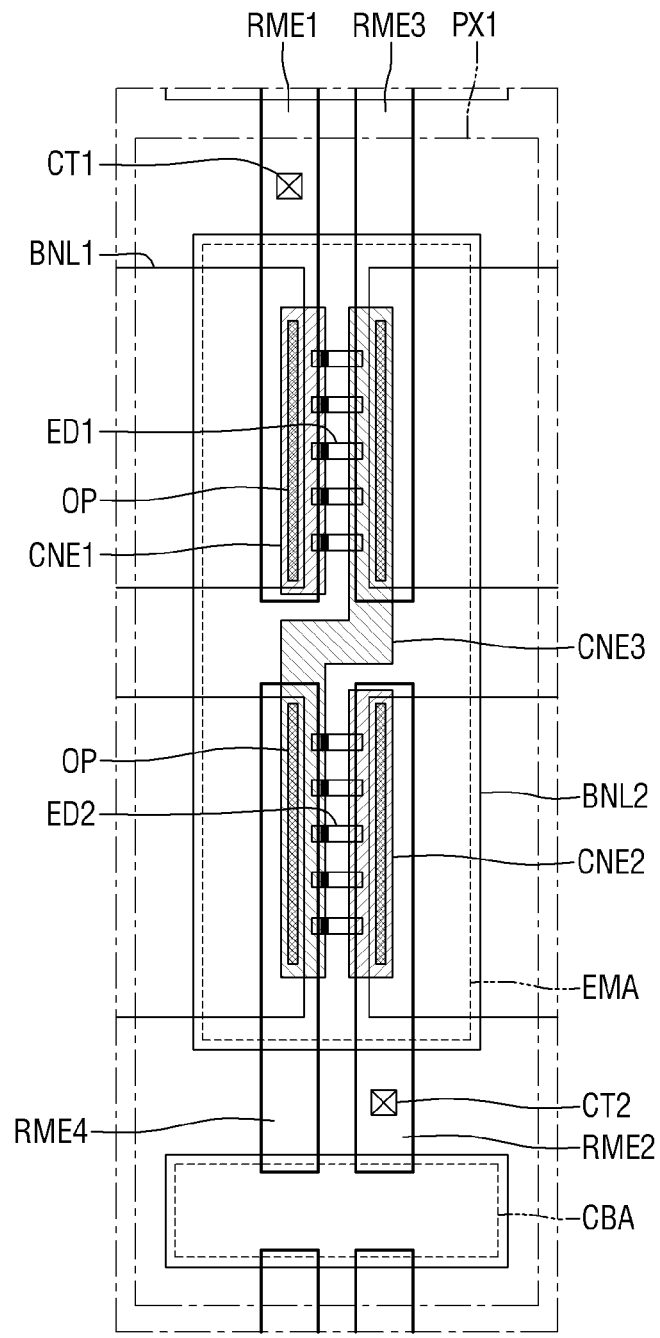

Thereafter, referring to FIGS. 12 through 14, the openings OP, which expose both end portions of each of the light-emitting elements ED and also expose parts of the top surfaces of the electrodes (RME1, RME2, RME3, and RME4), are formed, and the contact electrodes (CNE1, CNE2, and CNE3) are also formed. In one or more example embodiments, openings OP that expose first end portions of the light-emitting elements ED that are disposed on the first-type electrodes RME #1 and also expose parts of the top surfaces of the first-type electrodes RME #1, are formed, and the first and second contact electrodes CNE1 and CNE2, which are first-type contact electrodes CNE #1, are formed. Thereafter, an insulating material layer is formed to cover the first-type contact electrodes CNE #1 and the second insulating layer PAS2. The insulating material layer may be initially disposed on the entire surface of the emission area EMA, and the third insulating layer PAS3 may be formed by partially removing the insulating material layer to expose other end portions of the light-emitting elements ED (e.g., see, FIGS. 5 and 7). Also, by partially removing the insulating material layer, openings OP that expose second end portions of the light-emitting elements ED that are disposed on the second-type electrodes RME #2 (e.g., RME3, RME4) and also expose parts of the top surfaces of the second-type electrodes RME #2 are formed, and the third contact electrode CNE3, which is a second-type contact electrode CNE #2, is formed. The third contact electrode CNE3 may include the contact electrode extensions CN_E1 and CN_E2 and the contact electrode connector CN_B, which are disposed on the third and fourth electrodes RME3 and RME4, and may thus be in contact with both the first light-emitting elements ED1 and the second light-emitting elements ED2. In this manner, the display device 10 including the first light-emitting elements ED1 and the second light-emitting elements ED2, which are connected in series to the first light-emitting elements ED1, can be obtained.

Display devices according to other embodiments of the present disclosure will hereinafter be described.

Figure 15:
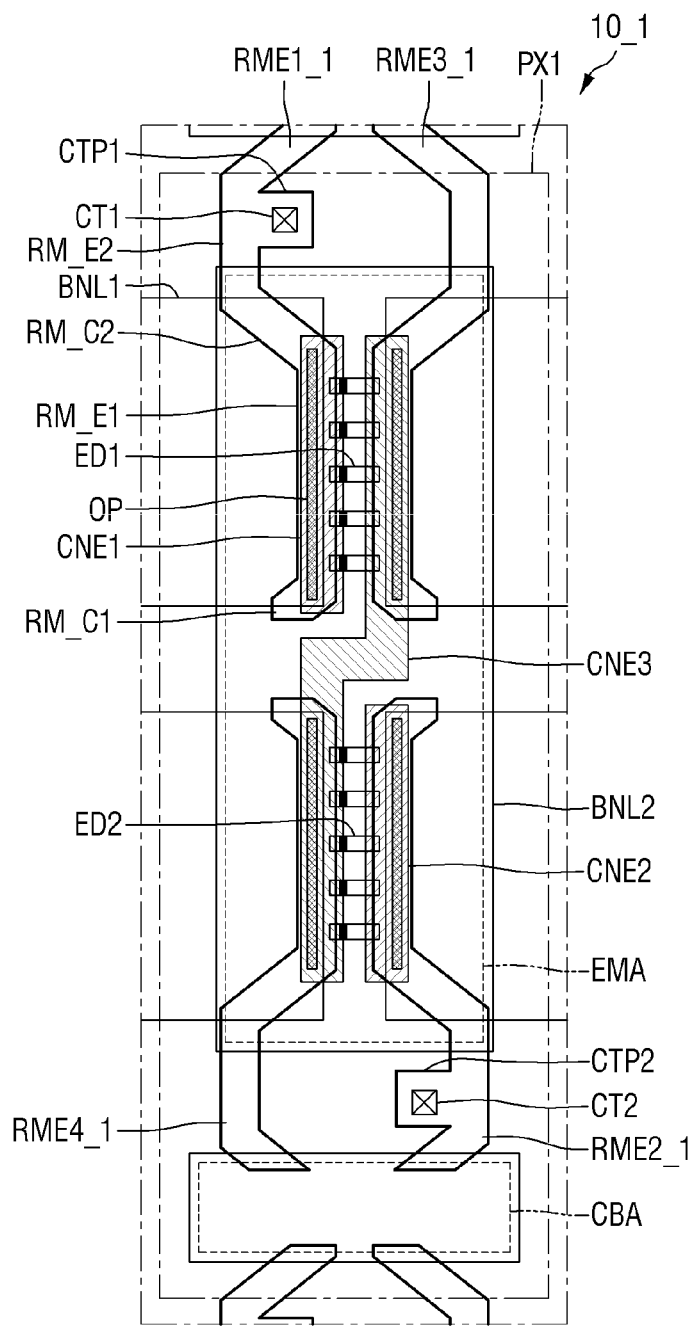
FIG. 15 is a plan view of a subpixel of a display device according to another example embodiment of the present disclosure.

FIG. 15 is a plan view of a subpixel of a display device according to another embodiment of the present disclosure.

Referring to FIG. 15, for example, a display device 10_1 may include in a first subpixel PX1, electrodes (RME1_1, RME2_1, RME3_1, and RME4_1), that are bent in part. Each of the electrodes (RME1_1, RME2_1, RME3_1, and RME4_1) may include electrode extensions (RM_E1 and RM_E2), which extend in one direction, and electrode bent portions (RM_C1 and RM_C2), which extend in different directions from the electrode extensions (RM_E1 and RM_E2). The light-emitting elements ED may be disposed on the electrode extensions (RM_E1 and RM_E2) of each of the electrodes (RME1_1, RME2_1, RME3_1, and RME4_1), which are spaced from one another in a first direction DR1, and the contact electrodes (CNE1, CNE2, and CNE3) may be in contact with the electrode extensions (RM_E1 and RM_E2) of each of the electrodes (RME1_1, RME2_1, RME3_1, and RME4_1). The embodiment of FIG. 15 differs from the embodiment of FIG. 3 in the shape of the electrodes (RME1_1, RME2_1, RME3_1, and RME4_1).

A first electrode RME1_1 may include first and second electrode extensions RM_E1 and RM_E2, and first and second electrode bent portions RM_C1 and RM_C2 that are connected to at least one of the first and second electrode extensions RM_E1 and RM_E2. The first electrode extension RM_E1 of the first electrode RME1_1 may be disposed on one of the first banks BNL1, within an emission area EMA, and the second electrode extension RM_E2 of the first electrode RME1_1 may be disposed in part of the emission area EMA that overlaps with a second bank BNL2. The first electrode bent portion RM_C1 of the first electrode RME1_1 may be connected to one side of the first electrode extension RM_E1 of the first electrode RME1_1 and may be spaced from first electrode bent portions RM_C1 of second, third, and fourth electrodes RME2_1, RME3_1, and RME4_1 in a second direction DR2 and/or in a first direction DR1. The second electrode bent portion RM_C2 of the first electrode RME1_1 may be disposed to connect the first and second electrode extensions RM_E1 and RM_E2 of the first electrode RME1_1. The first and second electrode bent portions RM_C1 and RM_C2 of the first electrode RME1_1 may be bent in a direction between the first and second directions DR1 and DR2, from the center to the outside of the emission area EMA (or from a central area of the emission area EMA towards an outward direction).

The third electrode RME3_1 may be spaced from the first electrode RME1_1 in the first direction DR1. The third electrode RME3_1 may be symmetrical with the first electrode RME1_1 with respect to an imaginary line that extends across the center (or a central region) of the emission area EMA in the second direction DR2. The fourth electrode RME4_1 may be spaced from the first electrode RME1_1 in the second direction DR2. The fourth electrode RME4_1 may be symmetrical with the first electrode RME1_1 with respect to an imaginary line that extends across the center (or a central region) of the emission area EMA in the first direction DR1. Similarly, the second electrode RME2_1 may be symmetrical with the third or fourth electrodes RME3_1 or RME4_1.

The first electrode extensions RM_E1 of the electrodes (RME1_1, RME2_1, RME3_1, and RME4_1) may be spaced from one another along the first direction DR1, and the second electrode extensions RM_E2 of the electrodes (RME1_1, RME2_1, RME3_1, and RME4_1) may be spaced from one another along the first direction DR1. The first electrode extensions RM_E1 of the electrodes (RME1_1, RME2_1, RME3_1, and RME4_1), which are disposed on the first banks BNL1, may be spaced from one another along the first direction D1, and a plurality of light-emitting elements ED may be disposed on the first electrode extensions RM_E1. For example, the first electrode extensions RM_E1 of the first and third electrodes RME1_1 and RME3_1 may be spaced from each other along the first direction DR1, and the distance between the first electrode extensions RM_E1 of the first and third electrodes RME1_1 and RME3_1 may be smaller than the length of the light-emitting elements ED. As the electrodes (RME1_1, RME2_1, RME3_1, and RME4_1) are symmetrical with one another and each have electrode bent portions (RM_C1 and RM_C2), the distance between the electrodes (RME1_1, RME2_1, RME3_1, and RME4_1) may be greater in other areas (i.e. other than areas between the first electrode extensions RM_E1 of the electrodes (RME1_1, RME2_1, RME3_1, and RME4_1)) than in the areas between the first electrode extensions RM_E1 of the electrodes (RME1_1, RME2_1, RME3_1, and RME4_1). Because the first and second electrode bent portions RM_C1 and RM_C2 of the electrodes (RME1_1, RME2_1, RME3_1, and RME4_1) are bent outwardly from the center (or a central region) of the emission area EMA, the distance, in the first direction DR1, between the second electrode extensions RM_E2 of the electrodes (RME1_1, RME2_1, RME3_1, and RME4_1) may be greater than the distance, in the first direction DR1, between the first electrode extensions RM_E1 of the electrodes (RME1_1, RME2_1, RME3_1, and RME4_1). Also, the maximum distance, in the first direction DR1, between the first electrode bent portions RM_C1 of the electrodes (RME1_1, RME2_1, RME3_1, and RME4_1) may be greater than the distance between the first electrode extensions RM_E1 of the electrodes (RME1_1, RME2_1, RME3_1, and RME4_1).

Pairs of electrodes (RME1_1, RME2_1, RME3_1, and RME4_1) spaced from each other in the second direction DR2 may be connected to form electrode lines (RM_A and RM_B) and may be formed by separating the electrode lines (RM_A and RM_B) in a first electrode cut portion ROP1 of the emission area EMA and a second electrode cut portion ROP2 of a cut area CBA. The first electrode bent portions RM_C1 of the electrodes (RME1_1, RME2_1, RME3_1, and RME4_1) may face one another in the second direction DR2 and may be parts of the electrode lines (RM_A and RM_B) that are not cut away and thereby remain in the emission area EMA during the fabrication of the display device 10_1.

The second electrode extensions RM_E2 of the electrodes (RME1_1, RME2_1, RME3_1, and RME4_1) may be formed to be bent inwardly toward the center of the cut area CBA. The second electrode extensions RM_E2 may be parts of the electrode lines (RM_A and RM_B) that are not cut away and thereby remain in the cut area CBA during the fabrication of the display device 10_1.

The first and second electrodes RME1_1 and RME2_1, which are first-type electrodes RME #1, may include electrode contacts (CTP1 and CTP2) that are connected to the second electrode extensions RM_E2 of the first and second electrodes RME1_1 and RME2_1. A first electrode contact CTP1 is formed in the second electrode extension RM_E2 of the first electrode RME1_1, which is disposed above the emission area EMA. The first electrode contact CTP1 may be in contact with a first conductive pattern CDP through a first contact hole CT1. A second electrode contact CTP2 is formed in the second electrode extension RM_E2 of the second electrode RME2_1, which is disposed below the emission area EMA. The second electrode contact CTP2 may be in contact with a second voltage line VL2 through a second contact hole CT2. No electrode contacts (CTP1 and CTP2) may be formed in the third and fourth electrodes RME3_1 and RME4_1, which are second-type electrodes RME #2, and the third and fourth electrodes RME3_1 and RME4_1 may not be connected directly to a second conductive layer.

Contact electrodes (CNE1, CNE2, and CNE3) may be disposed on the first electrode extensions RM_E1 of the electrodes (RME1_1, RME2_1, RME3_1, and RME4_1) and may thus be in contact with the light-emitting elements ED and the electrodes (RME1_1, RME2_1, RME3_1, and RME4_1). The shape and the arrangement of the contact electrodes (CNE1, CNE2, and CNE3) of FIG. 15 are substantially the same as the shape and the arrangement of the contact electrodes (CNE1, CNE2, and CNE3) of FIG. 3. First light-emitting elements ED1, which are disposed on the first electrode extensions of RM_E1 of two different electrodes (RME1_1, RME3_1), and second light-emitting elements ED2, which are disposed on the first electrode extensions of RM_E1 of two other different electrodes (RME2_1 and RME4_1), may be connected in series via the contact electrodes (CNE1, CNE2, and CNE3).

If during the fabrication of the display device 10_1, the electrode lines (RM_A and RM_B) are arranged to be spaced from each other, the light-emitting elements ED may be arranged by an electric field generated between the electrode lines (RM_A and RM_B). The electrode lines (RM_A and RM_B) are separated, in part, in the first electrode cut portion ROP1 after the arrangement of the light-emitting elements ED, in which case, any light-emitting elements ED_R (of FIG. 10) disposed in the first electrode cut portion ROP1 may be removed. Some of the light-emitting elements ED_R may not be completely removed but may be moved to an undesired location to remain as foreign materials in the process of forming the contact electrodes (CNE1, CNE2, and CNE3).

When alignment signals are applied to the electrode lines (RM_A and RM_B) to generate an electric field EL, the electric field EL may become weaker as the distance between the electrode lines (RM_A and RM_B) increases. Particularly, in areas where the distance between the electrode lines (RM_A and RM_B) is small, a strong electric field EL may be generated so that most of the light-emitting elements ED may be arranged in such areas of the electrode lines (RM_A and RM_B).

Because each of the electrode lines (RM_A and RM_B) includes bent portions, the distance between the electrode lines (RM_A and RM_B) may vary from one location to another location, and the light-emitting elements ED may be densely arranged at particular locations where the distance between the electrode lines (RM_A and RM_B) is small. Because almost none of the light-emitting elements ED are disposed in areas where the electrode lines (RM_A and RM_B) are cut away, the number of light-emitting elements ED that may serve as foreign materials in subsequent processes can be reduced or minimized, and an unnecessary waste of light-emitting elements ED sprayed per unit area can be prevented.

Figure 16:
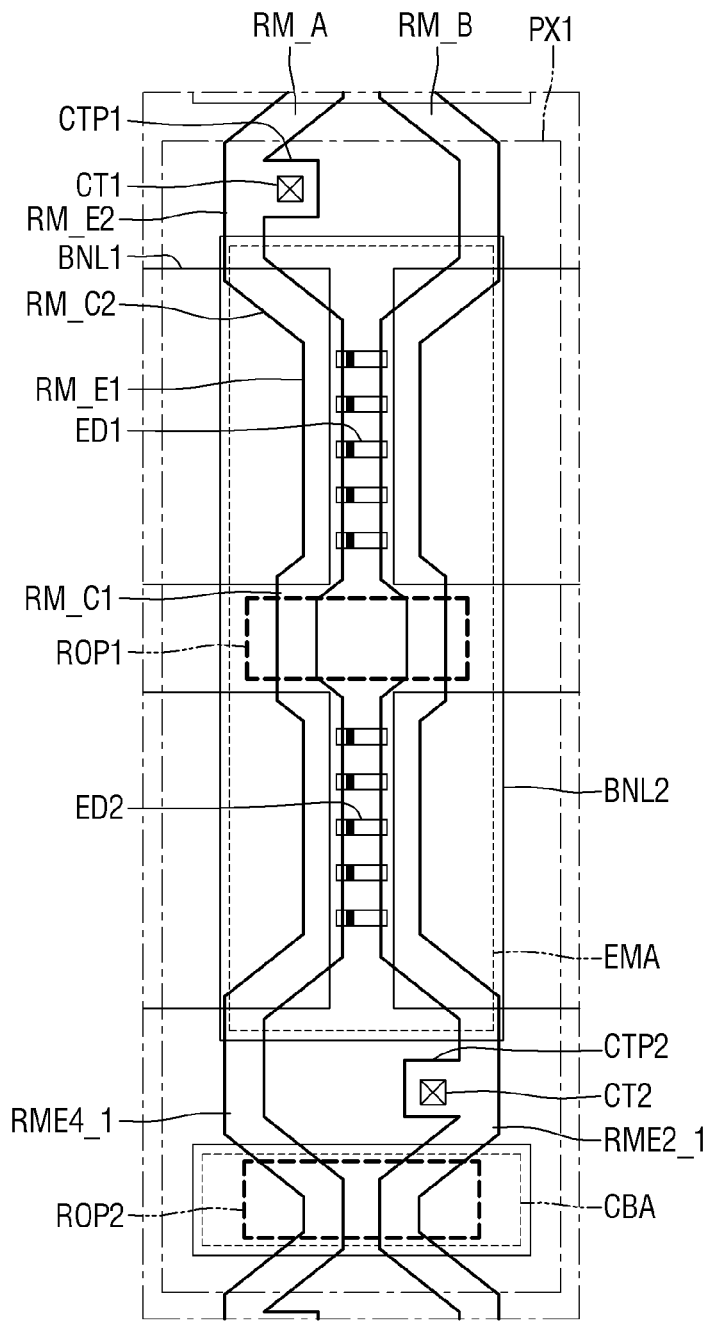
FIG. 16 is a plan view illustrating a process of the fabrication of the display device of FIG. 15.

FIG. 16 is a plan view illustrating a process of the fabrication of the display device of FIG. 15.

Referring to FIG. 16, the electrode lines (RM_A and RM_B) may include the electrode extensions (RM_E1 and RM_E2), which extend in one direction, and the electrode bent portions (RM_C1 and RM_C2), which extend in different directions from the electrode extensions (RM_E1 and RM_E2). The distance, in the first direction DR1, between the first and second electrode lines RM_A and RM_B may differ from one location to another location in the emission area EMA. For example, the distance between parts of the electrode lines (RM_A and RM_B) corresponding to the first electrode extensions RM_E1 of the electrodes (RME1_1, RME2_1, RME3_1, and RME4_1) may be small, and the maximum distance between parts of the electrode lines (RM_A and RM_B) corresponding to the first electrode bent portions RM_C1 of the electrodes (RME1_1, RME2_1, RME3_1, and RME4_1) may be relatively large. Even in a non-emission area or in an area that overlaps with the second bank BNL2, the distance between parts of the electrode lines (RM_A and RM_B) corresponding to the second electrode extensions RM_E2 of the electrodes (RME1_1, RME2_1, RME3_1, and RME4_1) and the maximum distance between parts of the electrode lines (RM_A and RM_B) corresponding to the second electrode bent portions RM_C2 of the electrodes (RME1_1, RME2_1, RME3_1, and RME4_1) may be relatively large.

If ink including the light-emitting elements ED is sprayed into the emission area EMA and alignment signals are applied to the electrode lines (RM_A and RM_B), an electric field EL may be generated on the electrode lines (RM_A and RM_B). Because the distance between the parts of the electrode lines (RM_A and RM_B) corresponding to the first electrode extensions RM_E1 of the electrodes (RME1_1, RME2_1, RME3_1, and RME4_1) is small, a strong electric field EL may be generated. On the contrary, because the maximum distance between the parts of the electrode lines (RM_A and RM_B) corresponding to the first electrode bent portions RM_C1 of the electrodes (RME1_1, RME2_1, RME3_1, and RME4_1) or between the parts of the electrode lines (RM_A and RM_B) corresponding to the second electrode bent portions RM_C2 of the electrodes (RME1_1, RME2_1, RME3_1, and RME4_1) is large, a relatively weak electric field EL may be generated. When the light-emitting elements ED are arranged on the electrode lines (RM_A and RM_B) with their alignment direction and locations changing due to the electric field EL, most of the light-emitting elements ED may be placed on the parts of the electrode lines (RM_A and RM_B) corresponding to the first electrode extensions RM_E1 and the second electrode extensions RM_E2 of the electrodes (RME1_1, RME2_1, RME3_1, and RME4_1), but not on the parts of the electrode lines (RM_A and RM_B) corresponding to the first electrode bent portions RM_C1 of the electrodes (RME1_1, RME2_1, RME3_1, and RME4_1). By designing the electrode lines (RM_A and RM_B) as illustrated in FIG. 16, the light-emitting elements ED can be guided to be densely arranged at particular locations and may not be disposed in the first electrode cut portion ROP1 where the separation of the electrode lines (RM_A and RM_B) is performed. Even if the electrode lines (RM_A and RM_B) are cut in the first electrode cut portion ROP1, the generation of foreign materials by the light-emitting elements ED can be reduced or minimized during the cutting of the electrode lines (RM_A and RM_B) because there are almost no light-emitting elements ED in the first electrode cut portion ROP1.

The distance between parts of the electrode lines (RM_A and RM_B) that are disposed in the cut area CBA may be relatively small, but the ink including the light-emitting elements ED may be sprayed only into the emission area EMA. Thus, even if the electric field EL is generated in the cut area CBA, the light-emitting elements ED may not be disposed in the cut area CBA. There is almost no risk of foreign materials being generated by the light-emitting elements ED in the second electrode cut portion ROP2 where the electrode lines (RM_A and RM_B) are cut to drive the electrodes (RME1_1, RME2_1, RME3_1, and RME4_1) separately. As the electrode lines (RM_A and RM_B) are disposed adjacent to each other, the area of the second electrode cut portion ROP2 can be reduced or minimized, and other elements can be prevented from being damaged in the process of cutting the electrode lines (RM_A and RM_B).

By designing the electrode lines (RM_A and RM_B) and the electrodes (RME1_1, RME2_1, RME3_1, and RME4_1) as illustrated in FIGS. 15 and 16, the light-emitting elements ED can be guided to be densely arranged at particular locations, and the generation of foreign materials by the light-emitting elements ED disposed in the first and second electrode cut portions ROP1 and ROP2 can be prevented during the cutting of the electrode lines (RM_A and RM_B).

In the previous embodiments, two first-type electrodes RME #1, i.e., the first and second electrodes RME1_1 and RME2_1, and two second-type electrodes RME #2, i.e., the third and fourth electrodes RME3_1 and RME4_1, may be disposed in the first subpixel PX1, but the present disclosure is not limited thereto. In some embodiments, the display device 10 may include, in each subpixel PXn, more than two second-type electrodes RME #2 to connect light-emitting elements ED in series, and in each subpixel PXn, a considerable number of light-emitting elements ED may be connected in series.

Figure 17:
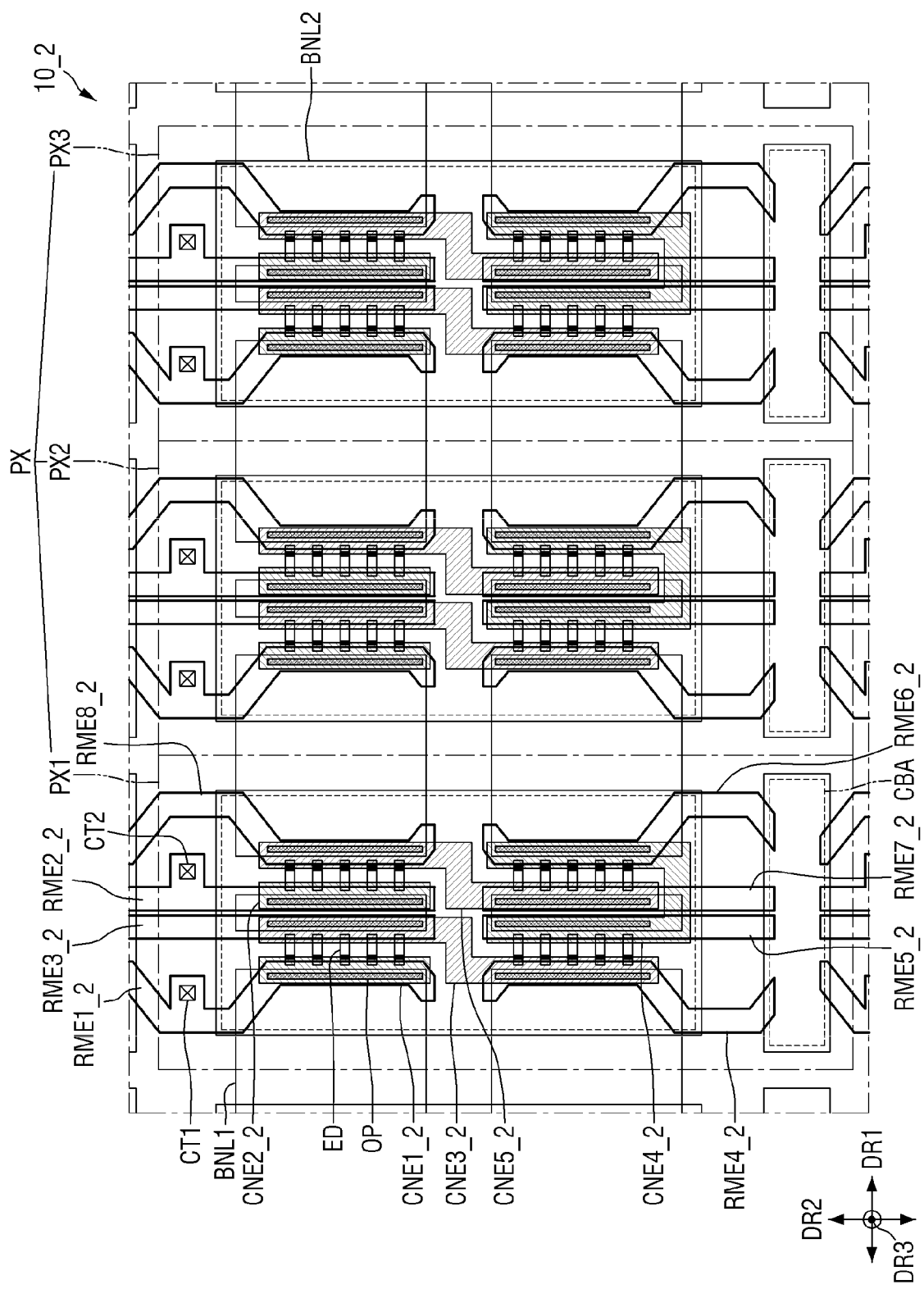
FIG. 17 is a plan view of a pixel of a display device according to another example embodiment of the present disclosure.
Figure 18:
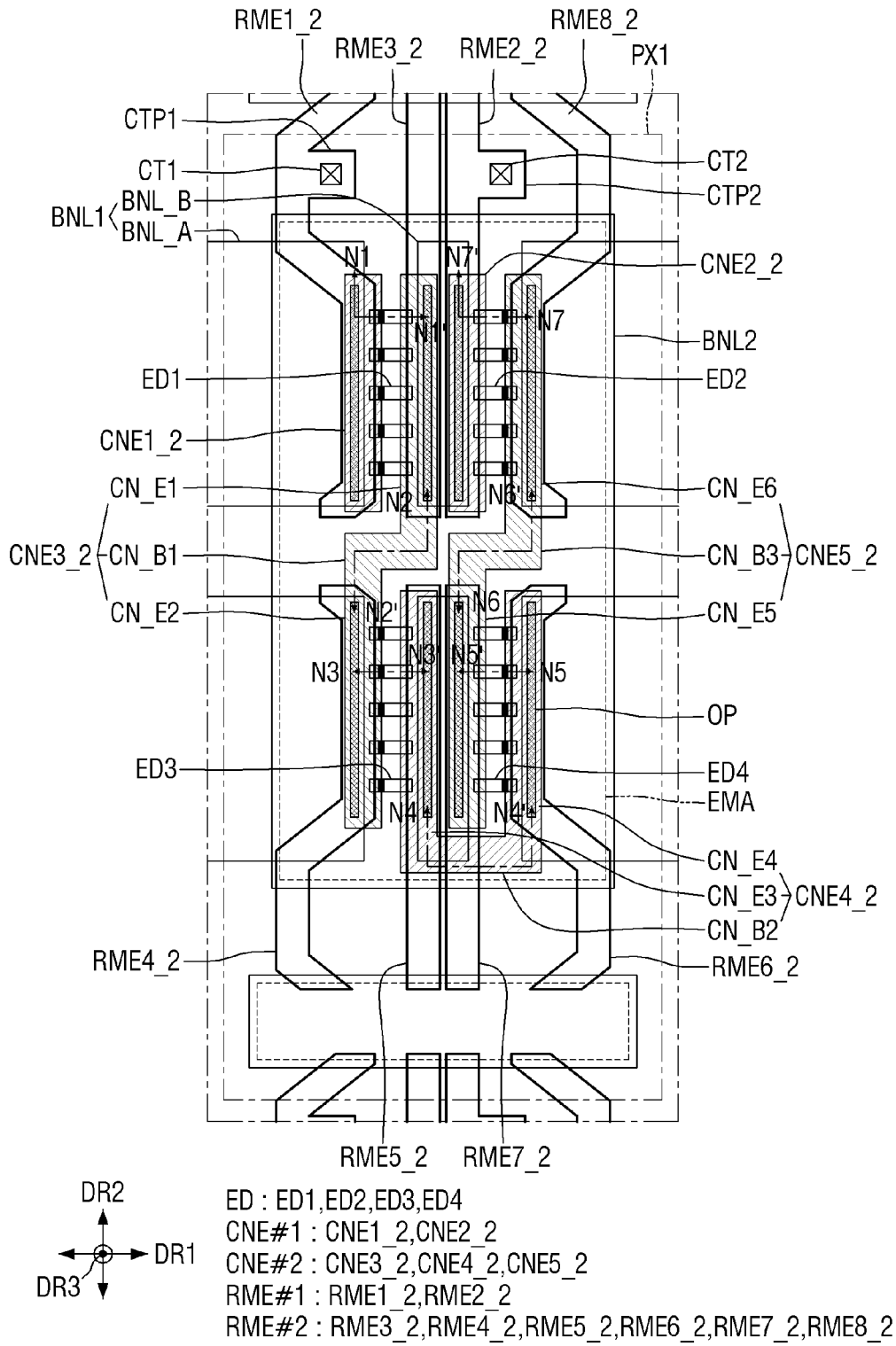
FIG. 18 is a plan view of a first subpixel of FIG. 17.
Figure 19:
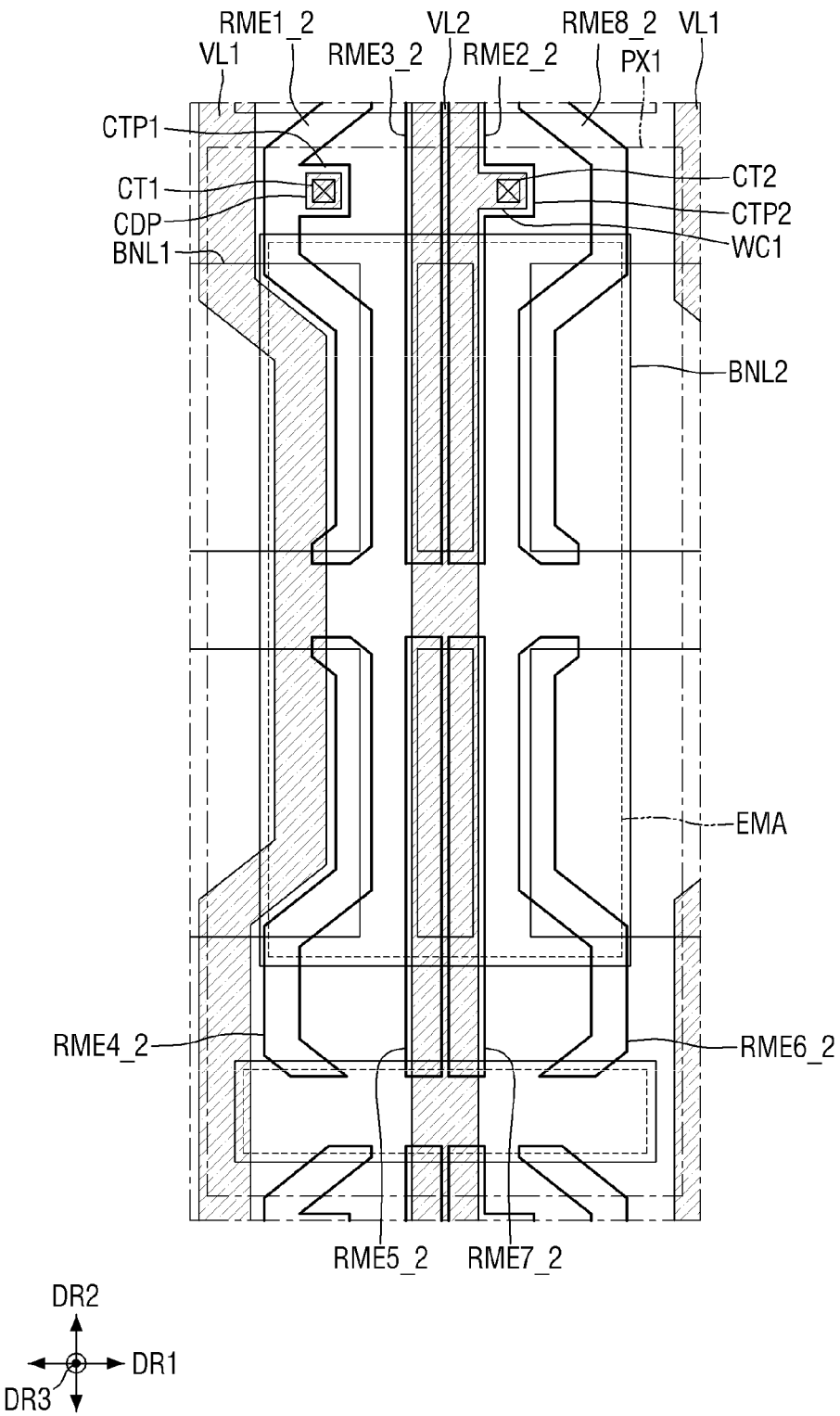
FIG. 19 is a plan view illustrating a schematic arrangement of electrodes and a second conductive layer in a first subpixel of FIG. 17.
Figure 20:
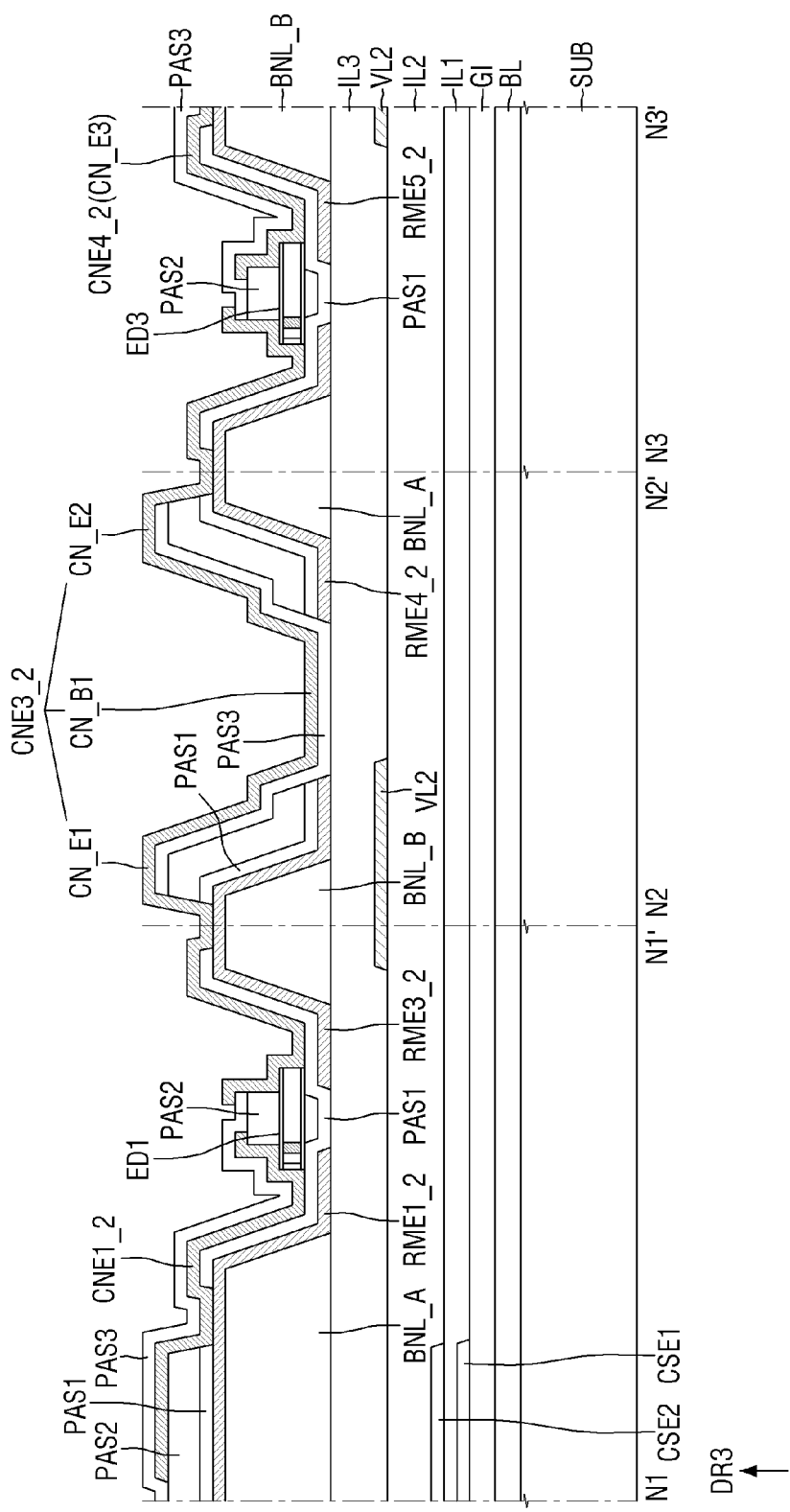
FIG. 20 is a cross-sectional view taken along the lines N1-N1', N2-N2', and N3-N3' of FIG. 18.
Figure 21:
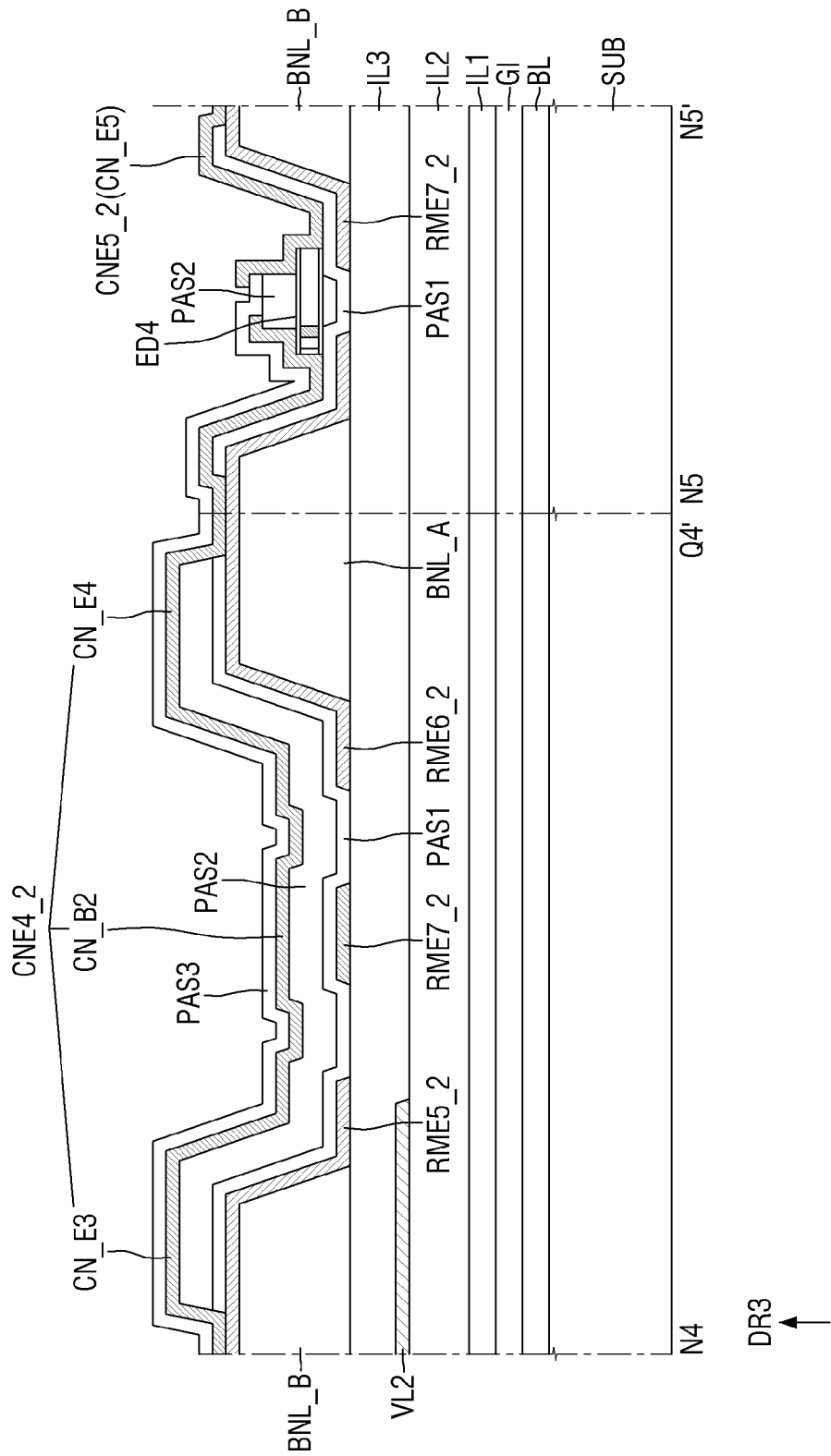
FIG. 21 is a cross-sectional view taken along the lines N4-N4' and N5-N5' of FIG. 18.
Figure 22:
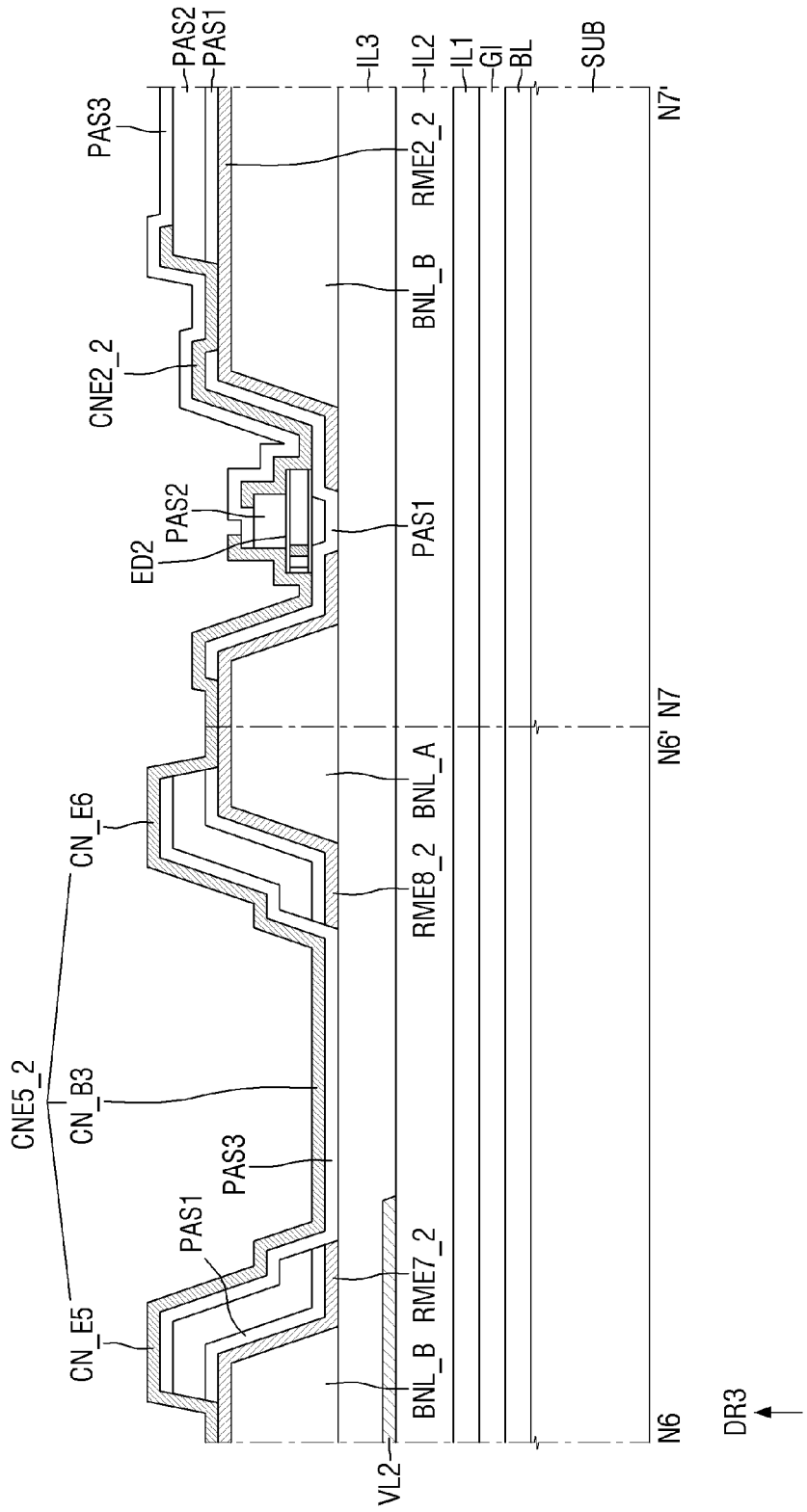
FIG. 22 is a cross-sectional view taken along the lines N6-N6' and N7-N7' of FIG. 18.

FIG. 17 is a plan view of a pixel of a display device according to another embodiment of the present disclosure. FIG. 18 is a plan view of a first subpixel of FIG. 17. FIG. 19 is a plan view illustrating a schematic arrangement of electrodes and a second conductive layer in a first subpixel of FIG. 17. FIG. 20 is a cross-sectional view taken along the lines N1-N1', N2-N2', and N3-N3' of FIG. 18. FIG. 21 is a cross-sectional view taken along the lines N4-N4' and N5-N5' of FIG. 18. FIG. 22 is a cross-sectional view taken along the lines N6-N6' and N7-N7' of FIG. 18. For example, FIG. 18 illustrates a first subpixel PX1 of a pixel PX of FIG. 17, and FIG. 19 illustrates the arrangement of electrodes (RME1_2, RME2_2, RME3_2, RME4_2, RME5_2, RME6_2, RME7_2, and RME8_2) and a second conductive layer in the first subpixel PX1. FIG. 20 illustrates a cross-sectional view taken from one end to the other end of a first light-emitting element ED1, from one end to the other end of a third light-emitting element ED3, and along a third contact electrode CNE3_2, and FIG. 21 illustrates a cross-sectional view taken along a fourth contact electrode CNE4_2 and from one end to the other end of a fourth light-emitting element ED4. FIG. 22 is a cross-sectional view taken along a fifth contact electrode CNE5_2 and from one end to the other end of a second light-emitting element ED2.

Referring to FIGS. 17 through 22, a display device 10_2 may include, in each of subpixels PXn of a pixel PX, for example, in a first subpixel PX1, more electrodes, i.e., a plurality of electrodes (RME1_2, RME2_2, RME3_2, RME4_2, RME5_2, RME6_2, RME7_2, and RME8_2), more light-emitting elements, i.e., a plurality of light-emitting elements (ED1, ED2, ED3, and ED4), and more contact electrodes, i.e., a plurality of contact electrodes (CNE1_2, CNE2_2, CNE3_2, CNE4_2, and CNE5_2), than its counterpart of any one of the previous embodiments.

The electrodes (RME1_2, RME2_2, RME3_2, RME4_2, RME5_2, RME6_2, RME7_2, and RME8_2) may include a pair of first-type electrodes RME #1, i.e., first and second electrodes RME1_2 and RME2_2, and six second-type electrodes RME #2, i.e., third, fourth, fifth, sixth, seventh, and eighth electrodes RME3_2, RME4_2, RME5_2, RME6_2, RME7_2, and RME8_2. Similarly, the contact electrodes (CNE1_2, CNE2_2, CNE3_2, CNE4_2, and CNE5_2) may include a pair of first-type contact electrodes CNE #1, i.e., first and second contact electrodes CNE1_2 and CNE2_2, and three second-type contact electrodes CNE #2, i.e., third, fourth, and fifth contact electrodes CNE3_2, CNE4_2, and CNE5_2. The light-emitting elements ED may include first light-emitting elements ED1 and second light-emitting elements ED2, which have first end portions disposed on the first-type electrodes RME #1 and second end portions disposed on the second-type electrodes RME #2, and third light-emitting elements ED3 and fourth light-emitting elements ED4, which have both first end portions and second end portions disposed on the second-type electrode RME #2.

First banks BNL1 may include first sub-banks BNL_A that are disposed between a pair of adjacent subpixels PXn, and second sub-banks BNL_B that are disposed between the first sub-banks BNL_A. In the middle of an emission area EMA, a plurality of second sub-banks BNL_B, which extend in a second direction DR2 to be spaced from one another in the second direction DR2, may be disposed, and first sub-banks BNL_A may be disposed on both sides of the second sub-banks BNL_B, and spaced from each of the second sub-banks BNL_B in a first direction DR1. The first banks BNL1 of FIGS. 17 through 22 differ from the first banks BNL1 of FIG. 3 in that they further include the second sub-banks BNL_B, which are disposed between the first sub-banks BNL_A that are substantially the same as the first banks BNL1 of FIG. 3 and that are spaced from one another along the first direction DR1.

First and second voltage lines VL1 and VL2 of the second conductive layer may be disposed to extend in the second direction DR2. The first voltage line VL1 may extend in the second direction DR2 and may be bent in part, but the second voltage line VL2 may extend in the second direction DR2 without being bent. The first voltage line VL1, which is part of a second bank BNL2 that extends in the first direction DR1, may extend in the second direction DR2 on a boundary of the first subpixel PX1 and may then be bent in part to be disposed in the emission area EMA.

The second voltage line VL2 may overlap with the second sub-banks BNL_B in a thickness direction and may extend in the second direction DR2. The second voltage line VL2 may include a first wire contact WC1, which protrudes, in the first direction DR1, from part of the second bank BNL2 that extends in the first direction DR1. As will be described later, a second electrode RME2_2, which is a first-type electrode RME #1, may be disposed on one of the second sub-banks BNL_B, and a second electrode contact CTP2 may be formed in the second electrode RME2_2. The first wire contact WC1 of the second voltage line VL2 may overlap with the second electrode contact CTP2 in the thickness direction and may be connected to the second electrode contact CTP2 through a second contact hole CT2.

In the embodiment of FIGS. 17 through 22, like in the embodiment of FIG. 15, each of the first, fourth, sixth, and eighth electrodes RME1_2, RME4_2, RME6_2, and RME8_2 may include electrode extensions (RM_E1 and RM_E2) and electrode bent portions (RM_C1 and RM_C2). On the contrary, the second, third, fifth, and seventh electrodes RME2_2, RME3_2, RME5_2, and RME7_2 may extend in one direction. The first, fourth, sixth, and eighth electrodes RME1_2, RME4_2, RME6_2, and RME8_2 may be disposed on the first sub-banks BNL_A, and the second, third, fifth, and seventh electrodes RME2_2, RME3_2, RME5_2, and RME7_2 may be disposed on the second sub-banks BNL_B. The shape of the electrodes (RME1_2, RME2_2, RME3_2, RME4_2, RME5_2, RME6_2, RME7_2, and RME8_2) is substantially the same as the shape of the electrodes (RME1, RME2, RME3, and RME4) of FIGS. 3 through 15, and thus, the relative arrangement of the electrodes (RME1_2, RME2_2, RME3_2, RME4_2, RME5_2, RME6_2, RME7_2, and RME8_2) will hereinafter be described in detail.

The first electrode RME1_2 may be disposed on the upper left side of the center (or a central region) of the emission area EMA. The first electrode RME1_2 may be disposed on an upper left first sub-bank BNL_A, which is disposed between the first subpixel PX1 and a subpixel PXn on a first side, in the first direction DR1, of the first subpixel PX1. The second electrode RME2_2 may be disposed on a second side, in the first direction DR1, of an upper second sub-bank BNL_B.

The third electrode RME3_2 may be disposed between the first and second electrodes RME1_2 and RME2_2, on a first side, in the first direction DR1, of the upper second sub-bank BNL_B where the second electrode RME2_2 is disposed. The third electrode RME3_2 may be spaced from the first electrode extension of the first electrode RME1_2 and from the second electrode RME2_2, and the first light-emitting elements ED1 may be disposed between the first and third electrodes RME1_2 and RME3_2. The fourth electrode RME4_2 may be symmetrical with the first electrode RME1_2 in the second direction DR2. The fourth electrode RME4_2 may be disposed on a lower left first sub-bank BNL_A on the lower left side of the center (or a central region) of the emission area EMA.

The fifth electrode RME5_2 may be spaced from the third electrode RME3_2 in the second direction DR2 and from the fourth electrode RME4_2 in the first direction DR1. The fifth electrode RME5_2 may be disposed on a first side, in the first direction DR1, of a lower second sub-bank BNL_B. In the gap between the fourth and fifth electrodes RME4_2 and RME5_2, the third light-emitting elements ED3 may be disposed. The sixth electrode RME6_2 may be symmetrical with the fourth electrode RME4_2 in the first direction DR1 and may be disposed on a lower right first sub-bank BNL_A on the lower right side of the center (or a central region) of the emission area EMA.

The seventh electrode RME7_2 may be disposed between the fifth and sixth electrodes RME5_2 and RME6_2 and may be disposed on a second side, in the first direction DR1, of the lower second sub-bank BNL_B where the fifth electrode RME5_2 is disposed. The seventh electrode RME7_2 may be spaced from the first electrode extension of the sixth electrode RME6_2 and from the fifth electrode RME5_2, and in the gap between the sixth and seventh electrodes RME6_2 and RME7_2, the fourth light-emitting elements ED4 may be disposed. The eighth electrode RME8_2 may be symmetrical with the sixth electrode RME6_2 in the second direction DR2. The eighth electrode RME8_2 may be disposed on an upper right first sub-bank BNL_A on the upper right side of the center (or a central region) of the emission area EMA. The eighth electrode RME8_2 may be spaced from the second electrode RME2_2, and the second light-emitting elements ED2 may be disposed on the second and eighth electrodes RME2_2 and RME8_2.

The first, third, second, and eighth electrodes RME1_2, RME3_2, RME2_2, and RME8_2, which are disposed above the center (or a central region) of the emission area EMA, may be spaced, in the second direction DR2, from the fourth, fifth, seventh, and sixth electrodes RME4_2, RME5_2, RME7_2, and RME6_2, respectively, which are disposed below the center (or a central region) of the emission area EMA. The gaps between the first, third, second, and eighth electrodes RME1_2, RME3_2, RME2_2, and RME8_2 and the fourth, fifth, seventh, and sixth electrodes RME4_2, RME5_2, RME7_2, and RME6_2 may be regions (i.e., electrode cut portions (ROP1 and ROP2)) where electrode lines (RM_A and RM_B) are separated. In the embodiment of FIGS. 17 through 22, unlike in the embodiment of FIG. 15, some electrodes may extend in one direction, and other electrodes such as the first electrode RME1_2 may each include electrode extensions and electrode bent portions. Each of the first, fourth, sixth, and eighth electrodes RME1_2, RME4_2, RME6_2, and RME8_2, which are disposed on the first sub-banks BNL_A, may include electrode extensions and electrode bent portions. The second, third, fifth, and seventh electrodes RME2_2, RME3_2, RME5_2, and RME7_2, which are disposed on the second sub-banks BNL_B, may extend in one direction. A pair of adjacent electrodes disposed on the same second sub-bank BNL_B may be spaced from each other in the first direction DR1 with no light-emitting elements ED disposed therebetween. On the contrary, light-emitting elements ED may be disposed on a pair of adjacent electrodes disposed on first and second sub-banks BNL_A and BNL_B. Each of electrodes disposed on the first sub-banks BNL_A may include electrode bent portions, and thus, the distance between the electrodes disposed on the first sub-banks BNL_A and electrodes disposed on the second sub-banks BNL_B may vary from one location to another location. Accordingly, most of the light-emitting elements ED can be arranged in regions between the first sub-banks BNL_A and the second sub-banks BNL_B.

Electrode contacts (CTP1 and CTP2) may be formed in the overlapping areas of the second bank BNL2 and the first-type electrodes RME #1, i.e., the first and second electrodes RME1_2 and RME2_2. The first and second electrodes RME1_2 and RME2_2 may be connected directly to the second conductive layer through a first contact hole CT1 and the second contact hole CT2, respectively. However, the other electrodes, i.e., the second-type electrodes RME #2, may not be connected directly to the second conductive layer.

First and second contact electrodes CNE1_2 and CNE2_2, which are first-type contact electrodes CNE #1, may be disposed on the first and second electrodes RME1_2 and RME2_2, respectively. The first contact electrode CNE1_2 may be disposed on the first electrode extension of the first electrode RME1_2 to be in contact with first end portions of the first light-emitting elements ED1 and with the first electrode RME1_2. The second contact electrode CNE2_2 may be disposed on the second electrode RME2_2 to be in contact with second end portions of the second light-emitting elements ED2 and with the second electrode RME2_2.

The display device 10_2 may include second-type contact electrodes CNE #2, and the second-type contact electrodes CNE #2 may include a third contact electrode CNE3_2 and may further include fourth and fifth contact electrodes CNE4_2 and CNE5_2. The second-type contact electrodes CNE #2 may include contact electrode extensions (CN_E1, CN_E2, CN_E3, CN_E4, CN_E5, and CN_E6) and contact electrode connectors (CN_B1, CN_B2 and CN_B3) and may be disposed on the second-type electrodes RME #2.

For example, a first contact electrode extension CN_E1 of the third contact electrode CNE3_2 may be disposed on the third electrode RME3_2, a second contact electrode extension CN_E2 of the third contact electrode CNE3_2 may be disposed on the fourth electrode RME4_2, and a first contact electrode connector CN_B1 of the third contact electrode CNE3_2 may be disposed in the gap between the first and fourth electrode RME1_2 and RME4_2 in the second direction DR2. The third contact electrode CNE3_2 may be in contact with second end portions of the first light-emitting elements ED1 and first end portions of the third light-emitting elements ED3 and may also be in contact with the third and fourth electrodes RME3_2 and RME4_2. For example, a third contact electrode extension CN_E3 of the fourth contact electrode CNE4_2 may be disposed on the fifth electrode RME5_2, a fourth contact electrode extension CN_E4 of the fourth contact electrode CNE4_2 may be disposed on the sixth electrode RME6_2, and a second contact electrode connector CN_B2 of the fourth contact electrode CNE4_2 may be disposed in the regions between the third contact electrode extension CN_E3, the fourth contact electrode extension CN_E4, and the second bank BNL2. The fourth contact electrode CNE4_2 may be in contact with second end portions of the third light-emitting elements ED3 and with first end portions of the fourth light-emitting elements ED4 and may also be in contact with the fifth and sixth electrodes RME5_2 and RME6_2. A fifth contact electrode extension CN_E5 of the fifth contact electrode CNE5_2 may be disposed on the seventh electrode RME7_2, a sixth contact electrode extension CN_E6 of the fifth contact electrode CNE5_2 may be disposed on the eighth electrode RME8_2, and a third contact electrode connector CN_B3 of the fifth contact electrode CNE5_2 may be disposed in the gap, in the second direction DR2, between the sixth and eighth electrodes RME6_2 and RME8_2. The fifth contact electrode CNE5_2 may be in contact with second end portions of the fourth light-emitting elements ED4 and with first end portions of the second light-emitting elements ED2 and may also be in contact with the seventh and eighth electrodes RME7_2 and RME8_2. The second contact electrode connector CN_B2, unlike the first and third contact electrode connectors CN_B1 and CN_B3, may be disposed between the seventh electrode RME7_2 and the second bank BNL2. The second contact electrode connector CN_B2 may be disposed on a first side, in the second direction DR2, of the seventh electrode RME7_2 to be spaced from the seventh electrode RME7_2, and the third contact electrode connector CN_B3 may be disposed on a second side, in the second direction DR2, of the seventh electrode RME7_2 to be spaced from the seventh electrode RME7_2.

The first end portions of the first light-emitting elements ED1 and the second end portions of the second light-emitting elements ED2 may be electrically connected to the first-type electrodes RME #1 via the first-type contact electrodes CNE #1 and may receive electrical signals applied from the second conductive layer. The electrical signals may flow through the second-type contact electrodes CNE #2, the third light-emitting elements ED3, and the fourth light-emitting elements ED4, and the first light-emitting elements ED1, the second light-emitting elements ED2, the third light-emitting elements ED3, and the fourth light-emitting elements ED4 may be connected in series.

As already described above, the display device 10_2 can be fabricated by aligning the light-emitting elements ED with the use of a plurality of electrode lines (RM_A and RM_B) and separating the electrode lines (RM_A and RM_B) to form the electrodes (RME1_2, RME2_2, RME3_2, RME4_2, RME5_2, RME6_2, RME7_2, and RME8_2).

Figure 23:
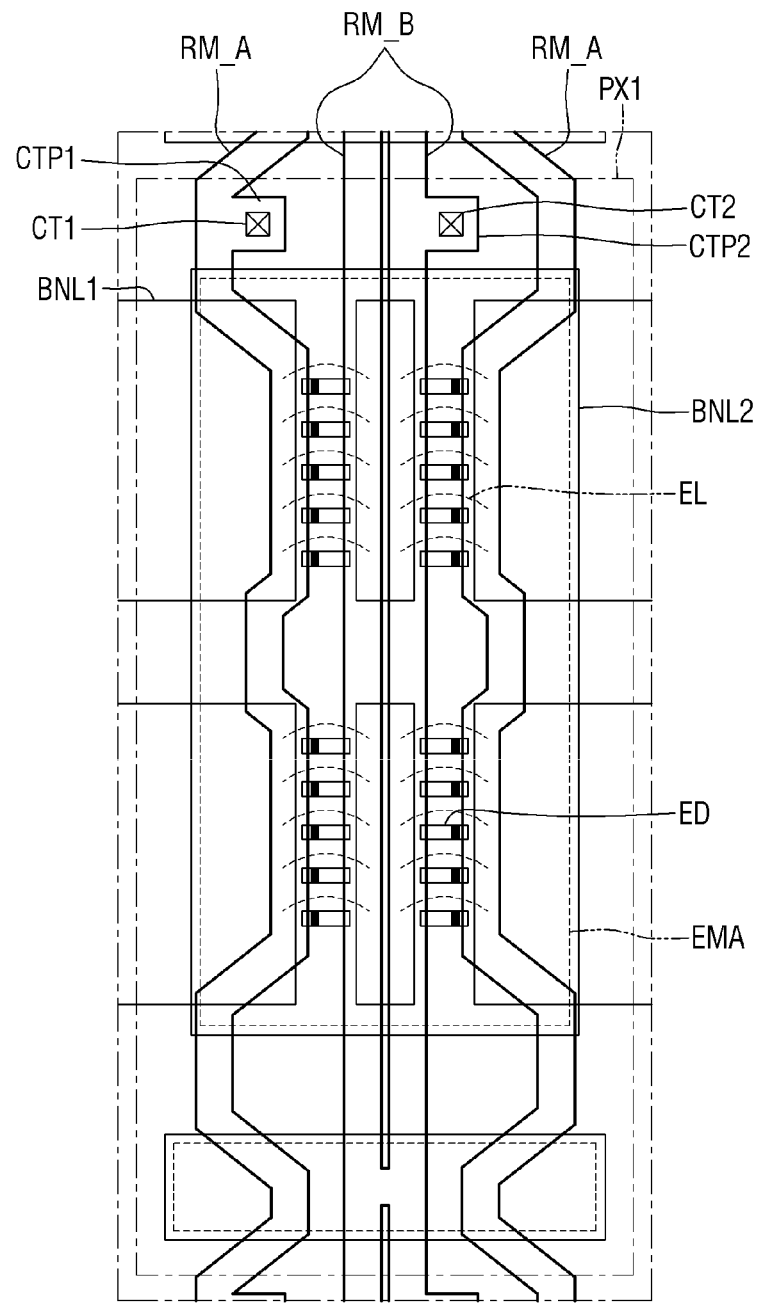
FIGS. 23 and 24 are plan views illustrating processes of the fabrication of the display device of FIG. 17.
Figure 24:
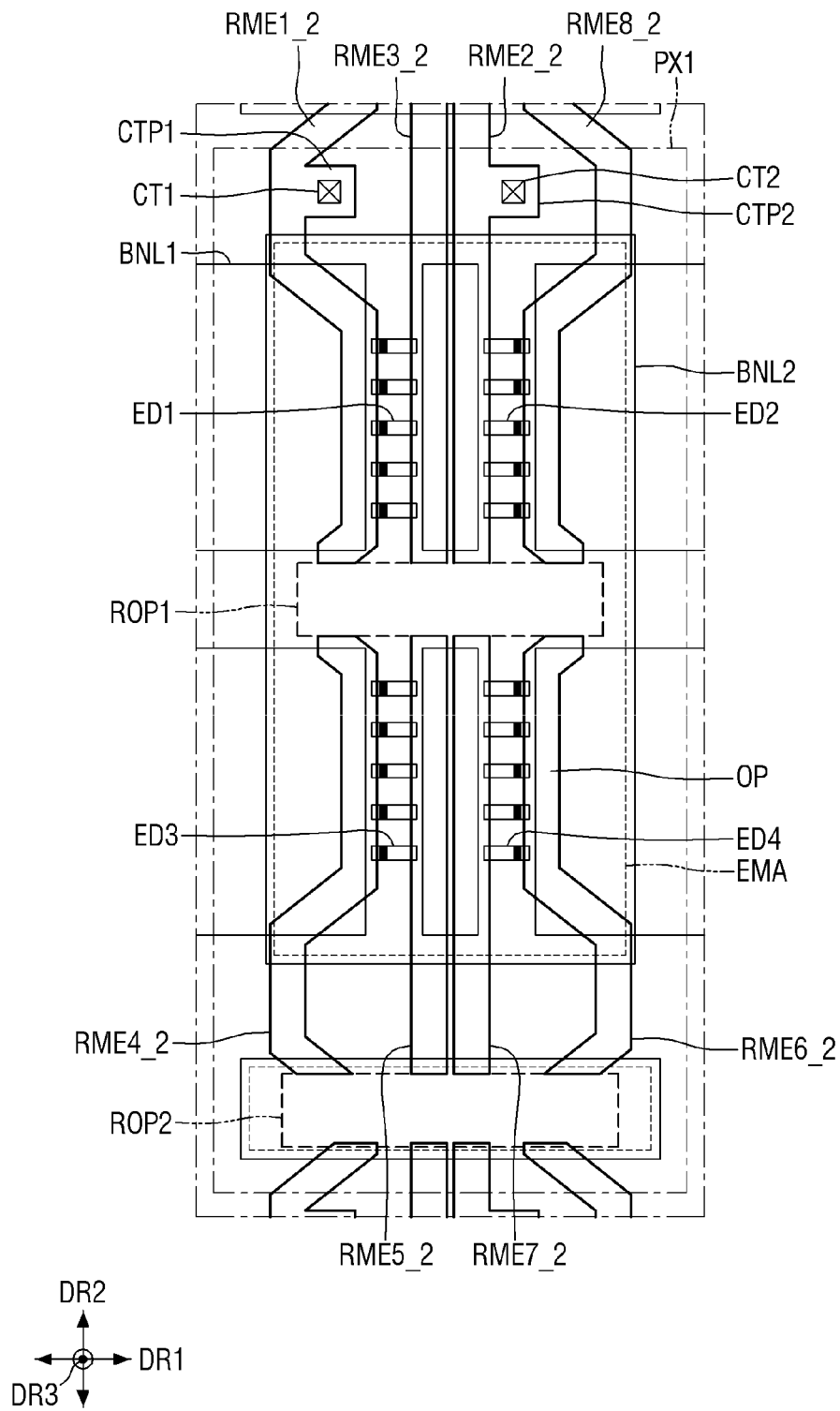

FIGS. 23 and 24 are plan views illustrating processes of the fabrication of the display device of FIG. 17.

Referring to FIGS. 23 and 24, a plurality of electrode lines (RM_A and RM_B) may be to extend in the second direction DR2 across the boundaries of the first subpixel PX1. A plurality of first electrode lines RM_A may be disposed in the first subpixel PX1, and a plurality of second electrode lines RM_B may be disposed between the first electrode lines RM_A. For example, two first electrode lines RM_A may be disposed in the first subpixel PXn to be spaced from each other in the first direction DR1, and two second electrode lines RM_B may be disposed between the two first electrode lines RM_A. Parts of the first electrode lines RM_A may be disposed on the first sub-banks BNL_A, and the second electrode lines RM_B may be disposed on both sides, in the first direction DR1, of the second sub-bank BNL_B.

The second electrode lines RM_B may be connected directly to each other in a cut area CBA. If the second electrode lines RM_B are separate from each other, voltage differences may arise even if alignment signals of the same type are applied to the second electrode lines RM_B. Due to these voltage differences, some of the light-emitting elements ED may be disposed between the second electrode lines RM_B. To prevent this, the second electrode lines RM_B may be connected in the cut area CBA, and an electric field EL may be generated between the first electrode lines RM_A and the second electrode lines RM_B.

Each of the first electrode lines RM_A may include electrode extensions and electrode bent portions, but the second electrode lines RM_B may simply extend in the second direction DR2. The distance between the first electrode lines RM_A and the second electrode lines RM_B may be smaller on the first sub-banks BNL_A than in the gaps, in the second direction DR2, between the first sub-banks BNL_A. Once the electric field EL is generated, a strong electric field EL may be generated in regions where the distance between the electrode lines (RM_A and RM_B) is relatively small, and most of the light-emitting elements ED may be placed in such regions.

Once the light-emitting elements ED are placed, the electrode lines (RM_A and RM_B) are separated in the electrode cut portions (ROP1 and ROP2) of the emission area EMA and the cut area CBA. A first electrode cut portion ROP1 may be located in part of the emission area EMA where the first banks BNL1 are spaced from one another in the second direction DR2. Because the distance between the first electrode lines RM_A and the second electrode lines RM_B is relatively large in the gaps, in the second direction DR2, between the first banks BNL1, only a weak electric field EL may be generated in the gaps, in the second direction DR2, between the first banks BNL1 so that almost no light-emitting elements ED may be disposed in the gaps, in the second direction DR2, between the first banks BNL1.

A second electrode cut portion ROP2 may be disposed in the cut area CBA. Once the electrode lines (RM_A and RM_B) are separated in the second electrode cut portion ROP2, the electrodes (RME1_2, RME2_2, RME3_2, RME4_2, RME5_2, RME6_2, RME7_2, and RME8_2) may be separated from one another and may thus be able to be driven separately. The electrodes (RME1_2, RME2_2, RME3_2, RME4_2, RME5_2, RME6_2, RME7_2, and RME8_2), which are separate from one another in the electrode cut portions (ROP1 and ROP2), include the first-type electrodes RME #1 and the second-type electrodes RME #2, and the light-emitting elements ED may be classified into the first light-emitting elements ED1, the second light-emitting elements ED2, the third light-emitting elements ED3, and the fourth light-emitting elements ED4.

As the second electrode lines RM_B are arranged between the first electrode lines RM_A, the first end portions of the light-emitting elements ED arranged in the emission area EMA may face different directions. For example, the electric field EL may be generated in a direction from the first electrode lines RM_A to the second electrode lines RM_B or in a direction from the second electrode lines RM_B to the first electrode lines RM_A. The light-emitting elements ED may be aligned such that the first or second end portions thereof may face the same direction as the electric field EL. Because the first electrode lines RM_A are disposed on both sides of the second electrode lines RM_B that are connected to each other, electric fields EL may be generated in opposite directions on both sides of the second electrode lines RM_B, in the emission area EMA. Accordingly, the first end portions of light-emitting elements ED on a first side, in the first direction DR1, of the second electrode lines RM_B and the first end portions of light-emitting elements ED on a second side, in the first direction DR1, of the second electrode lines RM_B may face opposite directions. For example, the first end portions of the first light-emitting elements ED1 and the first end portions of the third light-emitting elements ED3 may face the first side, in the first direction DR1, of the second electrode lines RM_B, and the first end portions of the second light-emitting elements ED2 and the first end portions of the fourth light-emitting elements ED4 may face the second side, in the first direction DR1, of the second light-emitting elements ED2. The first end portions and the second end portions of different light-emitting elements ED may be connected in series via the second-type contact electrodes CNE #2.

Thereafter, although not specifically illustrated, openings OP, which expose parts of the top surfaces of the electrodes (RME1_2, RME2_2, RME3_2, RME4_2, RME5_2, RME6_2, RME7_2, and RME8_2), and the contact electrodes (CNE1_2, CNE2_2, and CNE3_2) may be formed, thereby obtaining the display device 10_2.

Because the display device 10_2 includes the first, fourth, sixth, and eighth electrodes RME1_2, RME4_2, RME6_2, and RME8_2, which are bent in part, and the second, third, fifth, and seventh electrodes RME2_2, RME3_2, RME5_2, and RME7_2, which are disposed between the first, fourth, sixth, and eighth electrodes RME1_2, RME4_2, RME6_2, and RME8_2 and simply extend without being bent, a considerable number of light-emitting elements ED can be arranged in the first subpixel PX1. Because the first banks BNL1 include not only the first sub-banks BNL_A, but also the second sub-banks BNL_B, which are disposed between the first sub-banks BNL_A, areas in which to form the electrodes (RME1_2, RME2_2, RME3_2, RME4_2, RME5_2, RME6_2, RME7_2, and RME8_2) and the light-emitting elements ED can be formed. Because a considerable number of electrodes (RME1_2, RME2_2, RME3_2, RME4_2, RME5_2, RME6_2, RME7_2, and RME8_2) are arranged in the first subpixel PX1, the width, in the first direction DR1, of the emission area EMA may be increased. However, as some the electrodes (RME1_2, RME2_2, RME3_2, RME4_2, RME5_2, RME6_2, RME7_2, and RME8_2) are spaced from one another in the second direction DR2 in the emission area EMA, current paths can be formed via the second-type contact electrodes CNE #2. Because some of the light-emitting elements ED arranged along the second direction DR2 can be connected in series via the second-type contact electrodes CNE #2, the luminance of each subpixel PXn can be further improved. Also, as the number of light-emitting elements ED connected in series increases, at least some of the light-emitting elements ED are still able to emit light, even if some of the light-emitting elements ED are disconnected. Thus, any emission defect in each subpixel PXn can be prevented.

As already described above, the display device 10_2 can be fabricated by aligning the light-emitting elements ED with the use of the electrode lines (RM_A and RM_B) and separating some of the electrode lines (RM_A and RM_B) to form the electrodes (RME1_2, RME2_2, RME3_2, RME4_2, RME5_2, RME6_2, RME7_2, and RME8_2). The electrode lines (RM_A and RM_B) may extend in the second direction DR2 across multiple subpixels PXn. An electric field EL may be generated in an array of subpixels PXn arranged along the second direction DR2 by the same electrode lines (RM_A and RM_B).

The electrode cut portions (ROP1 and ROP2) are required to have a sufficient size to prevent damage to the light-emitting elements ED or the electrodes (RME1_2, RME2_2, RME3_2, RME4_2, RME5_2, RME6_2, RME7_2, and RME8_2) when the separation of electrode lines (RM_A and RM_B) is being performed after the alignment of the light-emitting elements ED. As the size of the electrode cut portions (ROP1 and ROP2) increases to properly separate the electrode lines (RM_A and RM_B), the size of the area in which to arrange the light-emitting elements ED may be reduced in the emission area EMA.

The display device 10_2 may include some of the electrodes (RME1_2, RME2_2, RME3_2, RME4_2, RME5_2, RME6_2, RME7_2, and RME8_2), that are spaced from one another in the second direction DR2 in the emission area EMA, and the electrode lines (RM_A and RM_B) may be formed to be separated in the process of aligning the light-emitting elements ED. The electrode lines (RM_A and RM_B) may all be electrically connected to the second conductive layer, and alignment signals may be applied to the electrode lines (RM_A and RM_B) via the second conductive layer. In this case, the first-type electrodes RME #1 and the second-type electrodes RME #2 can be formed simply by separating parts of the electrode lines (RM_A and RM_B) that are connected to the second conductive layer, after the alignment of the light-emitting elements ED, and thus, the size of the electrode cut portions (ROP1 and ROP2) can be reduced or minimized. As a result, a sufficient area in which to arrange the light-emitting elements ED can be secured in the emission area EMA so that the luminance of each subpixel PXn can be further improved.

Figure 25:
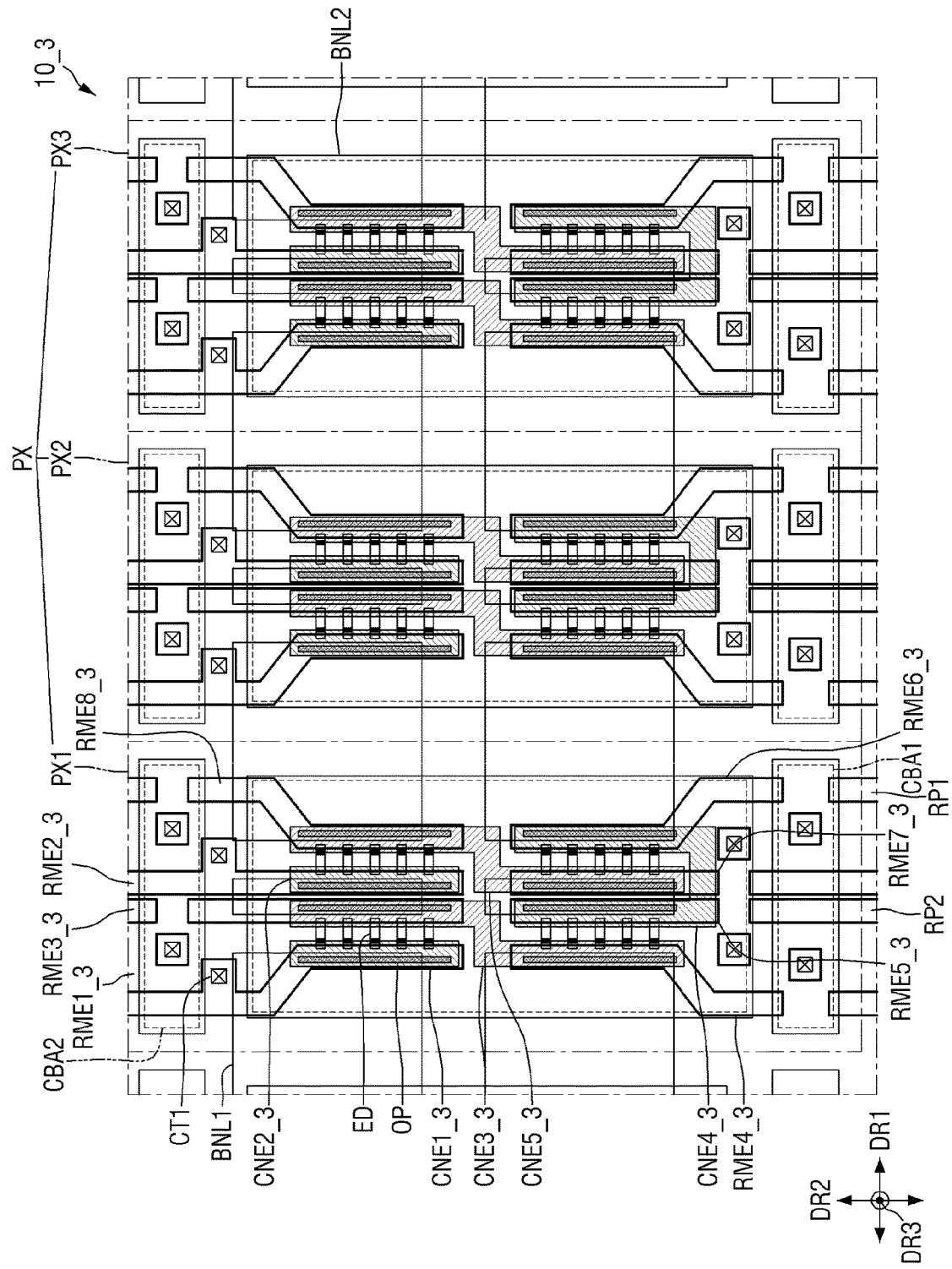
FIG. 25 is a plan view of a pixel of a display device according to another example embodiment of the present disclosure.
Figure 26:
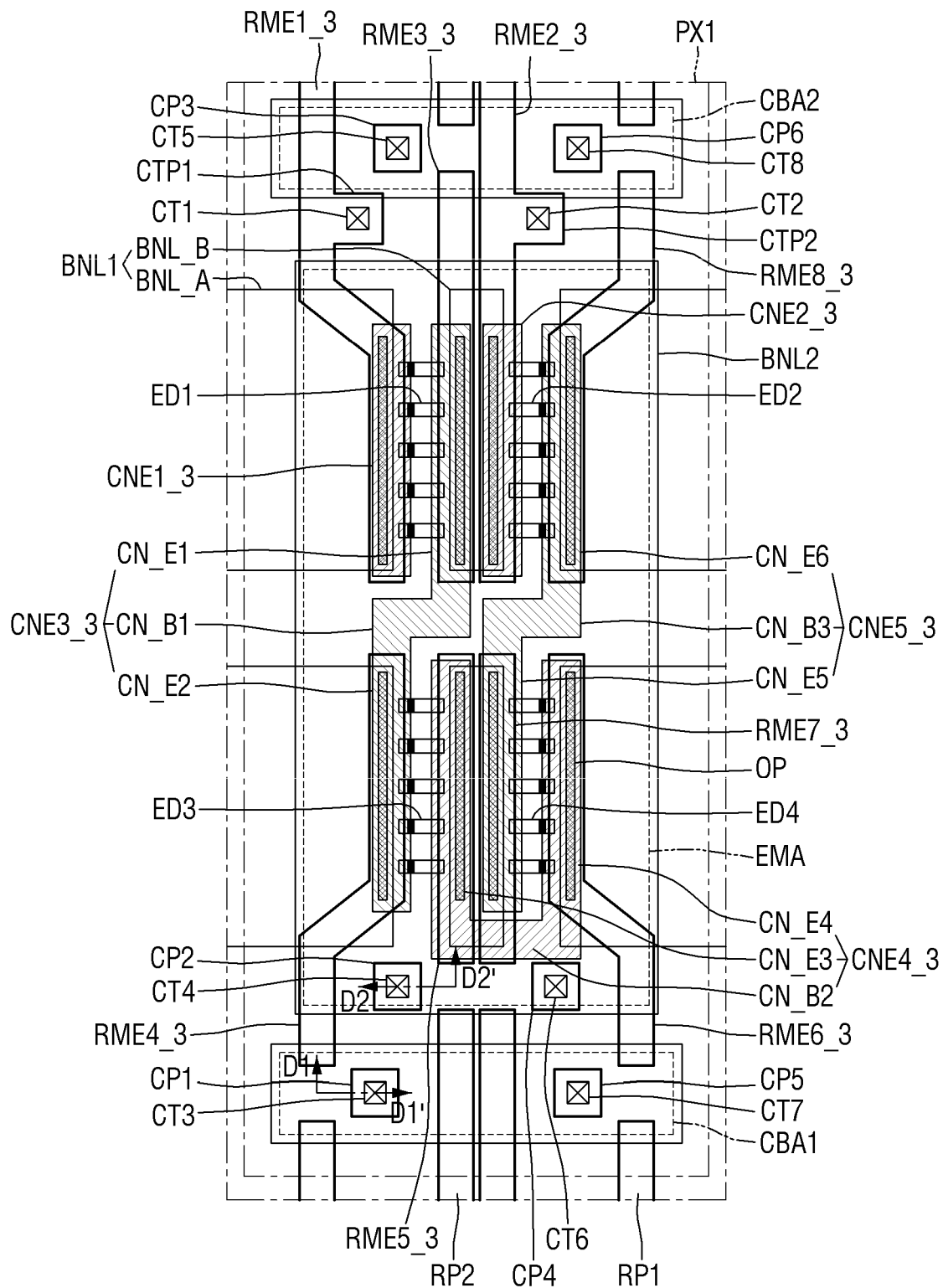
FIG. 26 is a plan view of a first subpixel of FIG. 25.
Figure 27:
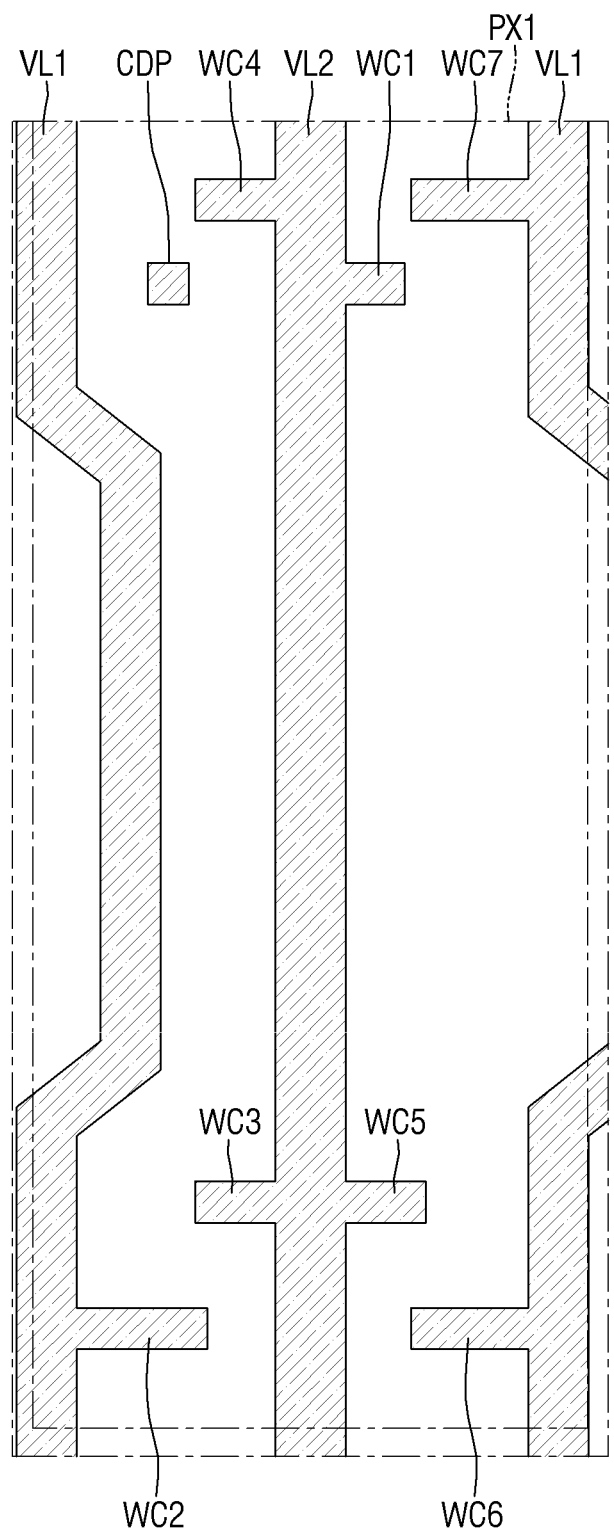
FIG. 27 is a plan view illustrating a schematic arrangement of a second conductive layer in the first subpixel of FIG. 25.
Figure 28:
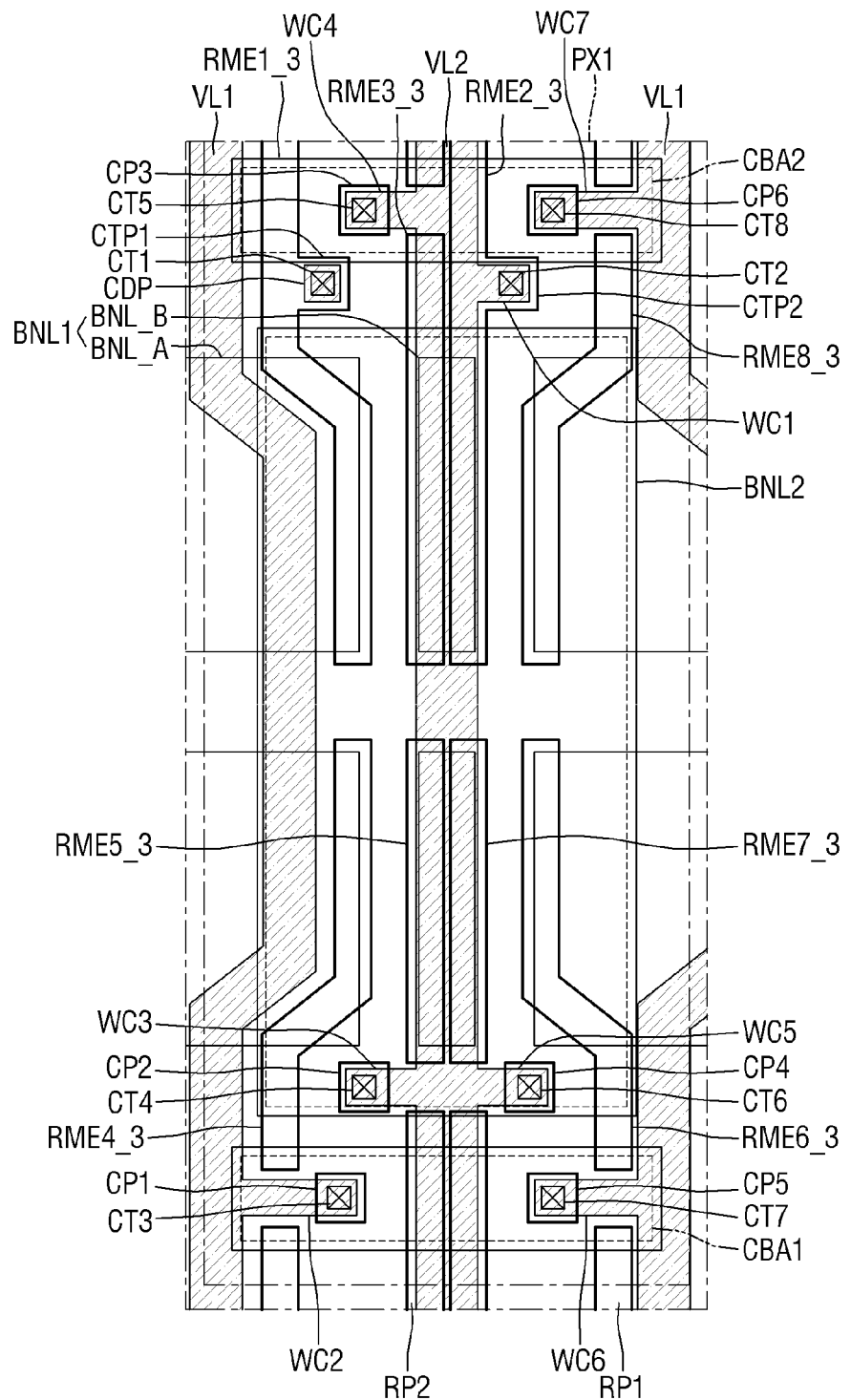
FIG. 28 is a plan view illustrating a schematic arrangement of electrodes and the second conductive layer in the first subpixel of FIG. 25.
Figure 29:
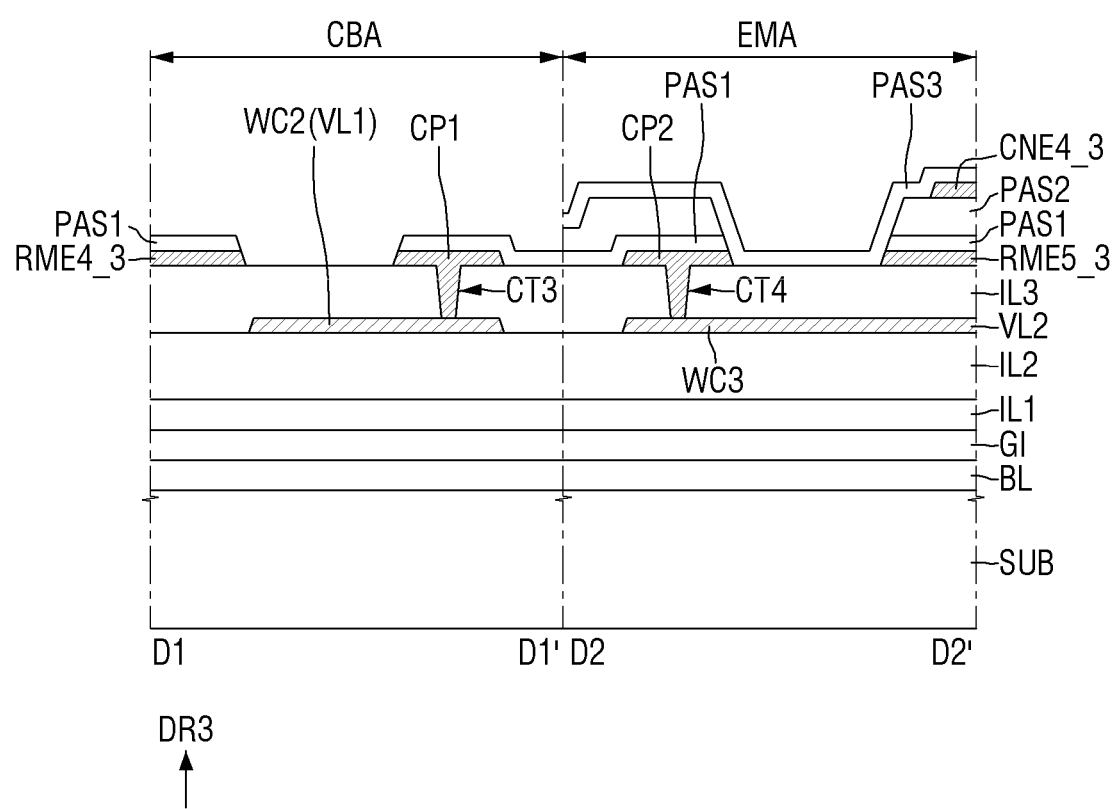
FIG. 29 is a cross-sectional view taken along the lines D1-D1' and D2-D2' of FIG. 26.

FIG. 25 is a plan view of a pixel of a display device according to another embodiment of the present disclosure. FIG. 26 is a plan view of a first subpixel of FIG. 25. FIG. 27 is a plan view illustrating a schematic arrangement of a second conductive layer in the first subpixel of FIG. 25. FIG. 28 is a plan view illustrating a schematic arrangement of electrodes and the second conductive layer in the first subpixel of FIG. 25. FIG. 29 is a cross-sectional view taken along the lines D1-D1' and D2-D2' of FIG. 26. FIG. 27 illustrates a plan view illustrating only the second conductive layer, and FIG. 28 illustrates a plan view illustrating the second conductive layer, a plurality of electrodes, electrode patterns, first banks BNL1, and a second bank BNL2 together. FIG. 29 is a cross-sectional view taken along first and second electrode patterns CP1 and CP2.

Referring to FIGS. 25 through 29, a display device 10_3 may include a plurality of first-type electrodes RME #1 and a plurality of second-type electrodes RME #2 and may further include a plurality of first, second, third, fourth, fifth, and sixth electrode patterns CP1, CP2, CP3, CP4, CP5, and CP6. The first, second, third, fourth, fifth, and sixth electrode patterns CP1, CP2, CP3, CP4, CP5, and CP6 may be initially formed to be connected to the second-type electrodes RME #2 and may then be separated from second electrode lines RM_B after the alignment of light-emitting elements ED. The first, second, third, fourth, fifth, and sixth electrode patterns CP1, CP2, CP3, CP4, CP5, and CP6 may be connected to the second conductive layer and may transmit alignment signals to the second electrode lines RM_B during the fabrication of the display device 10_3.

The first-type electrodes RME #1 and the second-type electrodes RME #2 may be arranged in substantially the same fashions as, but may have different shapes from, their respective counterparts of FIG. 20. For example, each of first, fourth, sixth, and eighth electrodes RME1_3, RME4_3, RME6_3, and RME8_3 may include electrode extensions, on which light-emitting elements ED are disposed, and an electrode bent portion, which is connected to the electrode extensions and is disposed to overlap with the second bank BNL2. The first, fourth, sixth, and eighth electrodes RME1_3, RME4_3, RME6_3, and RME8_3 are substantially the same as their respective counterparts of FIGS. 17 through 22 in that they do not include first electrode bent portions RM_C1. Second, third, fifth, and seventh electrodes RME2_3, RME3_3, RME5_3, and RME7_3, like their respective counterparts of FIGS. 17 through 22, may extend in one direction. The first banks BNL1, the second bank BNL2, first-type contact electrodes CNE #1, and second-type contact electrodes CNE #2 may have substantially the same shapes as their respective counterparts of FIGS. 17 through 22. Thus, descriptions of the arrangement of, and the connections between, the first-type electrodes RME #1, the second-type electrodes RME #2, the first-type contact electrodes CNE #1, and the second-type contact electrodes CNE #2 will be omitted, and the shapes of the first-type electrodes RME #1, the second-type electrodes RME #2, the first-type contact electrodes CNE #1, and the second-type contact electrodes CNE #2 will hereinafter be described.

Each subpixel PXn, for example, a first subpixel PXn, may include a first cut area CBA1, which is disposed below an emission area EMA, and a second cut area CBA2, which is disposed above the emission area EMA. As will be described later, the cutting of electrode lines (RM_A and RM_B) may be performed only in cut areas (CBA1 and CBA2) and not in the emission area EMA, and the electrode lines (RM_A and RM_B) may be separated in the cut areas (CBA1 and CBA2) that are disposed above or below the emission area EMA.

The first electrode RME1_3 may include a first electrode extension, on which light-emitting elements ED are disposed, an electrode bent portion, which is connected to the first electrode extension and is bent, and a second electrode extension, which is connected to the electrode bent portion and overlaps with the second bank BNL2. The first electrode extension of the first electrode RME1_3 may be disposed on a first sub-bank BNL_A in the emission area EMA. Although not specifically illustrated in FIG. 28, the second electrode extension of the first electrode RME1_3 may extend beyond the boundary between the first subpixel PX1 and an upper neighboring subpixel PXn of the first subpixel PX1, which is adjacent to the first subpixel PX1 in a second direction DR2, and may be terminated in a first cut area CBA1 of the neighboring subpixel PXn. FIG. 28 illustrates that the second electrode extension of a first electrode RME1_3 of a lower neighboring subpixel PXn of the first subpixel PX1 is disposed in the first cut area CBA1 of the first subpixel PX1. A first electrode contact CTP1 may be formed in the second electrode extension of the first electrode RME1_3, and the first electrode RME1_3 may be in contact with a first conductive pattern CDP through a first contact hole CT1 in the first electrode contact CTP1.

The second electrode RME2_3 may extend in the second direction DR2 and may be disposed on a second sub-bank BNL_B. The second electrode RME2_3 may be disposed across the emission area EMA and the boundary between the first subpixel PX1 and the upper neighboring subpixel PXn and may be terminated in the first cut area CBA1 of the upper neighboring subpixel PXn. FIG. 28 illustrates that a second electrode RME2_3 of the lower neighboring subpixel PXn is disposed in the first cut area CBA1 of the first subpixel PX1. A second electrode contact CTP2 may be formed in the second electrode RME2_3, and the second electrode RME2_3 may be in contact with a first wire contact WC1 of a second voltage line VL2 through a second contact hole CT2 in the second electrode contact CTP2.

The third, fifth, and seventh electrodes RME3_3, RME5_3, and RME7_3 may extend in the second direction DR2. The third electrode RME3_3 may be disposed in the emission area EMA and may be arranged across the second cut area CBA2 to overlap, in part, with the second bank BNL2. The fifth and seventh electrodes RME5_3 and RME7_3 may be disposed in the emission area EMA as linear patterns. The third, fifth, and seventh electrodes RME5_3, RME5_3, and RME7_3 may be disposed on sides of second sub-banks BNL_B, the third electrode RME3_3 may be spaced from the second electrode RME2_3, and the fifth electrode RME5_3 may be spaced from the seventh electrode RME7_3.

The fourth, sixth, and eighth electrodes RME4_3, RME6_3, and RME8_3 may have substantially the same shape as the first electrode RME1_3. The fourth, sixth, and eighth electrodes RME4_3, RME6_3, and RME8_3, unlike the first electrode RME1_3, may have a relatively short second electrode extension and may be disposed across the second cut area CBA2 (and/or the first cut area CBA1), but not in any neighboring subpixel PXn of the first subpixel PX1. The fourth and sixth electrodes RME4_3 and RME6) may be disposed in and across the emission area EMA and the first cut area CBA1, and the eighth electrode RME8_3 may be disposed in the emission area EMA and may overlap, in part, with the second bank BNL2.

As described above, some of the electrodes (RME1_3, RME2_3, RME3_3, RME4_3, RME5_3, RME6_3, RME7_3, and RME8_3) may be spaced from one another in the second direction DR2 in the emission area EMA. The first, third, second, and eighth electrodes RME1_3, RME3_3, RME2_3, and RME8_3 may be spaced from the fourth, fifth, seventh, and sixth electrodes RME4_3, RME5_3, RME7_3, and RME6_3, respectively, in the second direction DR2. However, because the electrode lines (RM_A and RM_B) are formed to be separate during the fabrication of the display device 10_3, a process of separating the electrode lines (RM_A and RM_B) in the emission area EMA after the alignment of the light-emitting elements ED may be omitted. Accordingly, space for electrode cut portions where the electrode lines (RM_A and RM_B) are to be separated does not need to be secured in the emission area EMA, and the gaps, in the second direction DR2, between the electrodes (RME1_3, RME2_3, RME3_3, RME4_3, RME5_3, RME6_3, RME7_3, and RME8_3) can be reduced or minimized. As such, space for the light-emitting elements ED can be further secured in the emission area EMA. Also, to prevent the light-emitting elements ED in a first electrode cut portion ROP1, electrode bent portions where first electrode lines RM_A are bent can be omitted from the emission area EMA.

As will be described later, the electrode lines (RM_A and RM_B) may be formed to be separate during the fabrication of the display device 10_3. The electrode lines (RM_A and RM_B) may receive alignment signals from a first voltage line VL1 and the second voltage line VL2 of the second conductive layer, parts of the electrode lines (RM_A and RM_B) that are connected to the second conductive layer may be separated after the alignment of the light-emitting elements ED so that the first, second, third, fourth, fifth, and sixth electrode patterns CP1, CP2, CP3, CP4, CP5, and CP6 may remain in the first subpixel PX1.

The display device 10_3 may include the first, second, third, fourth, fifth, and sixth electrode patterns CP1, CP2, CP3, CP4, CP5, and CP6 that are spaced from the second-type electrodes RME #2 and are connected to the second conductive layer.

The first electrode pattern CP1 may be disposed in the first cut area CBA1. The first electrode pattern CP1 may be in contact with a second wire contact WC2, which protrudes from a first side of the first voltage line VL1, through a third contact hole CT3, which penetrates a third interlayer insulating layer IL3. The first electrode pattern CP1 may be separated from the first electrode lines RM_A and may be formed together with the first and fourth electrodes RME1_3 and RME4_3.

The second electrode pattern CP2 may be disposed below the emission area EMA. The second electrode pattern CP2 may be in contact with a third wire contact WC3, which protrudes from a second side of the second voltage line VL2, through a fourth contact hole CT4, which penetrates the third interlayer insulating layer IL3. The second electrode pattern CP2 may be separated from the second electrode lines RM_B and may be formed together with the fifth electrode RME5_3.

The third electrode pattern CP3 may be disposed in the second cut area CBA2. The third electrode pattern CP3 may be in contact with a fourth wire contact WC4, which protrudes from the second side of the second voltage line VL2, through a fifth contact hole CT5, which penetrates the third interlayer insulating layer IL3. The third electrode pattern CP3 may be separated from the second electrode lines RM_B and may be formed together with the third electrode RME3_3.

The fourth electrode pattern CP4 may be disposed below the emission area EMA. The fourth electrode pattern CP4 may be in contact with a fifth wire contact WC5, which protrudes from a first side of the second voltage line VL2, through a sixth contact hole CT6, which penetrates the third interlayer insulating layer IL3. The fourth electrode pattern CP4 may be separated from the second electrode lines RM_B and may be formed together with the seventh electrode RME7_3.

The fifth electrode pattern CP5 may be disposed in the first cut area CBA1. The fifth electrode pattern CP5 may be in contact with a sixth wire contact WC6, which protrudes from a second side of the first voltage line VL1, through a seventh contact hole CT7, which penetrates the third interlayer insulating layer IL3. The fifth electrode pattern CP5 may be separated from the first electrode lines RM_A and may be formed together with the sixth electrode RME6_3.

The sixth electrode pattern CP6 may be disposed in the second cut area CBA2. The sixth electrode pattern CP6 may be in contact with a seventh wire contact WC7, which protrudes from the second side of the first voltage line VL1, through an eighth contact hole CT8, which penetrates the third interlayer insulating layer IL3. The sixth electrode pattern CP6 may be separated from the first electrode lines RM_A and may be formed together with the eighth electrode RME8_3.

During the fabrication of the display device 10_3, the electrode lines (RM_A and RM_B) may be arranged as being separate in the emission area EMA. Thus, it is impossible to apply alignment signals all together to the electrode lines (RM_A and RM_B) via pads disposed in a non-display area. However, because the electrode lines (RM_A and RM_B) are connected to the first or second voltage line VL1 or VL2 via the first, second, third, fourth, fifth, and sixth electrode patterns CP1, CP2, CP3, CP4, CP5, and CP6, the alignment signals can be applied via the first and second voltage lines VL1 and VL2. Once the light-emitting elements ED are aligned, a process of separating the electrode lines (RM_A and RM_B) and the first, second, third, fourth, fifth, and sixth electrode patterns CP1, CP2, CP3, CP4, CP5, and CP6 may be performed so that the first subpixel PX1 can be driven separately.

The first subpixel PX1 may include electrode separators (RP1 and RP2), in which the light-emitting elements ED are not disposed, and to which no electrical signals are applied. The electrode separators (RP1 and RP2) may include first electrode separators RP1 that are obtained by separating the first electrode lines RM_A and the fifth and sixth electrode patterns CP5 and CP6, and second electrode separators RP2 that are obtained by separating the second electrode lines RM_B and the second and third electrode patterns CP2 and CP3.

The first electrode separators RP1 and the second electrode separators RP2 may be disposed across the boundary between the first subpixel PX1 and the lower neighboring subpixel PXn and across the cut areas (CBA1 and CBA2). The first electrode separators RP1 may be disposed, in part, in the first and second cut areas CBA1 and CBA2, between the sixth and eighth electrodes RME6_3 and RME8_3, and the second electrode separators RP2 may be disposed between the third and fifth electrodes RME3_3 and RME5_3 and may be disposed across the first cut area CBA1 and, in part, in the second cut area CBA2. The display device 10_3 may include the first-type electrodes RME #1 and the second-type electrodes RME #2 to connect the light-emitting elements ED in series. Some of the first-type electrodes RME #1 and some of the second-type electrodes RME #2 may be connected to the second conductive layer through contact holes (CT1 and CT2), and some of the first-type electrodes RME #1 and some of the second-type electrodes RME #2 may not be connected to the second conductive layer. To this end, some of the electrode lines (RM_A and RM_B) may be separated as being substantially floated. The electrodes disposed in the emission area EMA may be the first-type electrodes RME #1 or may receive electrical signals via the first-type contact electrodes CNE #1, and the electrode separators (RP1 and RP2) not disposed in the emission area EMA may remain floated with no electrical signals applied thereto. The electrode separators (RP1 and RP2) may be formed by separating the electrode lines (RM_A and RM_B) and the first, second, third, fourth, fifth, and sixth electrode patterns CP1, CP2, CP3, CP4, CP5, and CP6 during the fabrication of the display device 10_3.

Figure 30:
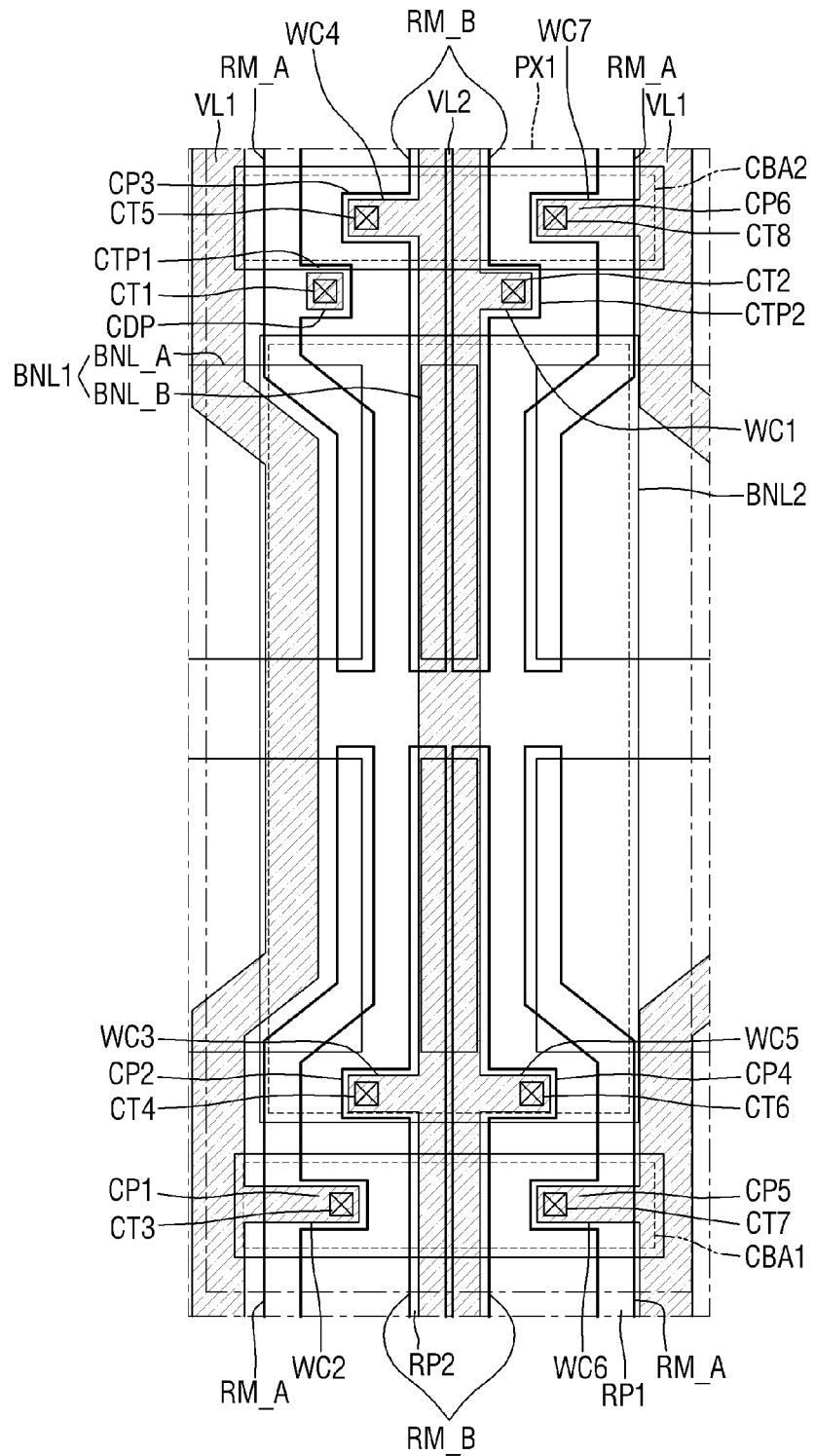
FIGS. 30 through 32 are plan views illustrating processes of the fabrication of the display device of FIG. 25.
Figure 31:
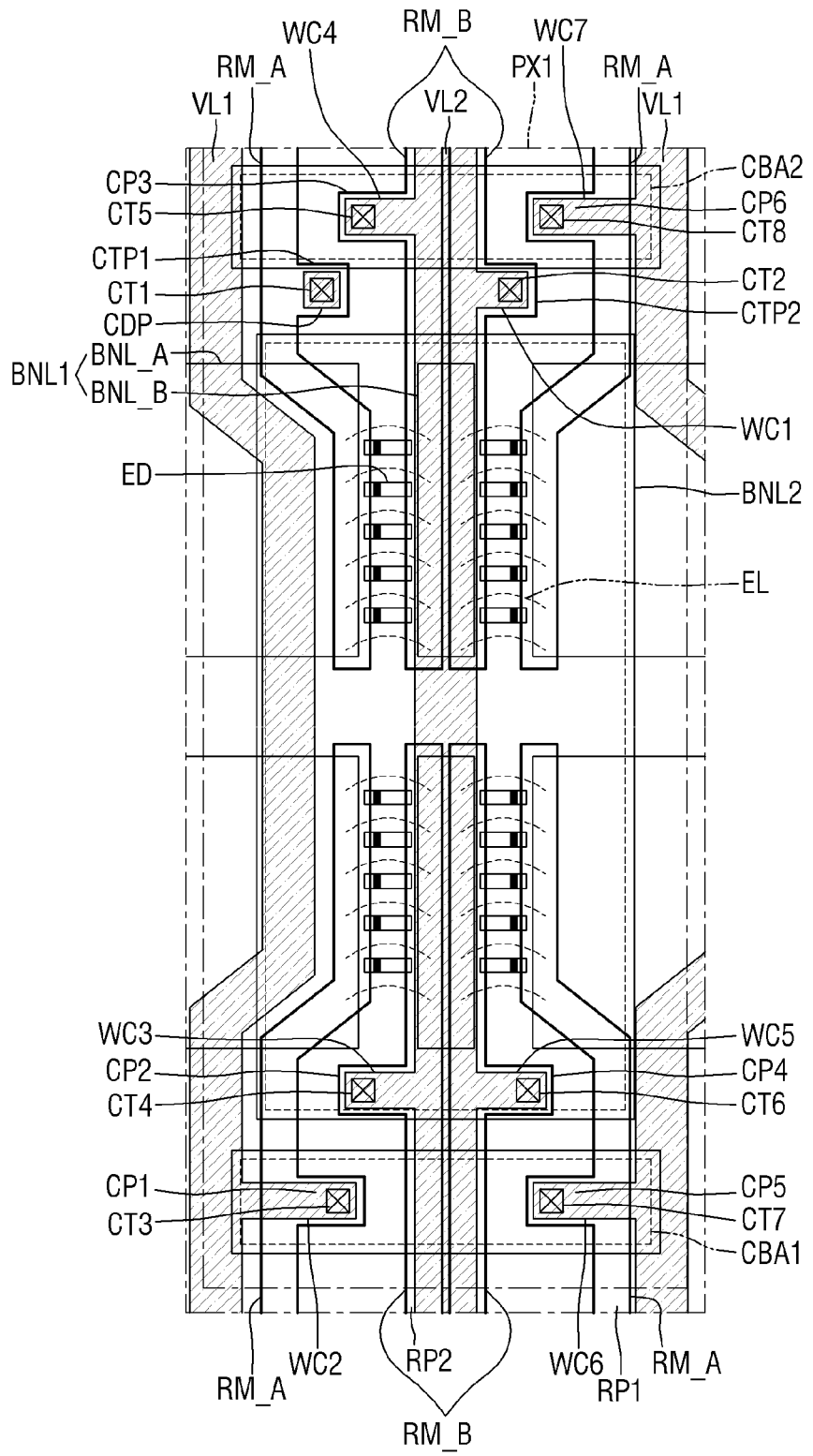
Figure 32:
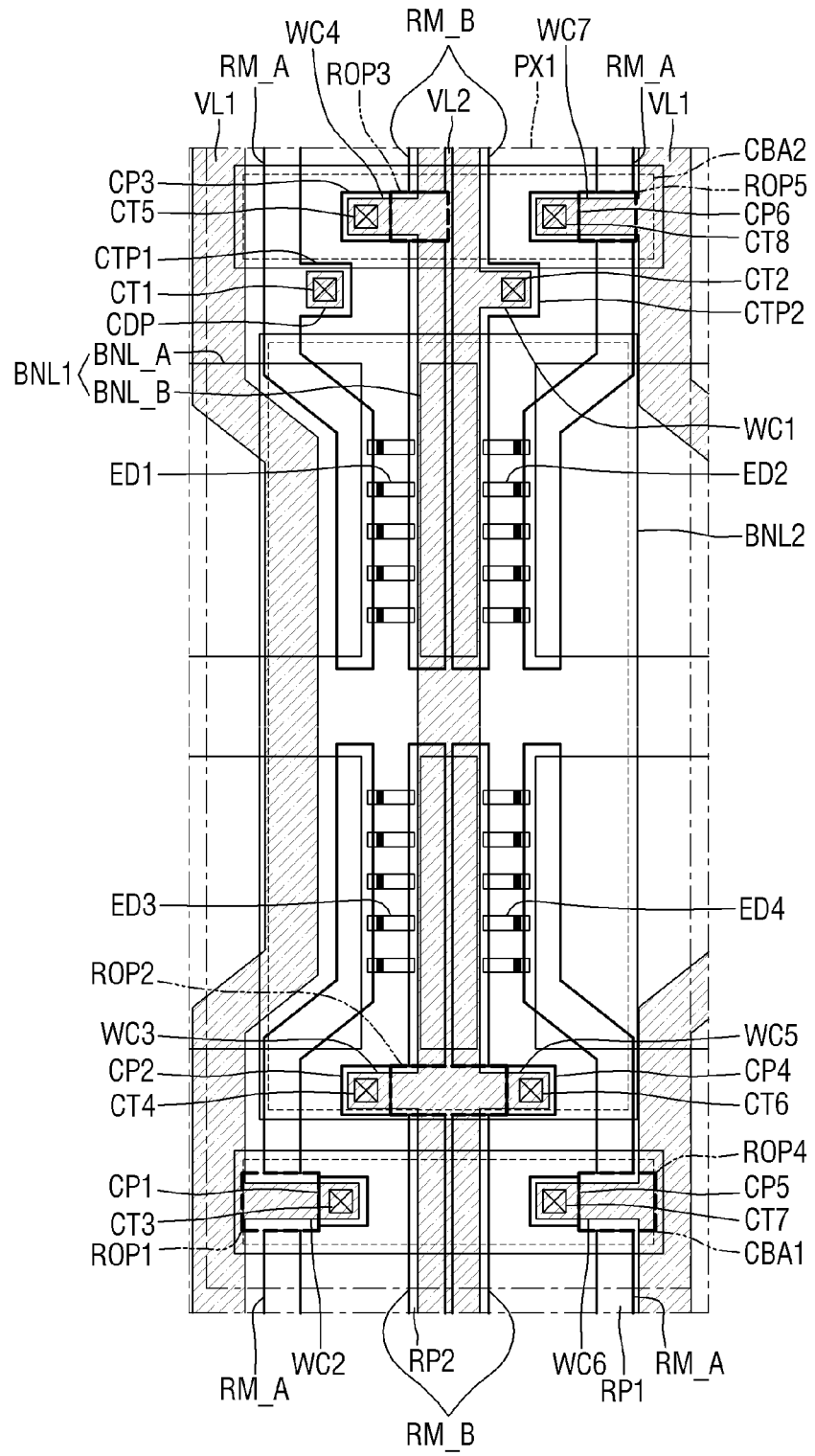

FIGS. 30 through 32 are plan views illustrating processes of the fabrication of the display device of FIG. 25.

Referring to FIGS. 30 through 32, a plurality of electrode lines (RM_A and RM_B) may be formed to be separate in the emission area EMA. The first electrode lines RM_A may include electrode extensions and electrode bent portions and may be spaced apart from one another in the first and second directions DR1 and DR2. The second electrode lines RM_B may be disposed between the first electrode lines RM_A and may be disposed on the sides of the second sub-banks BNL_B.

The electrode lines (RM_A and RM_B) may be electrically connected to the second conductive layer via electrode contacts (CTP1 and CTP2) or the first, second, third, fourth, fifth, and sixth electrode patterns CP1, CP2, CP3, CP4, CP5, and CP6. First electrode lines RM_A disposed on the left side of the center of the emission area EMA may be electrically connected to the first voltage line VL1 via the first electrode pattern CP1, and first electrode lines RM_A disposed on the right side of the center of the emission area EMA may be electrically connected to the first voltage line VL1 via the fifth and sixth electrode patterns CP5 and CP6. The second electrode lines RM_B may be electrically connected to the second voltage line VL2 via the second electrode contact CTP2 and second, third, and fourth electrode patterns CP2, CP3, and CP4.

If ink including the light-emitting elements ED is sprayed into the emission area EMA and alignment signals are applied to the first and second voltage lines VL1 and VL2, an electric field EL may be generated on the electrode lines (RM_A and RM_B). Then, the light-emitting elements ED may be disposed on different electrode lines (RM_A and RM_B) by the electric field EL.

Thereafter, the electrode lines (RM_A and RM_B) and the first, second, third, fourth, fifth, and sixth electrode patterns CP1, CP2, CP3, CP4, CP5, and CP6 may be separated so that the first subpixel PX1 may be driven separately. The first electrode lines RM_A disposed on the left side of the center (or a central region) of the emission area EMA may be separated from the first electrode pattern CP1 via the first electrode cut portion ROP1, and second electrode lines RM_B disposed below the center (or a central region) of the emission area EMA may be separated from the second and fourth electrode patterns CP2 and CP4 via a second electrode cut portion ROP2 (see, FIG. 32). A second electrode line RM_B disposed on the upper left side of the center (or a central region) of the emission area EMA may be separated from the third electrode pattern CP3 via a third electrode cut portion ROP3, and the first electrode lines RM_A disposed on the right side of the center (or a central region) of the emission area EMA may be separated from the sixth electrode pattern CP6 via a fifth electrode cut portion ROP5 (see, FIG. 32). In this manner, the electrode lines (RM_A and RM_B) may be separated, thereby forming the first-type electrodes RME #1 and the second-type electrodes RME #2.

Thereafter, although not specifically illustrated, contact electrodes that are in contact with the light-emitting elements ED are formed, thereby obtaining the display device 10_3. The display device 10_3 differs from its counterparts of the previous embodiments in that the electrode lines (RM_A and RM_B) are formed to be separate in the emission area EMA. Because space for separating the electrode lines (RM_A and RM_B) is not needed in the emission area EMA, space for the light-emitting elements ED can be further secured in the emission area EMA, and the luminance of each subpixel PXn can be further improved.

In concluding the detailed description, those skilled in the art will appreciate that many variations and modifications can be made to the embodiments without substantially departing from the principles of the present disclosure. Therefore, the disclosed preferred embodiments of the disclosure are used in a generic and descriptive sense only and not for purposes of limitation.

What is claimed is:

1. A display device comprising:
   a conductive layer comprising a first voltage line and a second voltage line extending in a first direction;
   an interlayer insulating layer on the conductive layer and including a plurality of contact holes that expose parts of the conductive layer;
   a plurality of first-type electrodes on the interlayer insulating layer and electrically connected to the conductive layer through the plurality of contact holes, the plurality of first-type electrodes extending in the first direction;
   a plurality of second-type electrodes on the interlayer insulating layer and extending in the first direction, the plurality of second-type electrodes being spaced from the plurality of first-type electrodes in the first direction or in a second direction;
   a plurality of light-emitting elements on pairs of the first-type and the second-type electrodes that are spaced from each other in the second direction;
   first-type contact electrodes on the first-type electrodes and in contact with the light-emitting elements; and
   second-type contact electrodes on the second-type electrodes and in contact with the light-emitting elements,
   wherein each of the second-type contact electrodes comprises a plurality of contact electrode extensions that are on the second-type electrodes, and a contact electrode connector connecting the contact electrode extensions,
   wherein the contact electrode connector is between a pair of the first-type and the second-type electrodes that are spaced from each other in the first direction,
   wherein the plurality of contact electrode extensions of each of the second-type contact electrodes on the second-type electrodes has a shape of extending in the first direction in parallel to and offset each other from the first direction in parallel,
   wherein the plurality of contact electrode extensions of each of the second-type contact electrodes on the second-type electrodes are spaced from the first-type contact electrodes in the first direction and are colinear with the first-type contact electrodes, wherein the contact electrode connector extends in the second direction crossing the first direction, wherein the first-type electrodes comprise a first electrode electrically connected to the first voltage line, and a second electrode electrically connected to the second voltage line, wherein a second-type electrode from among the plurality of second-type electrodes comprises a third electrode spaced from the first electrode, and a fourth electrode, wherein the second electrode is spaced from the third electrode in the second direction, wherein the display device further comprises a fifth electrode spaced from the fourth electrode in the second direction and from the third electrode in the first direction, a sixth electrode spaced from the fifth electrode in the second direction, a seventh electrode located between the fifth and sixth electrodes and spaced from the second electrode in the first direction, and an eighth electrode spaced from the sixth electrode in the first direction and from the second electrode in the second direction, and wherein the light-emitting elements further comprise first light-emitting elements on the first and third electrodes, second light-emitting elements on the second and eighth electrodes, third light-emitting elements on the fourth and fifth electrodes, and fourth light-emitting elements on the sixth and seventh electrodes.

2. The display device of claim 1, wherein
the first-type electrodes and the second-type electrodes comprise electrode extensions extending in the first direction, and electrode bent portions bent from sides of the electrode extensions in the first direction,
the first-type contact electrodes are on the electrode extensions of the first-type electrodes, and
the contact electrode extensions of each of the second-type contact electrodes are on the electrode extensions of the second-type electrodes.

3. The display device of claim 2, wherein a distance between the electrode extensions of the first-type electrodes and the electrode extensions of the second-type electrodes is smaller than a maximum distance between the electrode bent portions of the first-type electrodes and the electrode bent portions of the second-type electrodes.

4. The display device of claim 1, wherein the second-type electrodes are not in contact with the conductive layer.

5. The display device of claim 1, wherein
the first light-emitting elements electrically connected to the first electrode, and the second light-emitting elements electrically connected to the second electrode, and
the first-type contact electrodes comprise a first contact electrode in contact with the first electrode and with the first light-emitting elements, and a second contact electrode in contact with the second electrode and with the second light-emitting elements.

6. The display device of claim 5, wherein
the third electrode is spaced from the first electrode in the second direction, and the fourth electrode is spaced from the first electrode in the first direction and from the second electrode in the second direction,
the second light-emitting elements are on the second and fourth electrodes, and
the second-type contact electrodes comprise a third contact electrode comprising contact electrode extensions on the third and fourth electrodes and a contact electrode connector between the first and fourth electrodes.

7. The display device of claim 5, wherein
the first and second electrodes are spaced from each other in the second direction, and
the third electrode is between the first and second electrodes, the fourth electrode is spaced from the first electrode in the first direction.

8. The display device of claim 7, wherein the second-type contact electrodes further comprise:
a third contact electrode comprising contact electrode extensions on the third and fourth electrodes and a contact electrode connector between the first and fourth electrodes,
a fourth contact electrode comprising contact electrode extensions on the fifth and sixth electrodes and a contact electrode connector on a first side of the seventh electrode in the first direction, and
a fifth contact electrode comprising contact electrode extensions on the seventh and eighth electrodes and a contact electrode connector on a second side of the seventh electrode in the first direction.

9. The display device of claim 5, wherein:
the conductive layer further comprises a first conductive pattern,
the display device further comprises a first transistor located below the conductive layer and comprising a first end connected to the first voltage line and a second end connected to the first conductive pattern,
the first electrode is in contact with the first conductive pattern through a first contact hole, and
the second electrode is in contact with the second voltage line through a second contact hole.

10. The display device of claim 9, wherein
the first and second voltage lines comprise wire contacts protruding from the first and second voltage lines,
the display device further comprises a first electrode pattern in contact with the wire contact of the first voltage line through a third contact hole that penetrates the interlayer insulating layer, and a second electrode pattern in contact with the wire contact of the second voltage line through a fourth contact hole that penetrates the interlayer insulating layer.

11. The display device of claim 10, further comprising:
electrode separators spaced from the second-type electrodes in the first direction and including none of the light-emitting elements disposed therein.

12. A display device comprising:
first and second electrodes extending in a first direction;
a third electrode spaced from the first electrode in a second direction;
a fourth electrode spaced from the second electrode in the second direction and from the first electrode in the first direction;
a plurality of light-emitting elements on pairs of electrodes from among the first, second, third, and fourth electrodes that are spaced from each other in the second direction;
a first contact electrode on the first electrode to be in contact with the light-emitting elements;
a second contact electrode on the second electrode to be in contact with the light-emitting elements; and
a third contact electrode on the third and fourth electrodes to be in contact with the light-emitting elements,
wherein the third contact electrode comprises a first contact electrode extension located on the third electrode, a second contact electrode extension located on the fourth electrode, and a first contact electrode connector connected to the first and second contact electrode extensions and located between the first and fourth electrodes, wherein the first contact electrode extension and the second contact electrode extension of the third contact electrode have a shape of extending in the first direction in parallel to and offset each other from the first direction in parallel, wherein the first contact electrode extension located on the third electrode is spaced from the second contact electrode on the second electrode in the first direction and is colinear with the second contact electrode on the second electrode, wherein the first contact electrode connector extends in the second direction crossing the first direction, wherein the second electrode is spaced from the third electrode in the second direction, wherein the display device further comprises a fifth electrode spaced from the fourth electrode in the second direction and from the third electrode in the first direction, a sixth electrode spaced from the fifth electrode in the second direction, a seventh electrode located between the fifth and sixth electrodes and spaced from the second electrode in the first direction, and an eighth electrode spaced from the sixth electrode in the first direction and from the second electrode in the second direction, and wherein the light-emitting elements further comprise first light-emitting elements on the first and third electrodes, second light-emitting elements on the second and eighth electrodes, third light-emitting elements on the fourth and fifth electrodes, and fourth light-emitting elements on the sixth and seventh electrodes.

13. The display device of claim 12, wherein:
the third electrode is spaced from the second electrode in the first direction, and
the first contact electrode connector is located between the second and third electrodes.

14. The display device of claim 13, wherein the light-emitting elements comprise first light-emitting elements comprising first end portions located on the first electrode and second end portions located on the third electrode, and the second light-emitting elements comprising first end portions on the fourth electrode and second end portions on the second electrode.

15. The display device of claim 14, wherein
the first contact electrode is in contact with the first end portions of the first light-emitting elements,
the second contact electrode is in contact with the second end portions of the second light-emitting elements,
the first contact electrode extension is in contact with the second end portions of the first light-emitting elements, and
the second contact electrode extension is in contact with the first end portions of the second light-emitting elements.

16. The display device of claim 12, wherein:
the first, second, third, and fourth electrodes comprise electrode extensions extending in the first direction, and electrode bent portions bent from the electrode extensions in the first direction, and
the light-emitting elements are on the electrode extensions of the electrodes.

17. The display device of claim 16, wherein
the electrode bent portion of the first electrode is spaced from the electrode bent portion of the third electrode in the second direction and from the electrode bent portion of the fourth electrode in the first direction, and
a distance between the electrode extension of the first electrode and the electrode extension of the third electrode is smaller than a maximum distance between the electrode bent portion of the first electrode and the electrode bent portion of the third electrode.

18. The display device of claim 12, further comprising:
a plurality of first banks spaced from one another in the first and second directions,
wherein the first, second, third, and fourth electrodes are disposed on different first banks from among the plurality of first banks.

19. The display device of claim 18, wherein the first banks are not located between the first and fourth electrodes.

20. The display device of claim 18, further comprising:
a second bank surrounding an area in which the light-emitting elements are located, the second bank extending in the first and second directions.

21. The display device of claim 12, further comprising:
a fourth contact electrode comprising a third contact electrode extension on the fifth electrode, a fourth contact electrode extension disposed on the sixth electrode, and a second contact electrode connector connected to the third and fourth contact electrode extensions; and
a fifth contact electrode comprising a fifth contact electrode extension disposed on the seventh electrode, a sixth contact electrode extension disposed on the eighth electrode, and a third contact electrode connector connected to the fifth and sixth contact electrode extensions,
wherein the second contact electrode connector is at a first side of the seventh electrode in the first direction, and
wherein the third contact electrode connector is at a second side of the seventh electrode in the first direction.

* * * * *